United States Patent [19]

Zdeblick

[11] Patent Number: 4,821,997
[45] Date of Patent: Apr. 18, 1989

[54] INTEGRATED, MICROMINIATURE ELECTRIC-TO-FLUIDIC VALVE AND PRESSURE/FLOW REGULATOR

[75] Inventor: Mark Zdeblick, Los Altos Hills, Calif.

[73] Assignee: The Board of Trustees of the Leland Stanford Junior University, Stanford, Calif.

[21] Appl. No.: 97,494

[22] Filed: Sep. 16, 1987

Related U.S. Application Data

[63] Continuation-in-part of Ser. No. 911,242, Sep. 24, 1986.

[51] Int. Cl.[4] ............................................. F16K 7/12
[52] U.S. Cl. ....................................... 251/11; 137/486; 338/23
[58] Field of Search .............. 137/9, 10, 486; 251/11; 73/204; 357/26, 28; 338/22, 22 SD, 23, 24

[56] References Cited

U.S. PATENT DOCUMENTS

| | | | |
|---|---|---|---|
| 4,203,128 | 5/1980 | Guebel et al. ................ | 357/26 X |
| 4,347,976 | 9/1982 | Jakobsen ........................ | 251/11 X |
| 4,478,077 | 10/1984 | Bobrem ........................... | 73/204 |
| 4,542,650 | 9/1985 | Reuben et al. ................ | 73/204 |
| 4,581,624 | 4/1986 | O'Connor ....................... | 357/26 |
| 4,679,585 | 7/1987 | Ewing ............................. | 137/486 |

OTHER PUBLICATIONS

IC Sensors Advancing Solid-State Technology Brochure (1987).
IC Sensors Microstructures Brochure (1987).

*Primary Examiner*—A. Michael Chambers
*Assistant Examiner*—John C. Fox
*Attorney, Agent, or Firm*—Ron Fish

[57] ABSTRACT

There is disclosed herein an apparatus for converting control signals of an electrical or optical nature or any other type of signal which may be converted to a change of temperature of a fixed volume of material trapped in a chamber to flexure of a membrane forming one wall of the chamber. Typically, the device is integrated onto a silicon wafer by anisotropically etching a trench into said wafer for enough that a thin wall of silicon remains as the bottom wall of the trench. In some embodiments, polyimide is used as the material for the membrane. The trench is then hermetically sealed in any one of a number of different ways and the material to be trapped is either encapsulated during the sealing process or later placed in the cavity by use of a fill hole. Typically, a resistor pattern is etched on the face of pyrex wafer used as a top for the trench to form the cavity. When current is passed through this resistor, the material in the cavity is heated, its vapor pressure increases and expansion occurs. There is also disclosed herein a pressure regulator and a flow regulator each of which are integrated on a single die using the valve structure disclosed herein.

2 Claims, 34 Drawing Sheets

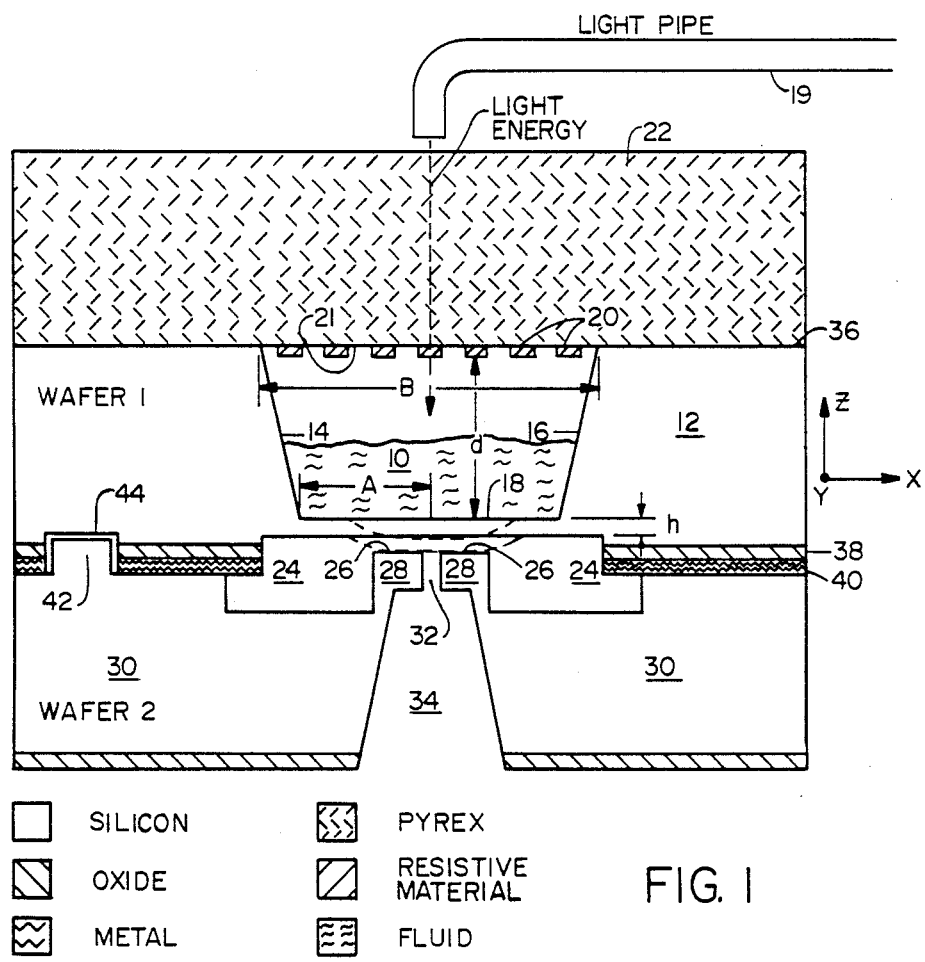
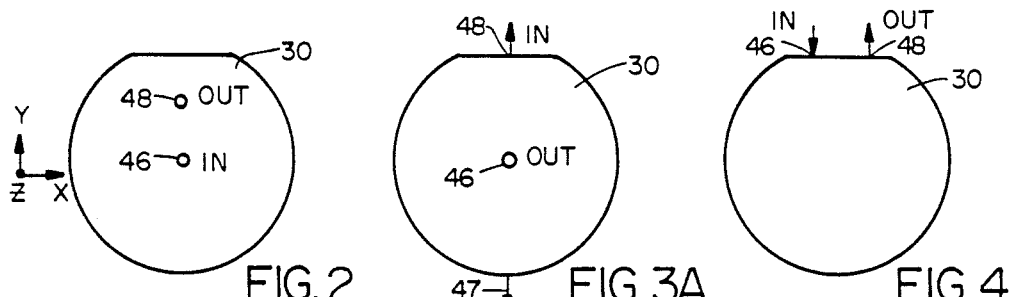
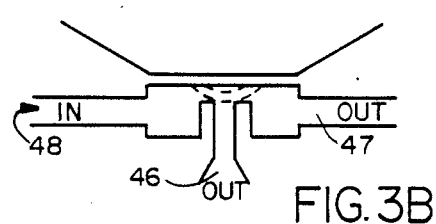

SILICON WAFER PROCESS STEPS

PYREX WAFER PROCESS STEPS
WAFER #1

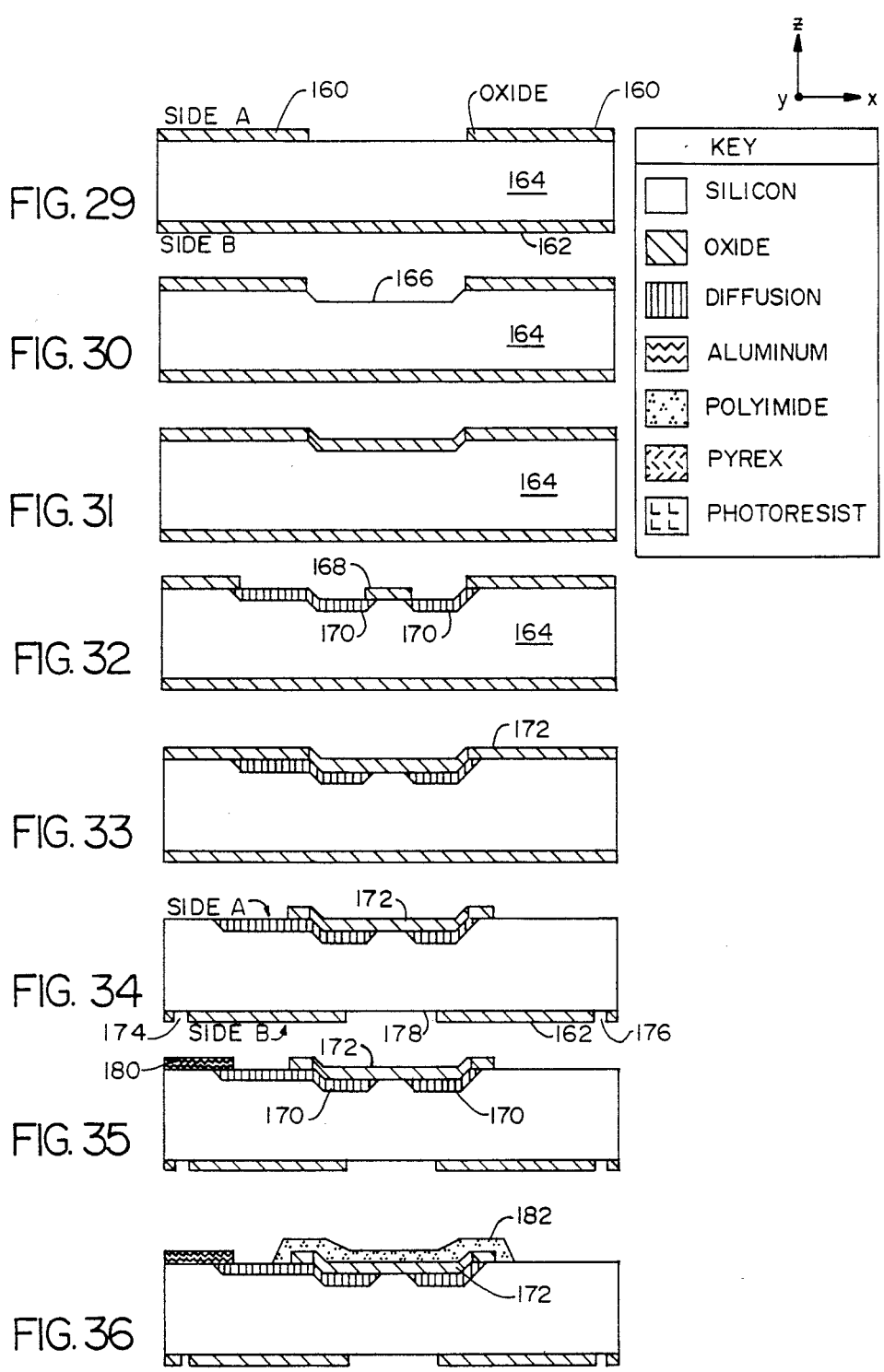

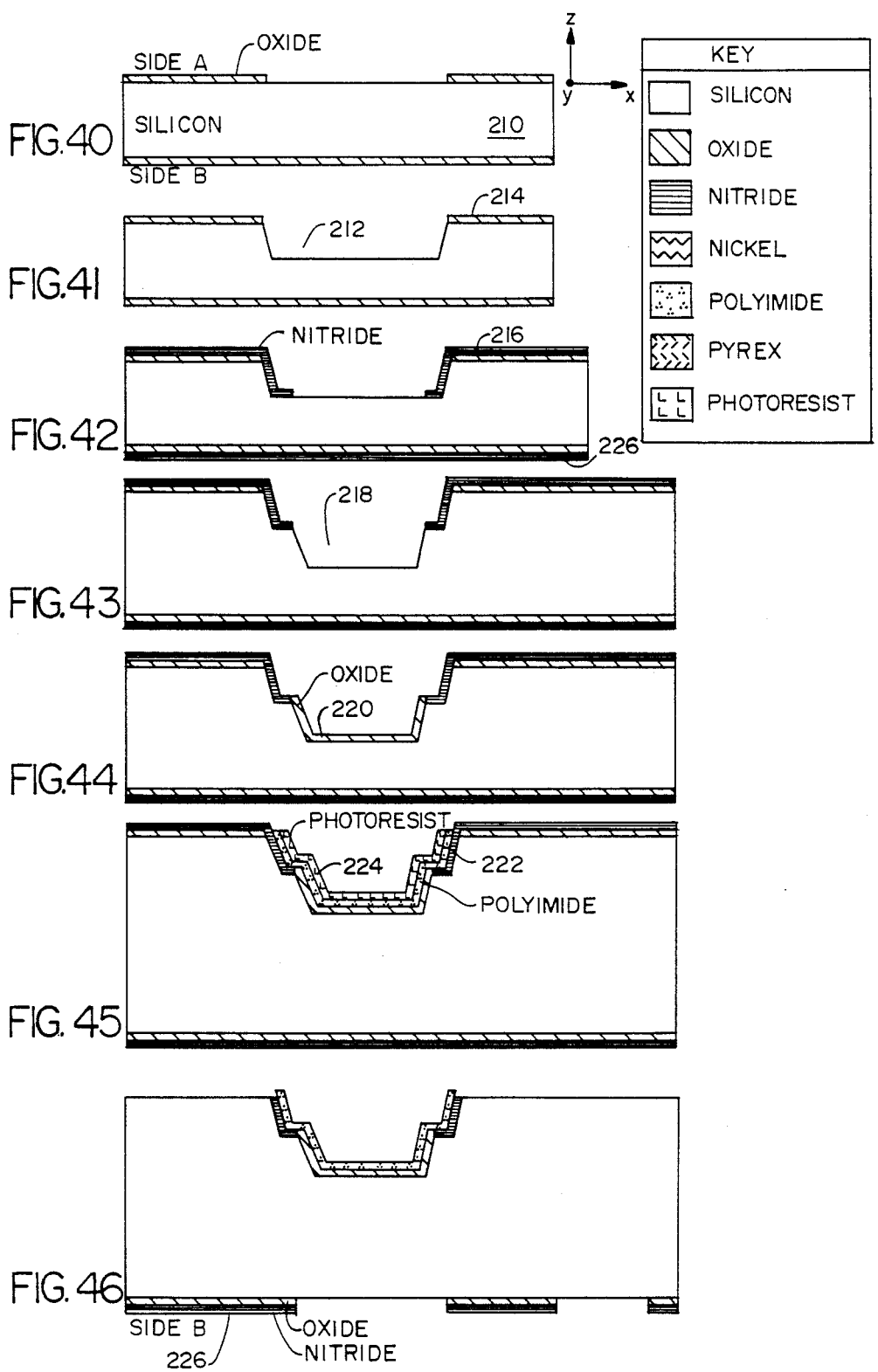

PLAN VIEW  FIG. 49

KEY

| □ SILICON | ≡ NITRIDE | ▒ POLYIMIDE | ⊞ PHOTORESIST |
| ▨ OXIDE | ⌇ ALUMINUM | ▨ PYREX | ▦ PLUG MATERIAL |

KEY
- ETCHED CHANNEL
- CHROME COVERED MESA
- PYREX SURFACE NOT COVERED WITH CHROME

INTEGRATED, MICROMINIATURE ELECTRIC-TO-FLUIDIC VALVE AND PRESSURE/FLOW REGULATOR

BACKGROUND OF THE INVENTION

This application is a continuation-in-part of U.S. patent application Ser. No. 911,242, filed Sept. 24, 1986.

The invention pertains to the field of electronic control of fluid flow, and, more particularly, to the field of integrated, microminiature electric-to-fluidic valves where the flow of a gas or fluid may be controlled by an electronic signal from some control logic.

Many industrial machines and industrial or manufacturing facilities are pneumatically powered. Pneumatic power provides very efficient actuation of machines, and is frequently used in robot machines for assembly line work. These types of machines are frequently controlled by computers or other logic circuitry. The logic circuitry decides the sequence of events that needs to occur, and generates electrical signals to cause same to occur as planned. When the sequence of events involves physical movement of portions of the machines which are driven pneumatically, there arises a need for a valve or conversion device which can convert the electrical control signals from the control logic into pneumatic control signals to drive the machine parts.

Since such machines often use many moving parts which are controlled by numerous individual pneumatic lines, it is frequently found that many such electric-to-fluidic valves are necessary. In such environments, the electric-to-fluidic valves need to be cheap, reliable, power efficient, small, and compatible with electronic interface circuitry between the valve and the computer or control logic.

In very precise robotic movement applications or other applications where very precise movement control is necessary, it is necessary to have precise control of the shape of the pneumatic control drive pulses. In other applications, such as gas chromatography, the shape of the fluid pulses entering the column must be precisely controlled to get precision assay data from the column. In either of these types of applications, the valves used to control the fluid flow must be precision valves which have little or no dead volume. Dead volume is the unknown volume which is trapped in a valve when it makes a transition from open to closed. This trapped fluid may escape into the stream thereby causing the shape of the fluid pulse to be altered from the desired shape. For example, in typical gas chromatograph systems, if a valve is used which has dead volume, the edges of the output fluid pulse entering the separation column (in terms of the volume of gas flowing at any particular instant in time) may not be vertical or sharply defined. Likewise, for precise robotic movement, it is desirable to have very sharp cut-offs for the pneumatic pulses used to drive robot fingers and arms to get precise positional control for the movement.

One known way of controlling the flow of a fluid using an electrical pulse is the electric-to-fluidic valve developed by Steve Terry of Stanford University. This valve uses a substrate such as silicon which has a thin membrane machined therein. This cavity is formed by the etching a hole almost completely through the substrate. This leaves a thin bottom wall for the cavity which is used as a flexible membrane. Attached to the side of the first substrate in which the membrane is formed is a second substrate which has a manifold type cavity etched therein with a passageway or nozzle formed in a wall of the manifold cavity for entering or escaping gas. The manifold cavity also has other ports formed therein to complete a fluid path into the manifold and out the nozzle or vice versa. The manifold cavity in the second substrate is positioned over the membrane of the first substrate such that when the manifold of the first substrate is flexed, it contacts a sealing ring formed around the nozzle of the manifold cavity thereby closing off the fluid flow path between the nozzle and the other ports into the manifold cavity. With the membrane of the first substrate in an unflexed position, the nozzle in the manifold cavity would not be pinched off, and fluid would be free to flow through the input port and the manifold cavity and out through the nozzle or vice versa. The membrane of the first substrate is forced to flex by mechanical forces exerted thereon by a piston. This piston is driven by a solenoid or other type of electromagnetic device.

One disadvantage of the above described valve configuration is that the solenoid requires a high power source, and is a large power consumer. Further, the solenoid or other electromagnetic device is large and heavy. The cavities in the first and second substrates could be formed with much smaller dimensions if it were not for the fact that the solenoid is large. Because the first and second substrates are silicon wafers which are etched using conventional planar photolithography techniques, it would be possible to make the electric-to-fluidic valve much smaller in dimension were it not for the solenoid. Such a prior art electric-to-fluidic valve construction is inefficient in its use of space. Because the solenoid is mechanically attached to the first substrate such that the piston of the solenoid pushes against the membrane in the first substrate and because the solenoid is large enough to consume much of the wafer space, generally only three such valve structures can be formed on a single silicon wafer. Such a structure is relatively expensive to build, and the bond between the solenoid and the glass is difficult to make. Generally, the solenoid is attached to a thick pyrex wafer by nuts and bolts. This form of attachment is both expensive to fabricate and a major source of failures. Further, such a structure has a moving part which can be another source of failure. The principal defect of such a structure, however, is the fact that the entire structure cannot easily be mass produced with planar lithography techniques. This is because the solenoid can not be manufactured by such techniques.

Another system which has been used in the past in the field of ink jet printing uses a principle used in the invention involving the tendency of fluids and gases to expand and to create higher pressures in a cavity when heated. The particular system which embodies this principle is a Hewlett Packard ink jet printer. This printer structure uses a print head which has a small cavity formed in or over a substrate. The substrate has formed thereon a resistive element, and the cavity is located over the resistive element. The cavity has a small ink jet nozzle therein through which ink may escape in small droplets when the pressure of ink in the cavity rises above the atmospheric pressure. In operation, such a structure will shoot out an ink drop each time a heating pulse is applied to the resistive element. The heat from the resistive element raises the temperature of the ink in the cavity thereby causing its vapor pressure to increase according to the laws of thermodynamics. When the pressure of the ink inside the cavity rises, one or more ink droplets are forced out of the cavity through the ink jet port in the cavity wall. Such a structure is an example of an unrelated application of a principle of thermodynamics which is used in the invention. As far as the applicant knows, no such application of the principle of expansion of a fluid in a confined cavity with increasing temperature has ever been used to control a fluid valve.

Thus a need has arisen for an electric-to-fluidic valve which may be mass produced cheaply using conventional planar lithography techniques, which does not use large amounts of energy, which is small and efficiently uses wafer space, which has no moving parts which slide across each other, which has sharp cutoff characteristics with little or no dead volume and which is compatible with the formation of interface or driver circuitry on the same silicon wafer in which the electric-to-fluidic valve is formed.

SUMMARY OF THE INVENTION

According to the teachings of the invention, there is provided an electric-to-fluidic valve utilizing the principle of expansion and pressure rise of a fixed volume of gas or fluid when heated to deflect a flexible wall or thin membrane forming one or more walls of the cavity in which the gas or fluid is contained. The deflection of the membrane may be used to seal or unseal a fluid passageway from an input port, through a manifold cavity and out an output nozzle or vice versa. The valve may also be operated linearly to provide a linear range of fluid control, i.e., the valve may be controlled to modulate the rate of fluid flow through the valve in accordance with the magnitude of a control signal. The deflection of the membrane may also be used as a sensor indication for purposes of determining temperature changes or the magnitude of other phenomena to be measured.

The structure of an electric-to-fluidic valve according to the teaching of the invention may have numerous variations. However, the principal elements of each design will include a cavity formed in a substrate where one wall of the cavity is a thin, flexible membrane. The cavity encloses a fixed number of moles of gas or fluid, and there will be some method or means of raising the temperature of the fluid in the cavity so as to cause the vapor pressure to rise in the case of a fluid or to cause expansion and increased pressure in the case of a gas. This heating of the material in the cavity may be accomplished in any one of a number of ways. One way is the use of a resistive heating element on one wall of (in the case of diffused resistors, in one or more walls) or located somewhere inside the volume of the cavity such that electrical current may be passed through the resistive element to generate heat and heat the fluid trapped in the cavity. Other possible methods of heating the fluid in the cavity include radio frequency heating of the material in the cavity by beaming radio frequency energy into the cavity from an energy source located outside the cavity, or through conductive, convective or radiated heating of the material in the cavity. Further, optical heaters could be used to provide an optical to fluidic conversion. In such a structure light can be beamed into the cavity having walls of transparent material. This light either heats up the vessel walls (one or more walls may be coated with a material which absorbs the light energy) or heats up the material in the cavity directly if the material in the cavity is a dark fluid or gas which can efficiently absorb the light. The light energy can be transmitted from the source either by radiation or with the aid of a light pipe or a fiber optic light guide. Such an optical to fluidic conversion provides reliable pneumatic control in an electrically noisy environment since electrical noise is not picked up by radiated light beams or by fiber optic light pipes.

In other embodiments, it is possible to change the temperature of the fluid in the chamber having the thin membrane as one wall (hereafter called the membrane chamber) by cooling the fluid trapped in the chamber. This may be done using Thompson or Peltier coolers. Other types of cooling mechanisms may also be employed such as simple refrigeration systems, or radiative, conductive or convective coolers. According to the teachings of the invention, any method of controlling the temperature of the fluid in the membrane chamber will suffice for purposes of practicing the invention.

Although the structure of devices built in accordance with the teachings of the invention will vary drastically from one application to another as can be surmised from the above discussion of the different types of heating structures which may be used, a typical structure utilizes a silicon-pyrex sandwich for the membrane cavity and heating structure. The membrane chamber is formed in a silicon wafer by etching a trench in the wafer substantially completely through the silicon wafer but stopping short of the opposite side of the wafer by a margin which is equal to the desired thickness of the membrane of the membrane chamber. Other signal processing circuitry, such as power transistors or full feedback control systems with multiplexed input and output ports, may have been previously fabricated on the balance of the wafer in conventional processing. This circuitry can be used in conjunction with the electric-to-fluidic valve formed by the membrane chamber thereby forming a valve or transducer with its own interface circuitry located on the same silicon wafer as the valve itself using compatible processing steps. The same of course is true for sensor applications where the membrane chamber is used as a transducer. The signal processing or other circuitry built elsewhere on the wafer may then be used to signal process, condition or otherwise deal with the output signal from the transducer for their operation.

The surface of the silicon substrate having the membrane as a part thereof is sandwiched with another wafer in which a manifold having an input port and a nozzle is formed (the nozzle may be the input port and the other port may be the output port also). The fluid manifold position is keyed so that when the second wafer is attached to the first wafer, the nozzle and a sealing ring around same are located within the path traveled by the membrane during deflection. Deflections of the membrane change the cross-sectional area of the fluid communication path between the input port and the output port of the fluid manifold. If the deflection is large enough, the membrane seats completely on the sealing ring around the nozzle and completely cuts off flow through the nozzle.

The invention may be practiced as a conversion type valve or as a transducer. The term transducer as it is used herein should be construed as meaning a device which produces an output signal which characterizes the magnitude of some parameter which is being measured with the transducer. The parameter being measured may be either the temperature of the fluid in the chamber or some other parameter which affects the temperature of the fluid in the chamber. Examples of the latter would be the magnitude of current flow through a resistive element in the chamber, the intensity of a light beam and so on. In other embodiments, the sensor structure according to the teachings of the invention could measure pressure by having the pressure to be measured applied to the membrane. The changes in pressure of the fluid in the chamber in response to deflections of the membrane under the influence of the force or pressure to be measured are translated into transient changes in temperature of fluid in the membrane chamber in accordance with the laws of thermodynamics. These changes in temperature can be sensed with a hermocouple or other temperature sensing device to generate the output signal which characterizes the pressure or force to be measured.

In accordance with the teachings of the invention, a temperature sensor of the ambient temperature can be fabricated by fabrication of an electric-to-fluidic valve without any external or internal means of changing the temperature of the fluid in the membrane chamber. A flow meter can then be placed in the fluid communication channel controlled by the valve membrane such that the flow rate through the valve can be measured as a function of the ambient temperature affecting the fluid in the membrane chamber. That is, changes in ambient temperature will cause changes of the temperature of the fluid in the membrane chamber. These temperature changes will be translated to deflection changes in the membrane of the membrane chamber thereby modulating the fluid flow through the fluid communication channel of the valve. This changing flow rate could be amplified using known techniques such as staged pneumatics and used directly in a pneumatically or hydraulically driven control system.

There is also disclosed herein an integrated pressure regulator and an integrated flow regulator. The integrated pressure regulator uses two integrated valves of the type disclosed herein which serve to control the pressure in an output port situated between the valves. The output port pressure is sensed by a capacitive transducer where one plate of the capacitor is fixed on the substrate and the other is formed on a flexible diaphragm which forms one wall of an evacuated chamber formed in the substrate. Changes in pressure cause the diaphragm to flex and cause the second capacitive plate to move closer to or further away from the first plate. These changes in capacitance are used to determine the pressure in the output port and to generate an error signal. The error signal is used to generate control signals which control the two valves. These valves are integrated on the same die with the output port and the capacitive sensor. One valve couples a high pressure source to the output port while the other valve couples the output port to a low pressure effluent sink.

The integrated flow regulator utilizes one integrated valve according to the teachings of the invention and a flow channel. Three resistor elements are placed along the flow channel. The middle resistor is driven with a current that causes this resistor to have a constant temperature. The heat caused by the middle resistor diffuses toward the cooler resistor temperature sensors on either side of the middle resistor. But because of the flow of material in the flow channel, less heat reaches one resistor temperature sensor than reaches the other and this causes a temperature differential. The amount of this temperature differential is related to the flow rate and is sensed by control circuitry coupled to the resistor temperature sensors. The flow rate so determined is compared to a desired flow rate to generate an error signal by conventional circuitry. This error signal is used to control the valve such that the flow rate is altered toward the desired flow rate.

A better understanding of the different types of structures which can be made in accordance with the teachings of the invention and the different methods of making these structures may be had by reference to the drawings herein for which a brief description of the drawings follows.

BRIEF DESCRIPTION OF THE DRAWINGS

FIG. 1 is a cross-sectional view of an electric-to-fluidic valve of the invention.

FIG. 2 is a diagram of one porting arrangement that may be used with the valve of the invention.

FIG. 3 is a diagram of another porting arrangement that may be used.

FIG. 4 is a diagram of another porting arrangement that may be used.

FIGS. 29 through 39 are process sequence drawings for the process to make another polyimide membrane valve.

FIGS. 40 through 48 are process sequence drawings for the process to make another polyimide membrane valve with a "folded" polyimide membrane.

DETAILED DESCRIPTION OF THE PREFERRED EMBODIMENT

Figure 5:
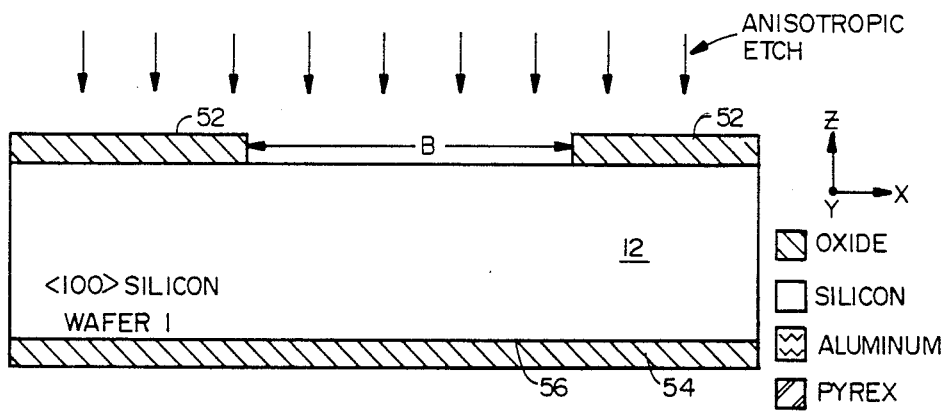
FIGS. 5 through 14 are cross sectional views of wafers 1 and 2 at various stages in one process sequence used to make the valve of FIG. 1.

Referring to FIG. 1, there is shown a cross-sectional view of the preferred embodiment of an electric-to-fluidic valve in accordance with the teachings of the invention. The valve is comprised of a membrane chamber which is etched into a substrate 12 of [100] orientation silicon in the preferred embodiment. The basic structure of the invention may be realized with many different type of materials including electroformed steel, plastics and many others. However, in the preferred embodiment shown in FIG. 1, a three layer sandwich consisting of silicon wafer 12, another silicon wafer 30 and a pyrex wafer 22. Wafer 22 is made of Pyrex 7740 in the preferred embodiment. Silicon was chosen for the other wafers because it can serve as a substrate for the formation of electronic circuitry for signal processing or interface purposes. It is likely, that the signal processing or interface circuitry will be placed on another chip and connected in hybrid fashion using known techniques. However, it is possible to build other electronic circuitry on the same wafer as the valve. The decision on which method to use may be made by the user on other criteria than whether making circuitry on the same wafer as the valve or sensor is possible.

The membrane chamber 10 is defined by six walls, four of which are silicon [111] planes and two of which, walls 14 and 16, are shown in cross section. Because the membrane chamber 10 is anisotropically etched with KOH etchant which will not etch the [111] orientation silicon plane, the walls 14 and 16 form angles of 54.73 with the . surface of the membrane 18. The remaining wall of the membrane chamber 10 is the thin, flexible membrane 18.

The volume of the membrane chamber 10 is fixed except when the membrane 18 flexes. A fixed quantity of a gas or fluid is sealed in the membrane chamber 10. This may be done during the sealing of the membrane chamber by bonding a pyrex wafer 22 to the top surface of the wafer, i.e., the surface of the wafer 12 having the most positive z coordinates and normal to the z axis. The pyrex wafer has formed thereon a photolithographically etched resistor pattern 20 in the preferred embodiment which serves to allow the contents of the membrane chamber 10 to be electrically heated. Pyrex was chosen for the wafer 22 because it is transparent to light and would allow optical energy to be beamed into the membrane cavity 10 through the pyrex to heat the trapped material therein. Also, pyrex forms a hermetic seal with silicon at a relatively low temperature (300° C.). Such an optical to fluidic embodiment is symbolized by the presence of the light pipe 19 which serves to guide light energy to the cavity 10 and direct it into the cavity. The light pipe 19 may be any light guide such as fiber optic cable. This would allow an optical to fluidic valve to be constructed in some embodiments where the resistive heater 20 is inappropriate or is not convenient.

Further, the light pipe 19 only symbolizes the many different forms the heater element may take. For example, no heating element at all may be used and the temperature of the ambient environment may be used to cause the heating and cooling of the material in the chamber. Conduction or convection heating might also be used by heating the wafer 22 and allowing this wafer to conduct the heat to the cavity 10. The conduction heating would be by direct contact of the heat source with the wafer 22 and convection heating would be by flowing hot gas or liquid over the wafer 22. In these latter environments, the material of the wafer 22 should be selected so as to conduct heat well so as to not slow response to the heat signals. In the embodiment shown in FIG. 1, the pyrex wafer 22 serves as a sealing member for the membrane cavity and as a substrate upon which a resistive heater may be formed by planar photolithography. Contact to the resistive heater 20 may be made in any conventional way. One way is through formation of a hole in the glass. The resistive heater 20 is made of aluminum in the preferred embodiment, but a heater made of chromium and gold or any one of a number of materials will also work. In some embodiments, the resistive heater 20 will be formed with a thermocouple as a part thereof for coupling to external temperature measuring equipment. This will allow the temperature of the resistive element to be measured.

In other embodiments, the resistive coefficient of temperature may be used to monitor the temperature of the resistive element. That is, the temperature of the resistive element 20 may be known by measuring the amount of current flowing therein.

The material chosen for the heater element 20 must not react with the material trapped in the membrane chamber 10 either at low temperature or when heating the material. In the preferred embodiment, a thin protective coating (not shown) is formed over the heating element to prevent any reaction with the material being heated. This thin coating may be any material which will effectively seal the heating element while not degrading the heat conduction from the resistive element 20 to the material being heated substantially. In embodiments where there is no danger of reaction between the heating element and the material trapped in the membrane chamber, the coating may be omitted. The conductors of the resistive element may be brought out to bonding pads on the outside edges of the pyrex wafer.

The membrane chamber 10 is filled with a fluid or gas which is selected in accordance with a criteria which will described in more detail later. This filling may be done while the pyrex wafer 22 is being attached, or after attachment by means of forming a port into the membrane chamber 10, filling the chamber with gas or fluid, and then sealing the port. Generally speaking, the material selected to fill the membrane chamber 10 is picked based upon its activation energy such that at the highest ambient temperature likely to be experienced by the valve, the pressure of the fluid or gas in the membrane chamber will not be so great as to cause deflection of membrane 18 to pinch off fluid flow through the fluid manifold and nozzle. Also, the fluid chosen to fill the cavity so as to maximize the ratio: delta pressure/delta energy input meaning the fluid is chosen to get the maximum change in pressure for a unit change in the energy input. Optimizing this ratio minimizes the power consumption which is very important in some applications. Also, the fluid must be chemically inert so as to not cause adverse reactions with the material of the valve and other materials with which it might come into contact. In the more general sense, the flexure of the membrane may be used to modulate the cross section of the fluid flow path through the manifold cavity 24.

The pyrex wafer 22 has a resistor element 20 formed thereon through which electrical current may be passed to heat up the contents of the membrane chamber. A second wafer 30 having a manifold chamber 24 formed therein is attached to the first wafer 12. The manifold has an input port (not shown) and a nozzle 32 formed therein. The nozzle 32 has a sealing ring 28 formed around its perimeter. When the contents of the membrane chamber 24 are heated, and the membrane 18 deflects to the position shown in dotted lines in FIG. 1, the membrane 18 seats on the sealing ring 28 thereby cutting off all pneumatic flow through the nozzle 32. The term pneumatic flow is used here to indicate either gas or liquid flow. As the material trapped in the membrane chamber 10 cools, it contracts thereby decreasing the pressure in the membrane chamber 10 and causing the membrane 18 to deflect away from the sealing ring 28 around the nozzle.

It is possible to get a reverse flexure of the membrane 18 into the membrane chamber 10 if too much pressure is present in the nozzle 32/manifold cavity 24. This will be referred to as an overpressure situation. If this occurs, the membrane can break if the deflection becomes too great. One way is to make the depth, d in FIG. 1, of the membrane cavity small enough such that when overpressure occurs, the surface 21 of the membrane cavity stops the deflection of the membrane 18 before the breaking point or elastic limit is exceeded. A second method of preventing destruction of the membrane 18 is to fill the membrane cavity with liquid. Because of the incompressible nature of liquid, as the volume of the membrane cavity 10 is decreased with the reverse flexure of the membrane 18 when overpressure occurs, the pressure in the membrane cavity rises rapidly. This rise in pressure counteracts the flexure and prevents the membrane from flexing past the breaking point.

The anisotropic etch step to form the membrane chamber 10 is chosen so as to give precise control of the dimension A of the membrane as marked in FIG. 1. It is important to have precise control over the dimensions of the membrane chamber and the lateral positions of the walls 14 and 16. This is because identical electric-to-fluidic valves are to be mass produced on silicon wafers and because the density of the valve structures on a single wafer is to be as high as possible to reduce the cost of fabricating the valve. The dimension A is controlled by controlling the dimension B of an oxide mask layer (not shown) which is used as an etch mask to define the size and location of the membrane chamber 10. Because the dimension B can be relatively precisely controlled, and because an anisotropic etch characteristically forms the walls 14 and 16 at a precisely known angle, it is therefore possible to control the dimension A with some precision. Because it is known that the angle that the walls 14 and 16 form with the surface of the membrane 18, the lateral spread of the membrane chamber 10 will be known for a known wafer thickness.

Where high packing density of valves on a single wafer is not an important criteria, an isotropic etch may be used to form the membrane chamber 10. In such a process, there will be lateral etching along the X axis simultaneously with etching along the Z axis. The thickness of the membrane 18 is controlled by controlling the etch along the Z axis. Where an isotropic etch is used, the exact positions of the walls 14 and 16 along the X axis will be unknown because of the relative unpredictability of the lateral etch rate of an isotropic etch. Further the walls 14 and 16 will not be straight but will be curved. As long as the volume of the membrane chamber 10 is fixed, the valve should work when manufactured using an isotropic etch, but packing density in terms of numbers of valves which may be fabricated on the same die will not be as high as where an anisotropic etch is used.

Because the lateral etch rate of an isotropic etch is not predictable, the volume of the membrane chamber 10 of a first valve formed on die #1 may be different from the volume of the same membrane chamber 10 formed in a second valve on a die #2. The membrane thickness may vary also. Further, the etch characteristics may vary across a wafer, so even valves on the same wafer may have different physical dimensions. Thus the volume of the chambers of valves on the same or different wafers can vary. Since the characteristics of different valves will be different because of the different volumes of the fluid or gas trapped in the membrane chamber 10 will be different, it is preferred to use an anisotropic etch to form the membrane chamber 10 to render the performance characteristics of valves in different manufacturing lots more predictable.

The substrate 12 can be any material which may be chemically machined by planar photolithography techniques to form the membrane 18. Further, it is preferred that the substrate 12 be a material which has a high coefficient of heat conductivity. The response time of the electric-to-fluidic valve is determined by the rate at which the fluid or gas trapped in the membrane chamber 10 may be cooled after it is heated. A higher coefficient of heat conductivity for the substrate 12, means faster cooling of the gas or fluid trapped in the membrane chamber 10 and faster response times. The rate of heating of the fluid or gas in the membrane chamber 10 can be controlled by controlling the magnitude of electrical current flowing through a resistor element 20 formed on the pyrex wafer 22. In the preferred embodiment, the support wafer 22 is pyrex glass, and the resistive element 20 is photolithographically etched aluminum formed in a serpentine pattern located within the membrane chamber 10. When electrical current is passed through the continuous aluminum pattern 20, the resistance of the aluminum causes $I^2R$ heating of the aluminum wire. This heat is conducted into the gas or fluid trapped in the membrane chamber 10 and causes it to rise in temperature. The rise in temperature causes an exponential rise in pressure of the gas trapped in the membrane chamber 10. The increased pressure in the membrane chamber 10 overcomes the equal and opposite pressure of the gas in the manifold chamber 24 thereby causing the membrane 18 to flex in the negative Z direction toward the sealing surface 26 of a sealing ring 28 which is photolithographically formed in the second wafer 30.

In the preferred embodiment, the second wafer 30 is also [100] orientation silicon, but in alternative embodiments, the wafer 30 may be any other material which is subject to wet or dry chemical machining by photolithographic techniques commonly used in the semiconductor industry. In the second silicon wafer 30 there is chemically etched the manifold 24 and the nozzle 32 and its associated sealing ring 28. The nozzle 32 is etched in the sealing ring 28 to form part of the gas passageway on the pneumatic side of the valve of FIG. 1. The complete gas passageway on the pneumatic side of the valve is comprised of an input or output port 34 (shown in cross section in FIG. 1 and illustrated in FIGS. 2 through 4), the gas manifold 24, and the nozzle aperture 32 to allow gas to pass through the nozzle 32 and the manifold 24 to some gas source or gas sink external to the valve of FIG. 1. The solid lines in FIG. 1 defining the outline of the membrane 18 when the valve is fully open. The dotted lines defining the outline of the membrane 18 when the valve is in the fully closed position.

The relationship between the temperature of the liquid and gas in the membrane chamber 10 and the pressure of that liquid and gas is given approximately by equation 1 below defined by Kittel and Kroemer, "Thermal Physics" at page 282 (assuming an ideal two phase system which is a good approximation for most liquid-gas systems where dissociation is neglected).

$$P(T) = P_0 \exp(-L_0/RT) \quad (1)$$

Where:
P = pressure in the membrane chamber;
$P_0$ is a constant;
$L_0$ is the latent heat of vaporization of the material trapped in the membrane chamber 10; and
R is the gas constant; and
T is the temperature in degrees Kelvin.

The deflection of the membrane 18 is given by the equation in Appendix A from Timoslenko et al. "Theory of Plates and Shells".

Obviously from Equation 2, the thickness of the membrane h and the width of the membrane A and the modulus of elasticity E of the membrane are all related in a complex way. The user should set the parameters for the thickness and width of the membrane and pick a material with a modulus of elasticity such that the maximum deflection needed to cause proper sealing may occur under the temperature and pressure conditions expected in the membrane chamber. Further, the distance between the sealing surface 26 and the surface of the membrane 18 having the most negative Z coordinate should not exceed this maximum deflection defined by Equation 2.

The pyrex wafer 22 and the silicon wafer 12 are bonded together b an anodic bond symbolized by the layer 36. Other forms of bonding may also be used. Whatever type of bond is used, the bond must be compatible with the operating environment in which the valve is to be used and must provide sufficient bonding strength to hold the wafer 22 to the wafer 12 at the highest pressure levels expected for the gas or fluid trapped in the membrane chamber 10. The bond must also provide a hermetic seal for the chamber.

Transducer Embodiments

In embodiments where the structure of FIG. 1 (with any of its alternative heating elements options in effect) is to be used as a sensor, temperature may be sensed by sensing the volume of fluid flow through the fluid flow channel comprised of the port 34, the aperture 32, the fluid flow manifold 24 and any ports connected thereto. By the equations given above, the temperature may be directly related to the deflection of the flexible wall of the membrane cavity. This deflection modulates the cross sectional area of the fluid flow channel and therefore indicates the temperature of the trapped material by the volume of fluid flow. If conduction of heat from the ambient is being used as the heating mechanism, the volume of fluid flow may be converted to the ambient temperature.

Another form of sensor which may be manufactured according to the teachings of the invention is a structure similar to that shown in FIG. 1 except that a capacitor plate is substituted for the sealing surface 26 of the wafer 30. That is, the surface of the flexible wall 18 having the most negative Z coordinate is coated with a metal or other conductor in any known manner such as by chemical vapor deposition and a conductor is photolithographically etched to lead to a bonding pad accessible to the user. Wafer number 2 is then processed differently in that the nozzle aperture 32 and nozzle port 34 are not formed. Instead, an indentation or cavity in the surface of the wafer 30 is formed so as to be adjacent or "under" the diaphragm 18 when the two wafers 12 and 30 are bonded together. The "floor", i.e., the surface of the indentation parallel to the membrane 18 is then coated with a metal or other conductor by any known method, and a conductor coupling the metal or other conductor to a bonding pad accessible to the user is etched. The wafers 12 and 30 are then bonded together hermetically in a vacuum such that the membrane 18 with its metal underside and the metal floor of the indentation form a parallel plate, vacuum dielectric capacitor. A liquid or other material is then encapsulated in the membrane chamber 10 by any method described herein. Changes in temperature of the encapsulated material are then translated into flexure of the membrane 18 and changes in the spacing between the two conductive plates. These changes in spacing are reflected at the terminals connected to the two metal plates as changes in the capacitance of the parallel plate capacitor. The temperature may be thus deduced.

Silicon Wafer to Silicon Wafer Bonding Process Using Aluminum Metal

The silicon wafer 12 is bonded to the silicon wafer 30 by a new process using aluminum and an aluminum migration barrier. The first step in this process is to form a silicon dioxide layer 38 on the surface of the wafer 12 to be bound to the wafer 30. This silicon dioxide layer 38 acts as an aluminum migration barrier. Any other material, such as tungsten, which is compatible with the rest of the process and the environment of operation and which acts as an aluminum migration barrier may be substituted for the silicon dioxide layer. After the migration barrier is formed, a layer of aluminum 40 is deposited over the migration barrier. The two wafers 12 and 30 are then stuck together and brought to a high temperature. The silicon of wafers 12 and 30 has a very strong affinity for the aluminum and tends to migrate toward it. However, the migration barrier 38 prevents the aluminum from diffusing into wafer 12. The native aluminum oxide which forms on the surface of the aluminum layer 40 facing the wafer 30 (the surface of the aluminum layer 40 having the most negative Z coordinate) is also an aluminum migration barrier but it is not a sufficient barrier to prevent the aluminum in the layer 40 from diffusing into the silicon of the wafer 30 thereby forming a bond.

Some other metals, e.g., gold, may be substituted for the aluminum of layer 40 as long as they have enough affinity for silicon so as to diffuse at high temperatures into the silicon to form the bond. If there are any noble metals having this characteristic, their use would be preferred since noble metals do not oxidize and there would be no barrier to diffusion of the metal in the layer 40 into the wafer 30. Other metals may work as well even if they form oxides as long as the affinity for silicon is greater than the barrier presented by the oxide.

Other methods of bonding the wafers together may also be used. These include epoxy, polyimide, glass frit, thermally grown oxide and other eutectics.

A key 42 formed in the wafer 30 matches a slot 44 formed in the wafer 12 to index the relative positions of the wafers 12 and 30 for bonding purposes.

FIGS. 2-4 show alternative port arrangements for the ports coupled to the manifold 24 and the nozzle 32. FIG. 2 shows both the input and output ports passing through the surface of the die parallel to the Z axis. In a typical 3" wafer approximately 100 valves could be fabricated, and each valve would need ports such as those shown in FIGS. 2-4. Either port may be designated as the input port and the other port will be the output port or vice versa. In some embodiments, a third, vent port such as the port 47 may be used.

FIG. 3A shows an alternative porting arrangement where one port 46 is in the die surface parallel to the Z axis while another port 48 is formed in a flat surface parallel to the Y axis on the edge of the die 30. A third venting port 47 is also provided in the embodiment of FIG. 3A, but it may also be used in any of the other porting embodiments. The purpose of the venting embodiment is to vent fresh gas into the manifold chamber 24 when the valve is in the closed condition. The relationship of the vent port to the flexible membrane, the other two ports and the sealing surface is as shown in FIG. 3B. Again the porting for only one valve is shown. Those skilled in the art will appreciate the porting arrangements that would have to be made to accommodate a large number of valves on the same wafer. This latter surface has one dimension (along the Z axis) which represents the thickness of the die.

FIG. 4 shows an alternative porting arrangement where the input and output ports 46 and 48 are both located in a surface parallel to the Y axis of the die 30 on an edge of the die.

A Process for Manufacture of an Electric-to-fluidic Valve

Referring to FIG. 5 there is shown a cross sectional view of wafer 1 at an early stage in the process of making the valve of FIG. 1 during the anisotropic etch to form the membrane cavity. In this embodiment, a silicon wafer of [100] orientation is selected. Other types of materials may also be selected so long as they may be chemically etched and have good heat conduction properties. Silicon is preferred however, since processes for chemically machining silicon are well understood, and because other electronic circuitry may be integrated onto the same wafer using standard planar photolithography techniques. This other circuitry may be the interface circuits necessary to couple the electro to fluidic valves to the control logic which provides the electronic control signals which control the opening and closing of the valves. Further, pressure sensors may be integrated on the same die with the control circuitry for integrated flow control valves so as to make an integrated pressure regulator.

In preparation for etching of the membrane chamber 10, a layer of silicon dioxide 52 is formed by conventional methods such as thermal oxidation. The oxide 52 will serve as an etch mask, so it is patterned photolithographically to leave an opening therein which will define the location and size of the membrane cavity 10. Because anisotropic etching is used in the preferred embodiment, the dimension B of this hole will define the exact volume of the membrane cavity since anisotropic etching will not significantly etch the [111] orientation plane. An oxide layer 54 is formed simultaneously with the formation of the layer 52.

After the two oxide layers are formed, wafer 1 is subjected to an anisotropic etch to etch away the silicon masked by the oxide layer 52. The purpose of the etch is to form the membrane 18 of the membrane chamber 10, so the etch must be controlled so the etching is stopped when the desired thickness h for the membrane is reached. This may be done by timing the etch properly and using a known thickness for the wafer 12 and an etch with a known etch rate in the Z axis direction. Another way to control the etch is to use a P+ doped buried layer. This is done by implanting P+ impurities with a dosage of at least $10^{19}$ atoms per cubic centimeter and any energy level into the surface 56 of the wafer 12. This implant may be done either before or after the oxide layer 54 is formed if the oxide layer 54 is sufficiently thin. After the implant, any oxide on surfaces 56 is stripped, then a layer of epitaxial silicon is grown on the surface 56 in the negative Z direction. The growth rate of this epitaxial silicon and the time of growth are controlled to get the desired thickness for the membrane 18. The P+ implant then acts as an etch stop such that when etching reaches the P+ doped area, the etch rate slows or stops. This insures good control over the thickness h of the membrane 18.

Figure 6:
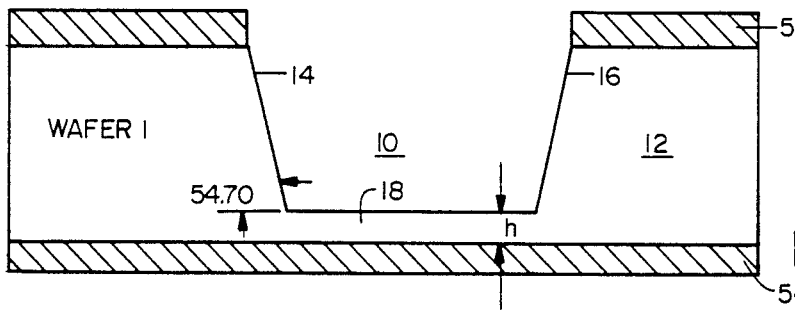

Referring to FIG. 6, wafer 1 is shown in cross section after the anisotropic etch step to form the membrane cavity 10. Note that the walls 14 and 16 form an angle of 54.7 degrees with the X axis. The walls 14 and 16 each define a [111] plane of the wafer 12. This feature lends itself to high packing density of the valves in the X-Y plane, because the exact positions of the walls 14 and 16 are known and defined by the location and size of the opening in the oxide layer 52.

Figure 7:
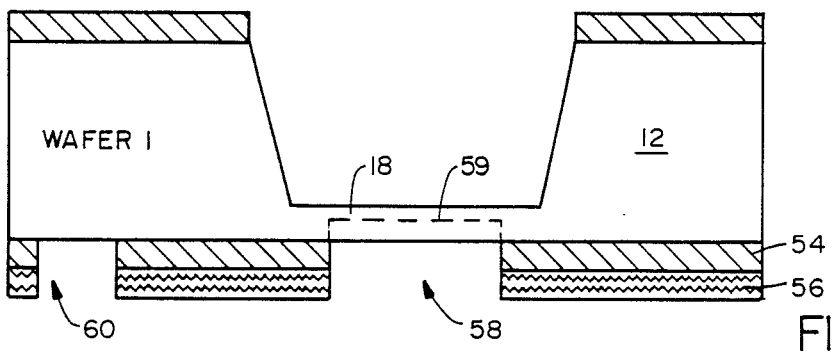

Referring to FIG. 7 there is shown wafer 1 in cross section after a layer of aluminum 56 has been deposited over the oxide layer 54 and patterned photolithographically. The aluminum 56 is placed over the oxide layer 54 to act as a bonding agent. The oxide layer 54 acts as a migration barrier to prevent the aluminum from migrating into the silicon wafer 12 because of the affinity of silicon for aluminum. The aluminum layer 56 and the oxide layer 54 are etched away at 58 and 60. The hole at 58 serves to expose the underside of the membrane 18, while the hole at 60 serves as a key slot to receive a key projection to be formed on wafer 2 as described below for purposes of maintaining the two wafers in proper alignment during the bonding process and to aid in registration of the two wafers with each other in preparation for bonding. An optional membrane thinning etch may be performed at this point to reduce the thickness of the membrane 18. This step may be done by performing an anisotropic plasma etch using the aluminum layer 56 and oxide layer 54 as an etch mask. The resultant thinning of the membrane 13 is as shown by the dotted line 59 in FIG. 7.

Figure 8:
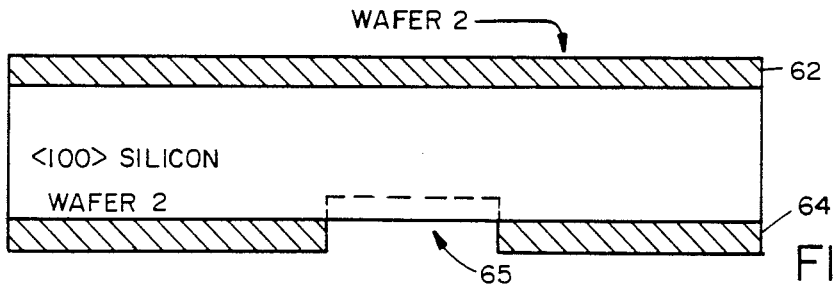

At this point in the process, it is time to start chemically machining the manifold chamber, nozzle and ports into wafer 2 since the membrane chamber chemical machining is now substantially done. Referring to FIG. 8, there is shown a cross sectional view of wafer 2 after two layers of silicon dioxide 62 and 64 have been formed. Preferably wafer 2 is also silicon having a [100] orientation, but other materials which may be chemically etched and processed using standard photolithography techniques may also be used. As in the case of wafer 1, other etch mask materials than silicon dioxide may be used for the layers 62 and 64 so long as these materials are capable of serving as etch masks which may be photolithographically defined and are otherwise compatible with the process. Silicon nitride or chromium under gold are examples of materials that can be used.

The etch mask layer 64 has a hole 65 defined therein which serves to locate the precise size and position of what will, after etching, become one port in fluid communication with the nozzle.

Figure 9:
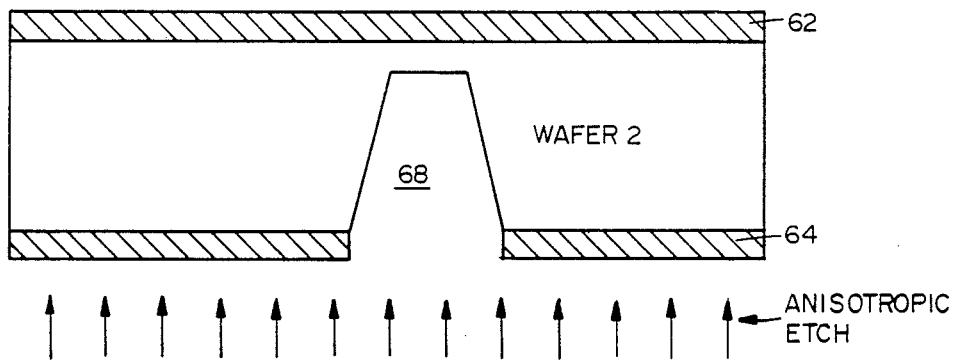

FIG. 9 shows a cross sectional view of wafer 2 after an anisotropic etch is performed to remove the silicon from the portion of the wafer exposed by the hole 65. This etch forms the port cavity 68 which will later provide a fluid communication path between the nozzle into the manifold cavity (neither of which has been formed at this point in the process) and the surface of wafer 2. The size of the port may be set by the designer based upon the intended flow rate.

Figure 10:
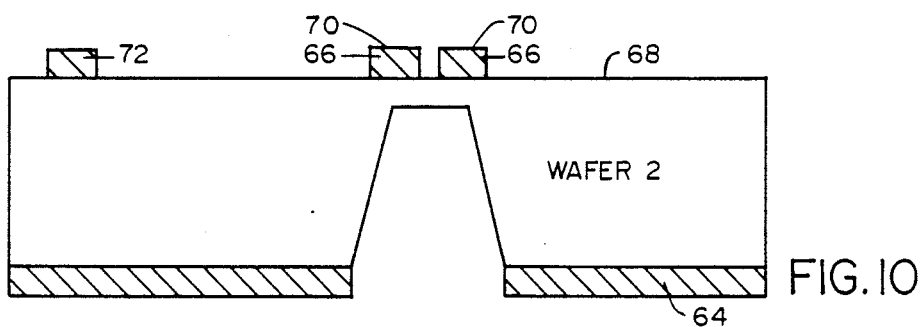

FIG. 10 shows a cross section of wafer 2 after the oxide layer 62 has been photolithographically etched into the form of an etch mask to define a sealing ring and a key. It is necessary for good sealing of the valve to provide a sealing ring around the nozzle aperture which the membrane 18 contacts when flexed toward the nozzle aperture. Accordingly, the etch mask layer 62 is photolithographically defined to leave a circular ring 66 of oxide or other etch mask material around the portion of the surface 68 which will be etched to form the nozzle aperture. Because FIG. 10 is a cross sectional view, this ring 66 appears to be two blocks of oxide. In reality, it is a ring exposing a small portion of the surface 68 in the center of the ring where the nozzle aperture is to be etched.

A block 72 of oxide serves to define an etch mask for a key to fit into the slot 60 in wafer 1, FIG. 7, for alignment purposes.

Figure 11:
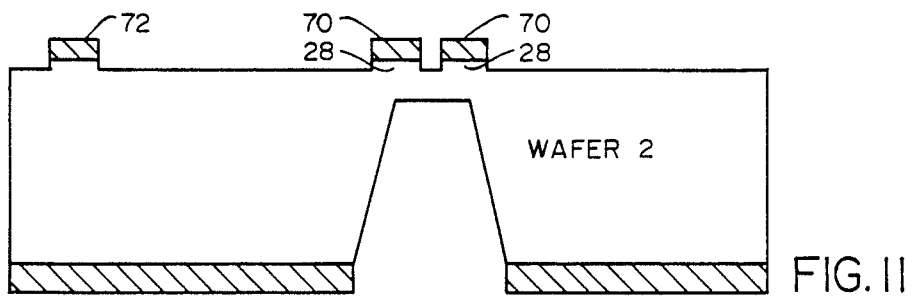

FIG. 11 shows a cross sectional view of wafer 2 after an etch is applied to the surface 68 to lower the surface level and define ridges of silicon under the sealing ring etch mask 66 and the key etch mask 72. In some embodiments, the sealing ring etch mask 66 and the key etch mask 72 may be left in so that the ridges of silicon need not be formed. In these embodiments, the oxide surface 70 will serve as the sealing ring, and the etch step of FIG. 11 is not necessary. In the preferred embodiment, the sealing ring etch mask 66 is removed to leave the ridge of silicon thereunder as the sealing ring.

Figure 12:
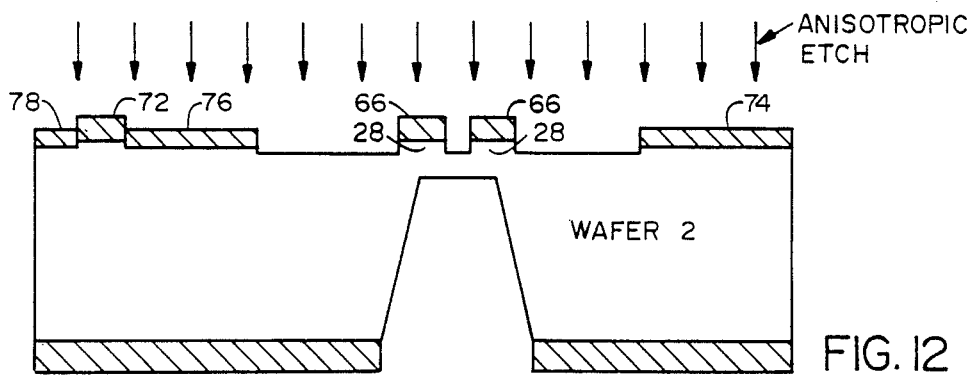
Figure 13:
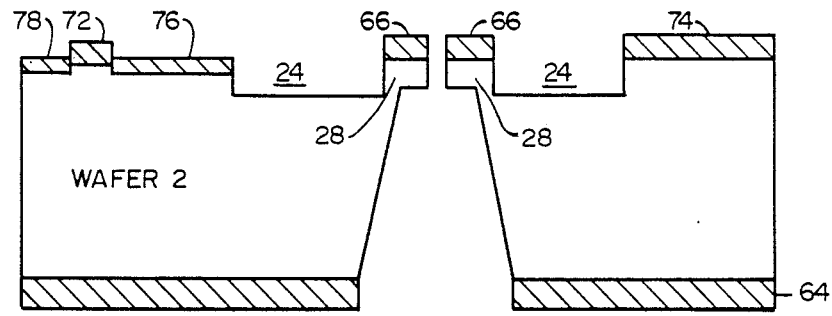

FIG. 12 is a cross sectional view of wafer 2 after an additional oxide layer has been formed and patterned to leave the oxide portions 74, 76 and 78. These oxide portions serve as etch masks for an etch which will define the manifold cavity. This etch is shown as an anisotropic plasma etch in progress in FIG. 12. FIG. 13 shows wafer 2 after the anisotropic etch to form the manifold cavity 24. Note that the same etch step which forms the manifold cavity also forms the nozzle aperture 32. After this etch step, the oxide portions 66, 72, 74, 76 and 78 are removed in preparation for bonding wafer 2 to wafer 1.

In some embodiments, an isotropic etch may be used as long as the lateral etching does not adversely affect the width of the sealing ring. Another port into the manifold cavity 24 may be formed by forming the oxide portions 74 and 76 as a field of oxide surrounding the sealing ring with a passageway out to the side of the wafer. This would form a port as the etch that formed the manifold cavity formed said cavity since a "canal" in the surface of the wafer would be formed to the depth of the manifold cavity. This canal would form a passageway to the side of the wafer if the port scheme of either FIGS. 3 or 4 was used.

Figure 14:
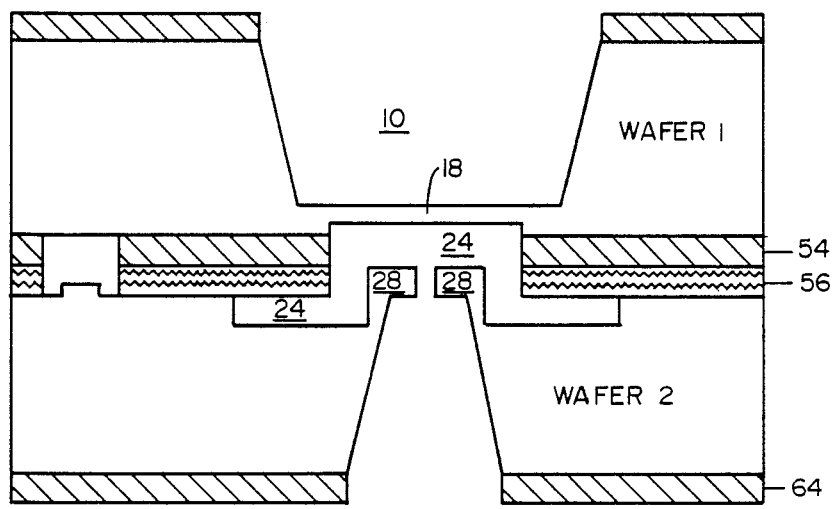

After the bonding step of FIG. 14 is completed, the membrane cavity may be filled and sealed to complete the fabrication of the valve. This is done by first forming the heating element on a surface of a pyrex wafer such as that shown in FIG. 1, and bonding the pyrex wafer to wafer 1 after the material to be sealed in the membrane cavity is placed therein. The method of forming the heating element 20 on the surface of the pyrex wafer 22 can be by conventional photolithographic etching of a sputtered or plated aluminum film deposited on the surface of the pyrex wafer. Other metals for the resistive element are also permissible. For example, a sandwich of titanium/tungsten, copper and titanium/tungsten may also be used. Aluminum is compatible with most filling methods. If other methods of heating or cooling the contents of the membrane cavity are to be used, this step of forming the heating element on the surface of the pyrex wafer may be omitted.

There are at least two ways of sealing the material in the membrane cavity 10. The best seal is provided by encapsulating the liquid or gas to be trapped during the process of bonding the pyrex wafer 22 to wafer 1. This may be done by bonding the pyrex wafer 22 to wafer 1 in the presence of the gas to be used in the case of a gas. The bonding should be performed in a pressurized vessel for most liquids. In the case of a liquid, a known amount of the liquid may be placed in the membrane cavity, then the pyrex wafer 22 is placed on top of wafer 1 and bonded thereto. The bonding process may be any process which is compatible with the process and materials and operating environments as described herein. One method which will work is anodic bonding. Another method is to form a layer of polyimide on the top surface of the wafer 12 and then place wafer 1 and the pyrex wafer 22 in contact. A heat treating step then turns the polyimide liquid into a plastic thereby bonding the two wafers together.

Bonding of wafer 2 to wafer 1 is accomplished in the manner described above under the heading "Silicon Wafer to Silicon Wafer Bonding Process". Basically, the two wafers are aligned so that the sealing ring 28 is under the center of the membrane 18, and the combined structure is heat treated so as to cause the aluminum to diffuse into wafer 2 but not to diffuse into wafer 1 because of a migration barrier formed by the oxide layer 54. The construction of the valve is then complete unless signal processing circuitry is to be formed elsewhere on wafer 2.

A Polyimide Membrane Embodiment and Process for Making Same

Figure 15:
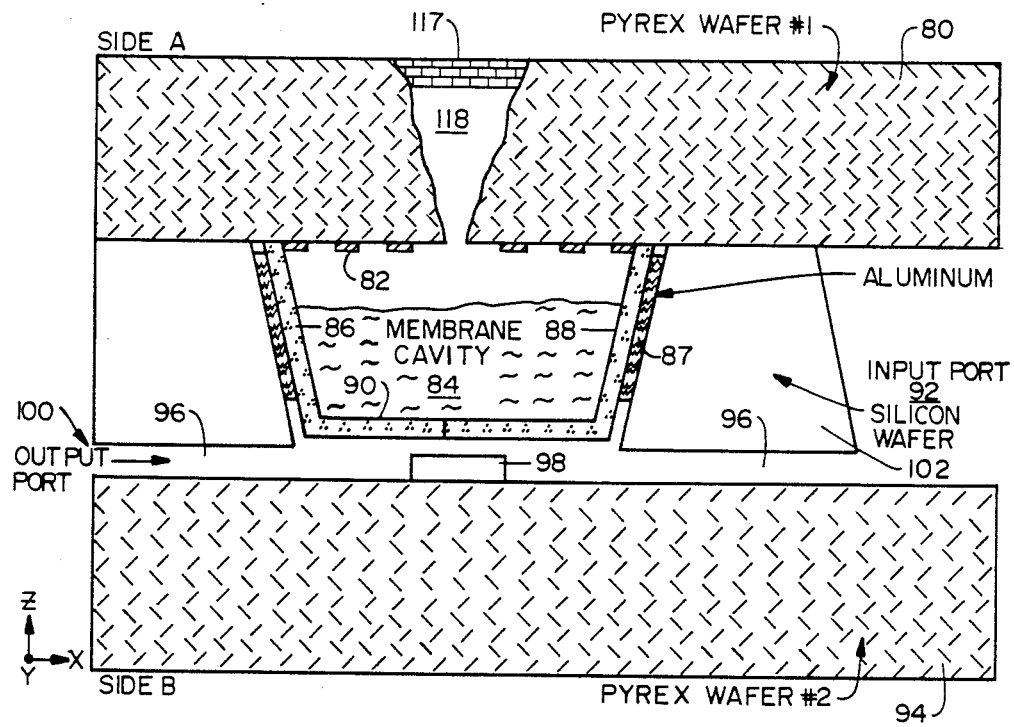
FIG. 15 is a cross sectional view of a polyimide membrane valve structure.

FIG. 15 shows an alternative embodiment using a polyimide membrane, two pyrex wafers and a silicon wafer. A first pyrex wafer 80 serves as the substrate for the resistive element 82 and as a sealing member for the membrane cavity 84. The membrane cavity 84 is defined by walls 86 and 88 of polyimide, the sealing wafer 80 and a polyimide membrane 90. An input port 92 is formed between pyrex wafer 80 and a second pyrex wafer 94. This input port is in fluid communication with a fluid channel 96. A sealing block 98, formed on the surface of the wafer 94 and located in the cross sectional area of the fluid channel 96 serves to provide a sealing surface upon which the membrane 90 may come to rest when it is deflected in the negative Z direction by rising pressure in the membrane cavity 84. The fluid channel 96 continues past the sealing block to make fluid coupling with an output port 100. In plan view (not shown) the wafers 80 and 94 could have any shape, and the fluid passageway 96 and input and output ports would form a passageway through the wafer sandwich. Physical separation of the two wafers 80 and 94 is provided by a silicon wafer 102. This wafer has two parallel surfaces one of which is bonded to the wafer 80 and the other of which is bonded to the wafer 94. The fluid passageway 96 and the input and output ports are formed through a portion of the wafer 102.

Figure 16:
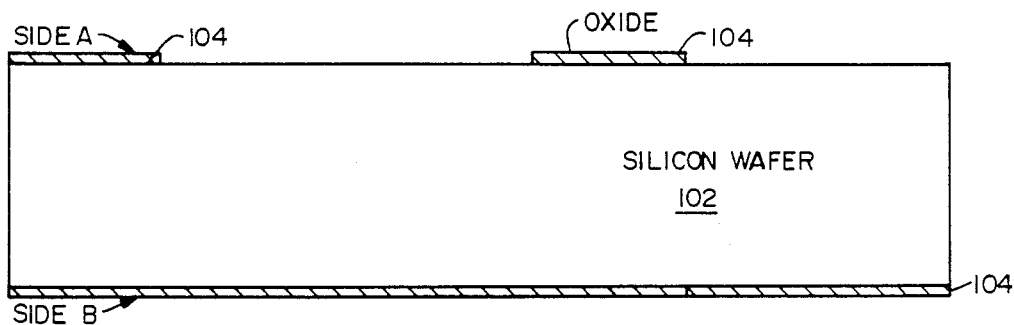
FIGS. 16 through 27 are cross sectional views of the processing of various wafers necessary to form the polyimide membrane valve of FIG. 15.

The process for making the valve of FIG. 15 is as follows. Referring to FIG. 16, there is shown a cross sectional view of the silicon wafer 102 after three initial steps have been performed. The wafer 102 should have both sides polished, The first step is thermal growth of a 5000 angstrom layer 104 of silicon dioxide on the silicon wafer 102. Next a 900 angstrom thick layer of silicon nitride (not shown) is deposited on the oxide layer 104 using low pressure chemical vapor deposition at 700° C. The oxide layer 104 on the two sides of the wafer 102 will be designated sides A and B. Side A is patterned and etched using positive photoresist and photolithography and either a dry or wet etch with a mask configured to leave the oxide on side A as shown in FIG. 16. The pattern of the side A oxide/nitride etch mask defines the membrane cavity, the input and output ports and the membrane.

Figure 17:
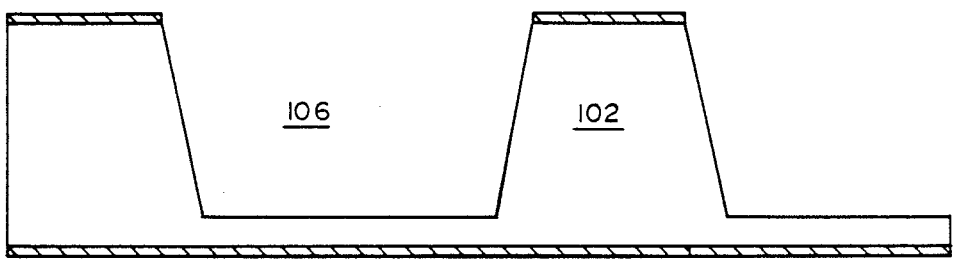

Referring to FIG. 17 there is shown a cross sectional view of the silicon wafer 102 after an etch step is performed using the patterned oxide/nitride of side A as an etch mask. The purpose of this etch is to form part of the cavity, define the location of the membrane and to define the height of the input and output capillaries 96. The cavity 106 is etched to 340 micrometers depth using KOH as an etchant. Different depths may be used depending upon the desired height of the input and output capillaries or flow channels 96. The nitride is stripped off both sides of the wafer 102 after the etching step.

Figure 18:
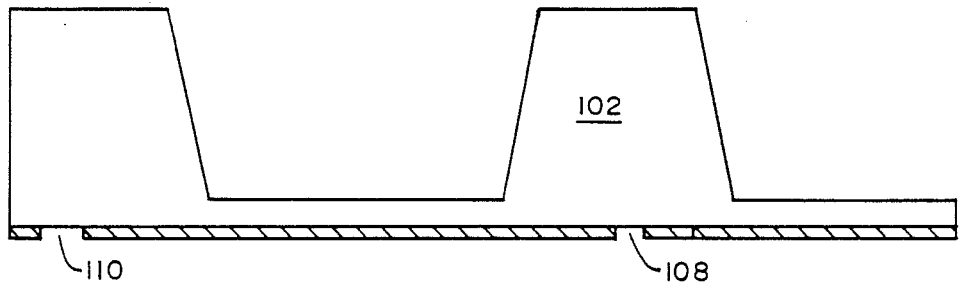

Referring to FIG. 18 there is shown a cross sectional view of the silicon wafer 102 after alignment marks have been placed on side B. The alignment marks 108 and 110 on side B are etched in the oxide on side B using negative resist and a second mask. This step requires the use of an infrared alignment system. The oxide on side B is then stripped off the wafer 102.

Figure 19:
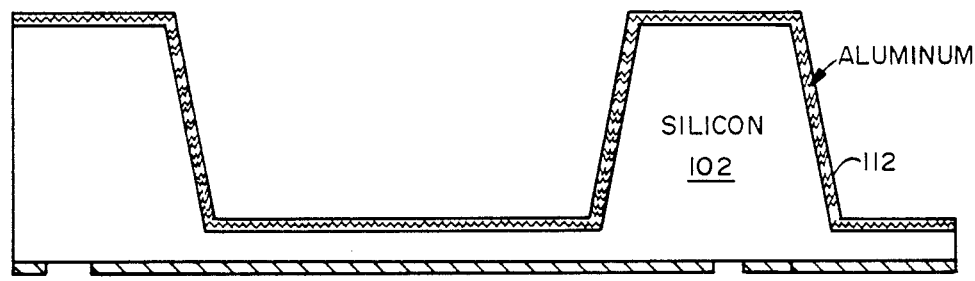

Referring to FIG. 19, there is shown a cross section of wafer 102 after a layer of metal 112 is deposited on the surface. The purpose of this metal layer 112 is to act as a spacer and to provide support for the polyimide (not yet shown) while it is being formed and cured. This aluminum spacer will later be dissolved to free the membrane from the silicon. In the preferred embodiment as presently known, the aluminum layer 112 is 5 micrometers thick.

Figure 20:
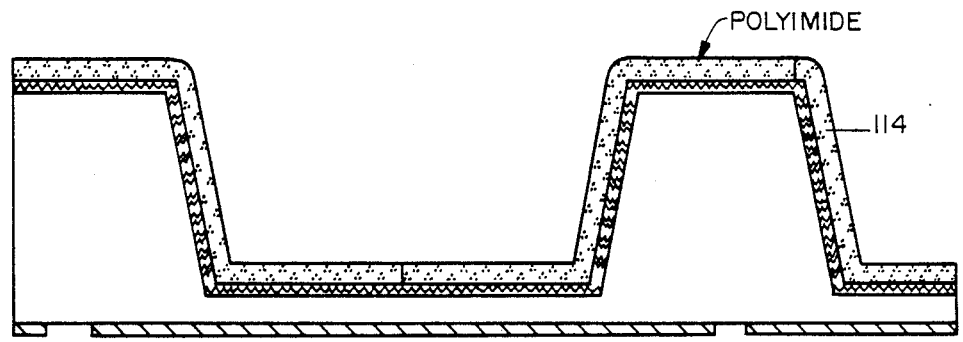

The next step is to spin on a 10 micrometer layer of polyimide. This step is symbolized by FIG. 20. The polyimide layer 114 may be spun on in repeated applications if necessary and is spun on the A side of the wafer only. The polyimide is baked at 90° C. for one hour between coats if multiple coats are used. After the 10 micrometers of polyimide has been built up, a partial curing step is performed where the polyimide film is baked at 130° C. for 2.5 hours.

Figure 21:
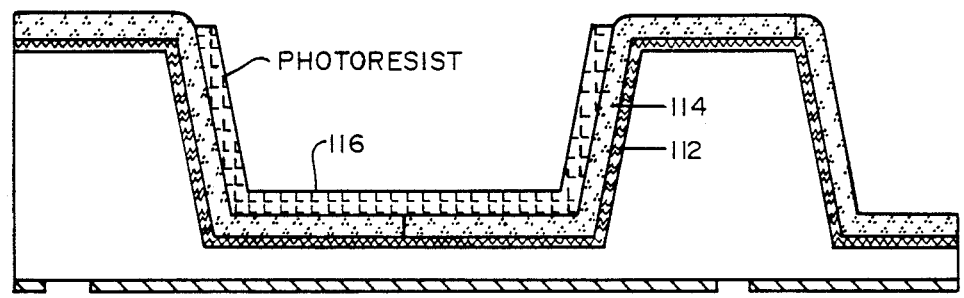

After the partial cure, as shown in FIG. 21, a layer of negative resist 116 is deposited, baked at 90° C. and then exposed through a third mask and developed into the pattern shown at 116 in FIG. 21. After the resist has been developed, it baked at 120° C. to harden it.

Figure 22:
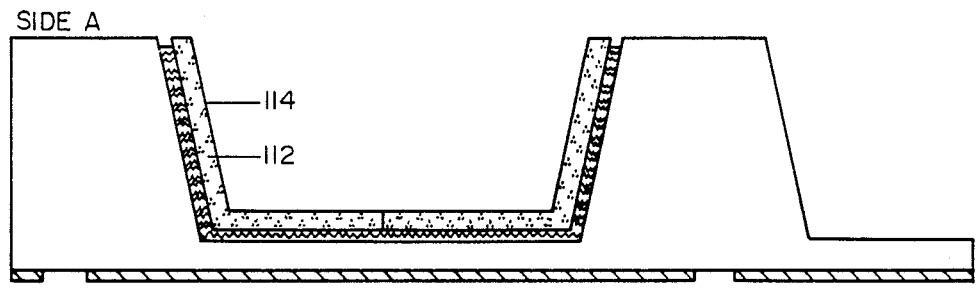

Referring to FIG. 22, there is shown the next stage in the process after the polyimide is etched. After the photoresist is developed as shown at 116, the polyimide film 114 is etched away at all points on side A except those points under the photoresist etch mask 116. This etch is performed using Etchant III which is commercially available from Hitachi at 35° C. for 15 to 30 minutes. A bake step is then performed to partially cure the newly exposed portions of the polyimide film 114. This bake step is done for one hour at 220° C.

Next, the exposed aluminum film 112 is etched away using known Aluminum Etchant I (KTL part No. 70-03) or any other standard aluminum etchant. The negative resist is then stripped away using standard J100 solvent, and the wafer is cleaned with TCE, then cleaned with acetone and cleaned finally with methanol. This leaves the wafer as shown in FIG. 22. Finally, the polyimide film 114 is cured at 350° C. for one hour.

Figure 23:
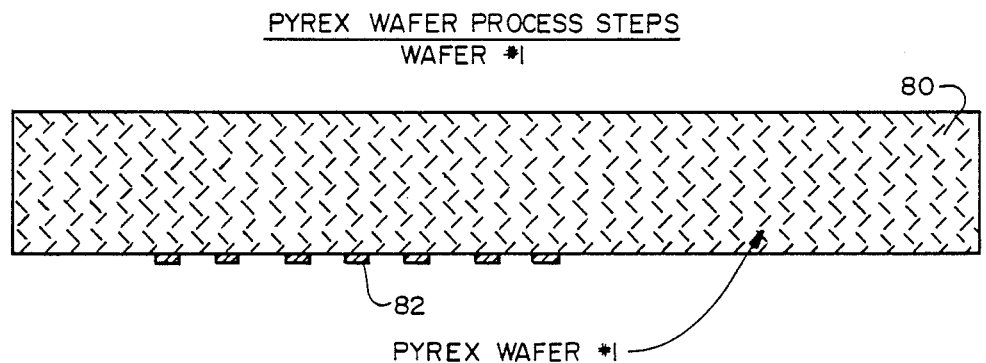

FIG. 23 shows the first pyrex wafer in cross section after the first two steps of processing. The first step is to deposit a layer of aluminum, chromium/gold, or titanium/tungsten-copper-titanium/tungsten or some other acceptable conductive film from which the resistive element 82 may be formed. In the preferred embodiment, the film is 0.3 micrometers thick.

Figure 24:
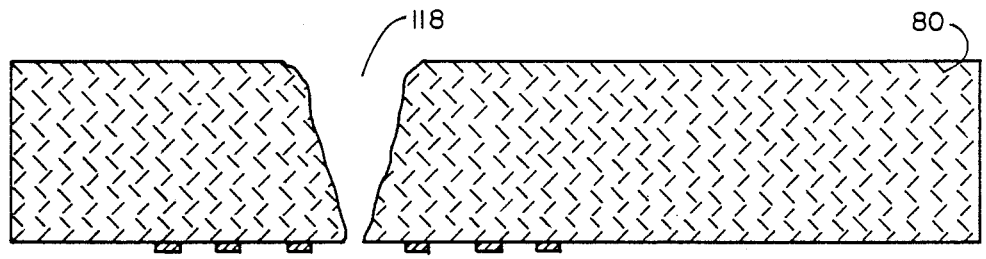

The resistive element 82 is then formed in a serpentine pattern by use of a fourth mask and positive resist and Aluminum Etch. Finally, a laser is used to drill a hole through pyrex wafer 80 at the center of the resistor pattern. This hole is shown at 118 in FIG. 24. After the material to be encapsulated, which may be any material which has a vapor pressure which changes with changing temperature, is placed in the cavity 84 by any of the encapsulation methods described herein, the fill hole may be hermetically sealed. The seal is symbolically shown at 117, and may be epoxy, superglue, melted pyrex, metal (the sides of the pyrex wafer 80 may be metallized and the plug 117 may be electroplated onto the metallized surface) or another wafer bonded on top of the wafer 80 over the hole.

Figure 25:
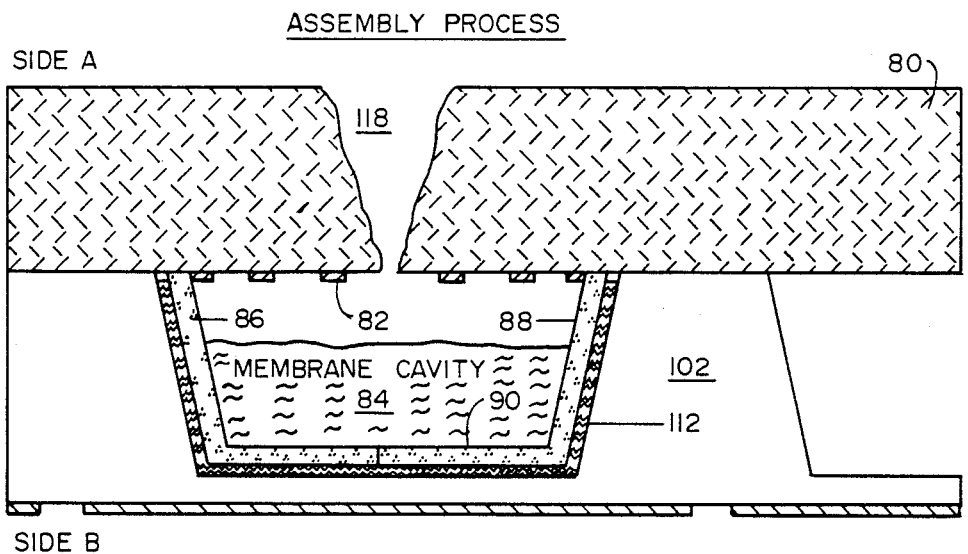

The process of assembly of the device may now begin with the anodic bonding of the pyrex wafer 80 to the silicon wafer 102. The bonded structure is shown in FIG. 25. The bonding is done after the resistive element 82 is aligned with and inside the membrane cavity 84. This traps the polyimide membrane 90 inside the cavity.

Figure 26:
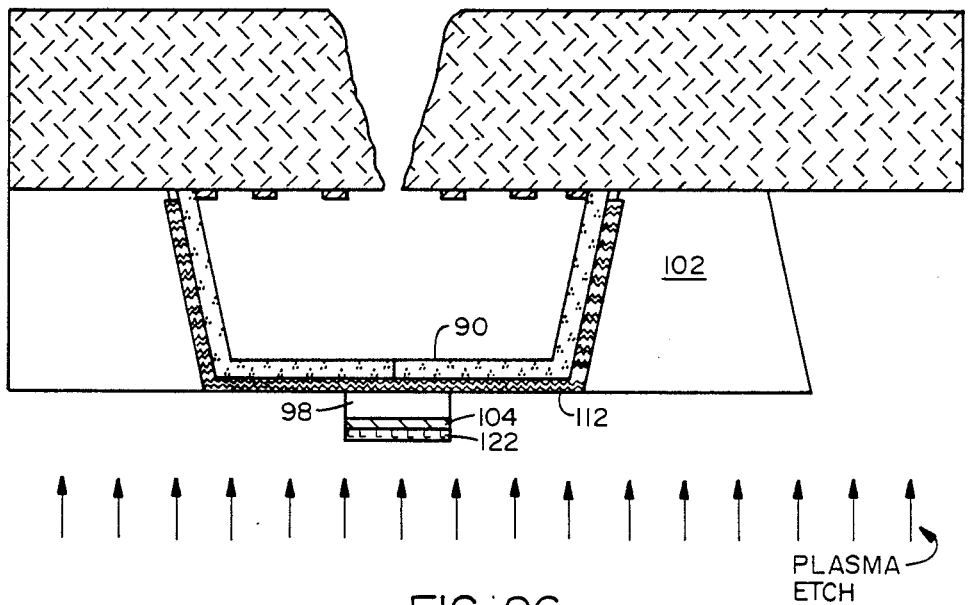

FIG. 26 shows the sandwich structure after side B of the wafer 102 is etched. To accomplish this, side B of the resulting sandwich structure is patterned with a fifth mask and negative resist in preparation to etch away the silicon of wafer 102 down to the aluminum layer 112. The developed layer of photoresist using mask #5 is shown at 122, and is located at the middle of the flexible wall 90. The etch step may be done using a plasma etch, or a wet KOH or HNA etchant. A plasma etch is preferred. The result of the etch is a sandwich of silicon 98, oxide 104 and photoresist 122. This sandwich structure extends across the width of the silicon wafer 102 although the aluminum layer 112 and the flexible wall 90 extend only part way across the wafer 102. This allows the silicon wafer 102 to support the region of silicon 98 when the aluminum layer 112 is later etched away.

Figure 27:
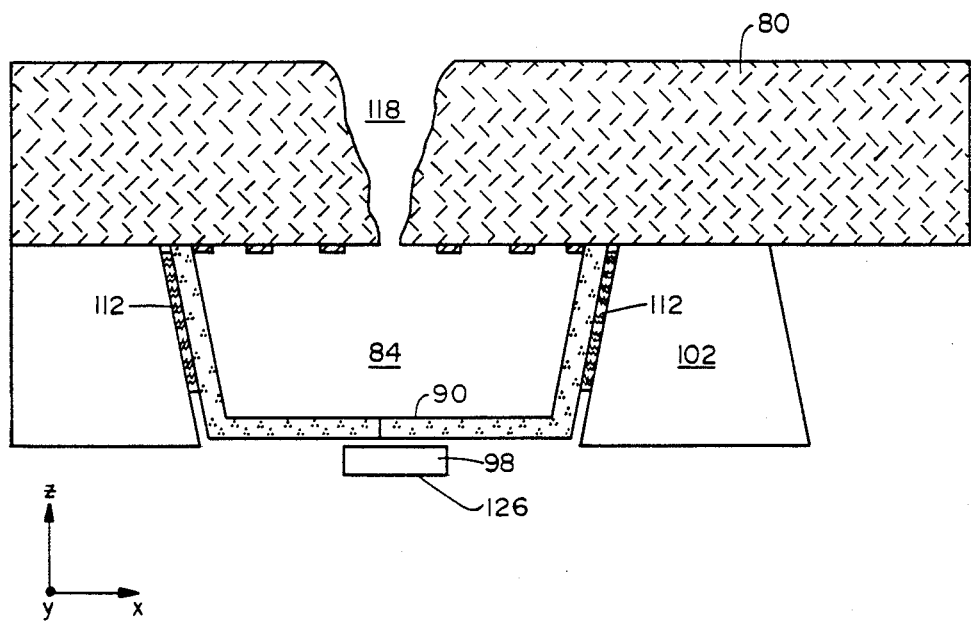

FIG. 27 shows the sandwich structure after part of the aluminum layer 112 is etched away. To arrive at the point in the process shown at FIG. 27, the oxide layer 122 is stripped away using a diluted solution of 6:1 HF. This stripping step may also remove part of the pyrex of the wafer 80, so this wafer may also be protected with photoresist if necessary. The strip step may also remove part of the aluminum layer 112, although a separate step is used for this procedure if the HF does not adequately remove enough of the aluminum.

It is necessary to remove the portions of the aluminum layer 112 which lie between the flexible wall 90 and the silicon block 98 to form a passageway between the silicon block 98 and the flexible wall 90. This passageway's cross sectional area may then be controlled by the flexure of the membrane 90. Removal of the aluminum under the membrane 90 also allows free flexure in the negative Z direction. This aluminum etch may be carried out with either standard aluminum etchant which will remove only the aluminum over the polyimide or with a mixture of $HCl:HNO_3:H_2O$ in the ratio 10:1:9 at 50° C. The latter mixture etches at a rate of 25-50 micrometers per minute. Care must be used to not overetch if the latter mixture is used. This leaves the structure as shown in FIG. 27.

Figures 28A, 28B:
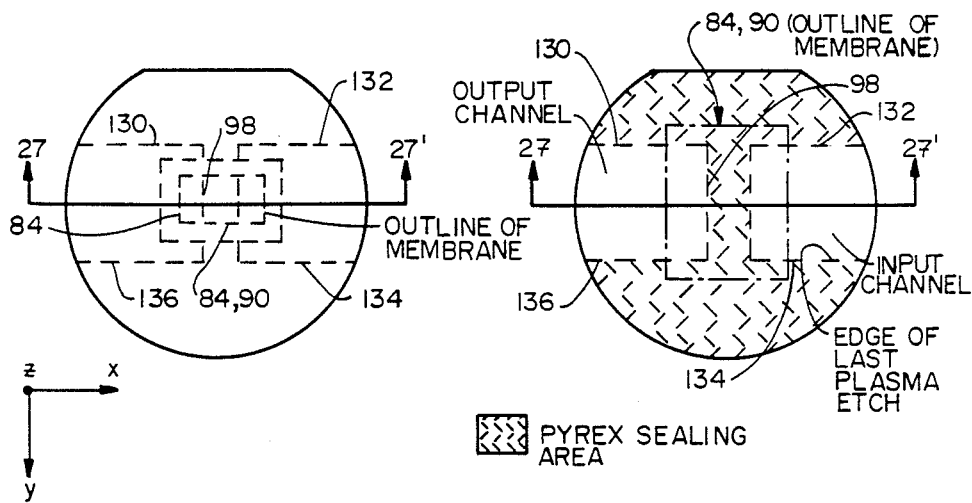
FIGS. 28A and 28B are plan views of two different configurations of the polyimide membrane valve of FIG. 15 showing alternative arrangements for the configuration of the membrane relative to the channel size.

Finally, referring again to FIG. 15, the second pyrex wafer 94 is anodically bonded to the silicon wafer 102 via the surface 126 of the silicon block 98. FIGS. 28A and 28B show a scaled down plan view of the structure of the final die configuration shown in FIG. 15 for different membrane sizes relative to the lateral extents of the channels. Although these figures show only one valve on a wafer, those skilled in the art will appreciate that approximately 100 valves may be formed on a single 3 inch wafer. Note how the silicon block 98 extends from one side of the channel wall 136, 134 to the other 130, 132. The passageway between the membrane 90 and the silicon block 98 only exists under the membrane cavity 84. Note that FIG. 28A shows the membrane being more narrow than the block 98 along the y axis while FIG. 28B shows the membrane being wider than the block 98. At other points along the silicon block 98, and along the walls of the channels 96, the silicon wafer 102 extends continuously all the way to the surface 126 of the block 98 thereby providing adequate mechanical support for the second pyrex wafer 94. The cross section of FIG. 27 is taken along the section line 27-27' in FIGS. 28A and 28B.

Referring again to FIG. 15, after the second pyrex wafer 94 is bonded to the structure, the membrane cavity 84 is filled up by immersing the sandwich structure in a boiling solution of the material to be used to fill the cavity. The laser drilled hole 118 is then sealed either with superglue or some other acceptable adhesive or by melting it shut with a solder after plating or sputtering a metal surface onto side A of the pyrex wafer 80 to provide a wettable surface. An alternative method of sealing the hole 118 is to bond another silicon or pyrex wafer to the pyrex wafer 80. Any suitable adhesive or polyimide may be used to do the bonding and sealing.

The wafer is then ready to be diced up and wire bonded. The wires to the resistive element 82 may be wire bonded using conductive epoxy if aluminum contact pads are used. Solder may be used if chromium/gold or titanium/tungsten-copper bonding pads are used.

Polyamide Membrane Embodiment #2

Referring to FIGS. 29 through 39 there is shown a process sequence for a second polyimide membrane embodiment in the form of a sequence of cross sectional views of the various wafers at different stages of the process. The first two steps are shown in FIG. 29. First a layer of silicon dioxide is grown on polished sides A and B of a silicon wafer 164. These layers are shown at 160 and 162. The oxide of layer 160 is then patterned as shown in FIG. 29, side A to form an etch mask.

Next in FIG. 30, an indentation 166 is etched into side A of the wafer 166 using oxide 160 as an etch mask. The width of the indentation 166 in the X direction is arbitrary, and the depth in the Z direction may be between 20 and 100 microns. The depth is not critical. Side A is then recovered with oxide as shown in FIG. 31, and repatterned as shown in FIG. 32 with an oxide implant mask 168 formed in the middle of the indentation area with exposed silicon on either side of it. The exposed silicon is then implanted or doped by diffusion to form the conductive area 170. Another layer of silicon dioxide 172 is grown or deposited on side A as shown in FIG. 33 and patterned as shown in FIG. 34. The remaining oxide layer after patterning is shown at 172. The oxide layer 172 will act as a spacer under a layer of polyimide layer to be formed later. In alternative embodiments, the spacer 172 is photoresist.

Next, the oxide is patterned on side B as shown in FIG. 34. This is done to transfer the alignment marks 174 and 176 to side B, and to form an opening 178 in the oxide layer 162 through which the nozzle hole may be etched for the fluid control channel.

A layer of aluminum or nickel 180 is then deposited to a thickness of 1.5 micrometers and patterned as shown in FIG. 35 to form a conductor in electrical contact with the diffused resistor 170 and a bonding pad at the edge of the wafer 164. After the conductor 180 is formed, a layer of polyimide is deposited and defined to have the position and size as shown at 182 in FIG. 36. After the polyimide is patterned, it is cured for 4 hours in a heat step which includes ramping the temperature up to 350° C. If the spacer 172 is photoresist, the cure should be performed in an inert atmosphere such as nitrogen or argon to prevent oxidation and vaporization of the spacer which would destroy the polyimide membrane.

Figure 37:
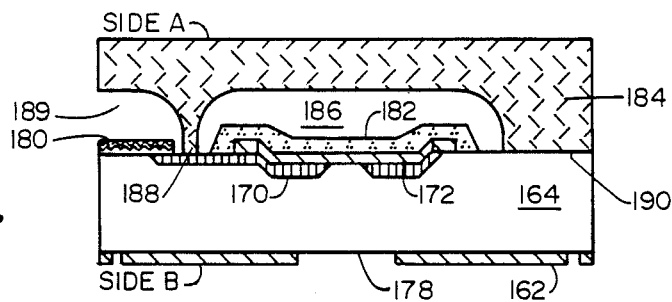

The next step is to etch a certain pattern in a pyrex wafer 184. This wafer 184 and the final configuration after etch is shown in FIG. 37. The etch mask (not shown) defines the positions of the membrane chamber 186, any fill ports to fill the chamber (not shown), and an opening 188 over the bonding pad. The etch is done using 6:1 Buffered Oxide etchant or straight HF (hydrofluoric acid) plasma etch or any other suitable etching system. The cavities are etched 40 micrometers deep.

After etching the pyre wafer 184, it is aligned with the silicon wafer 164 as shown in FIG. 37 and anodically bonded to the silicon wafer. The anodic bonding process forms a hermetic seal at 188 and 190 around the membrane chamber 186, and is performed by sandwiching the two wafers 184 and 164 together and coupling a 500 volt potential difference across the pyrex/silicon junction at a high temperature, say 300° C. The fluid or gas to be sealed in the membrane chamber 186 may be encapsulated during the anodic bonding process. In alternative embodiments, the membrane chamber 186 may be filled through a fill hole, and the fill hole may later be sealed by adhesive, solder or by bonding a flat plate hermetically over the fill hole.

Figure 38:
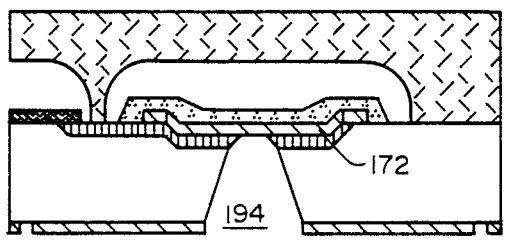

After the anodic bonding, the opening 178 in the side B oxide 162 is used as an etch mask for an etch step which forms the nozzle channel 194 shown in FIG. 38. This etch step is done using KOH or EDP or some other known liquid, anisotropic etchant.

Finally, the spacer oxide 172 is etched away by immersing the wafer in 6:1 Buffered Oxide etchant, straight HF or some other suitable etchant. The etchant acts through the nozzle channel 194 and eats away the spacer oxide thereby freeing the polyimide membrane 182 for flexure in either the positive or negative Z direction. An ultrasonic bath may promote etching. Other materials for the spacer 172 may also work such as aluminum, other metals etc. may work with different etchants that can selectively remove the spacer without attacking the polyimide or silicon around the spacer material.

Figure 39:
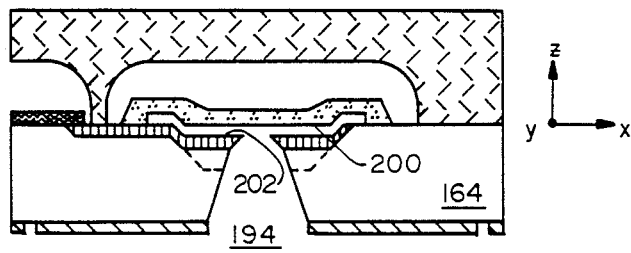

The final configuration of the valve is as shown at FIG. 39. An advantage of the embodiment shown in FIG. 39 is the wider fluid flow channel between the surface 200 of the membrane 182 and the surface 202 of the silicon wafer 164. This fluid flow channel may be made wider by applying overpressure to the nozzle channel 194. This causes the membrane 200 to flex in the positive Z direction thereby increasing the cross sectional area of the flow channel and allowing more volume to flow therein. Polyimide membranes are less brittle and may be flexed further than silicon without breaking. Other films could be used also as long as the film provides a good vapor barrier for the desired lifetime of the device. Some embodiments may use a coated polyimide membrane to improve its hermeticity. Gold sandwiched between two equal layers of polyimide works well for this purpose. The fatigue factor of the membrane must also be considered vis a vis the required lifetime of the device. That is, the membrane must not break easily after a large (or small) number of flexure cycles.

Another Polyimide Membrane Embodiment

FIGS. 40 through 48 show the process sequence for making another polyimide membrane embodiment having a corrugated membrane, i.e., one which has a step therein. The advantage of this type structure is that a greater range of flexure for the membrane without stretching the membrane itself is provided. That is the flexure involves unfolding action like that of an accordian bellows rather than stretching of the membrane material itself. Thus greater range of linearity is provided and greater flex may occur before the elastic limit is reached.

To make this embodiment a silicon wafer 210 has silicon dioxide film grown on sides A and B. The film on side A is patterned as shown in FIG. 40, and a trench 212 is etched into the wafer 210 with its perimeter defined by the oxide etch mask 214 as shown in FIG. 41. A layer of nitride 216 is then deposited and patterned as shown in FIG. 42. Another etch step is then performed to form the trench 218. This forms the two step trench as shown in FIG. 43.

The newly exposed silicon is then oxidized to form the layer of silicon dioxide 220 as shown in FIG. 44. A layer of polyimide 222 is then deposited and partially cured as shown in FIG. 45, and a layer of photoresist 224 is then deposited and patterned to cover the polyimide layer 222 as shown in FIG. 45. The polyimide layer is then patterned using Etchant III as the etchant and photoresist as the mask. The photoresist is then removed and the polyimide is cured.

Figure 47:
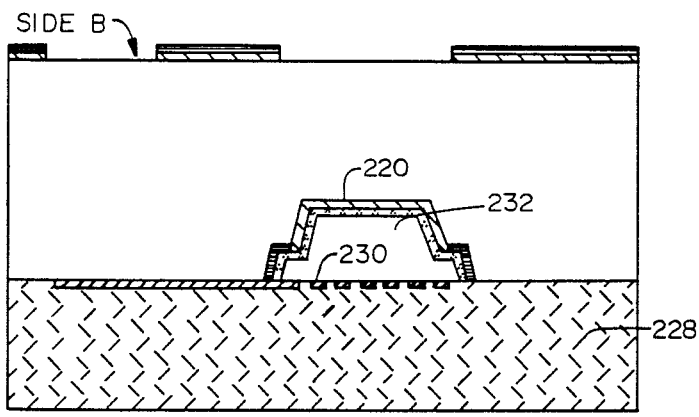
Figure 48:
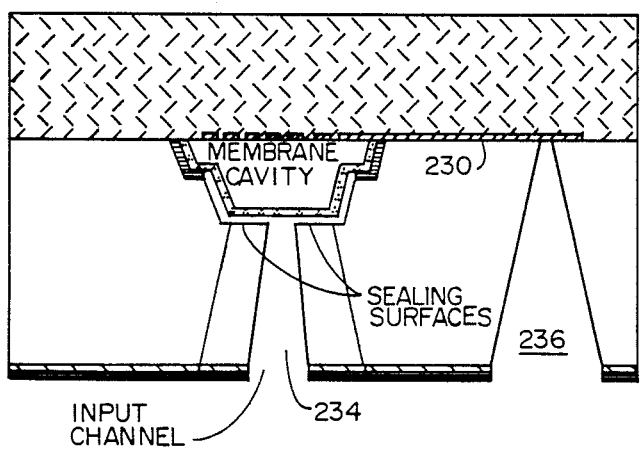

The side B oxide/nitride sandwich 226 is then etched as shown in FIG. 46 to form an etch mask for the nozzle fluid flow channel. A pyrex wafer 228, FIG. 47, then is covered with a layer of aluminum or other suitable material for the resistive heater, and the metal layer is patterned into a resistive heater 230 with a conductor running along the surface of the pyrex wafer 228 to a bonding pad on the edge of the pyrex wafer 228. The pyrex wafer 228 is then aligned with the silicon wafer 210 as shown in FIG. 47 and anodically bonded thereto to form the structure as shown in FIG. 47. The material to be used in the membrane cavity is trapped during the anodic bonding in the preferred embodiment or may be filled in later in any of the methods to be described below.

Finally, the oxide/nitride etch mask 226 is used to guide etching of a nozzle fluid flow channel 234 and a via 236 to the contact pad 230 for the resistive heating element. A selective etch of the oxide layer 220 is then performed through the nozzle fluid flow channel 234 to complete the structure.

Alternative Encapsulation Technique

The following encapsulation technique may be used with the process depicted in FIGS. 15 through 27 but may also be adapted to other embodiments as well. The method is best suited for encapsulating a liquid in a cavity bounded by two wafers one of which is silicon and the other of which is pyrex. Basically, the method entails forcing the liquid into the cavity by means of a vacuum/high pressure technique and then sealing the cavity by an electroplating method.

To use this method, the following modifications should be made to the process of FIGS. 15 through 27. For processing pyrex wafer #1 in FIG. 15, instead of depositing 0.7 microns of aluminum, 300 angstroms of titanium/tungsten is deposited followed by a 3000 angstrom layer of copper followed by a 300 angstrom thick layer of titanium/tungsten. The fourth mask and positive resist are then used to pattern the titanium/tungsten using $H_2O_2$ and then the copper into the heater element 82 using ferric chloride or dilute $HNO_3$ as the etchant. The titanium/tungsten layer is then patterned using $H_2O_2$. The step of drilling a laser hole at the center of each resistor pattern may be deleted as the method described herein deletes the need for this step.

Figure 49:
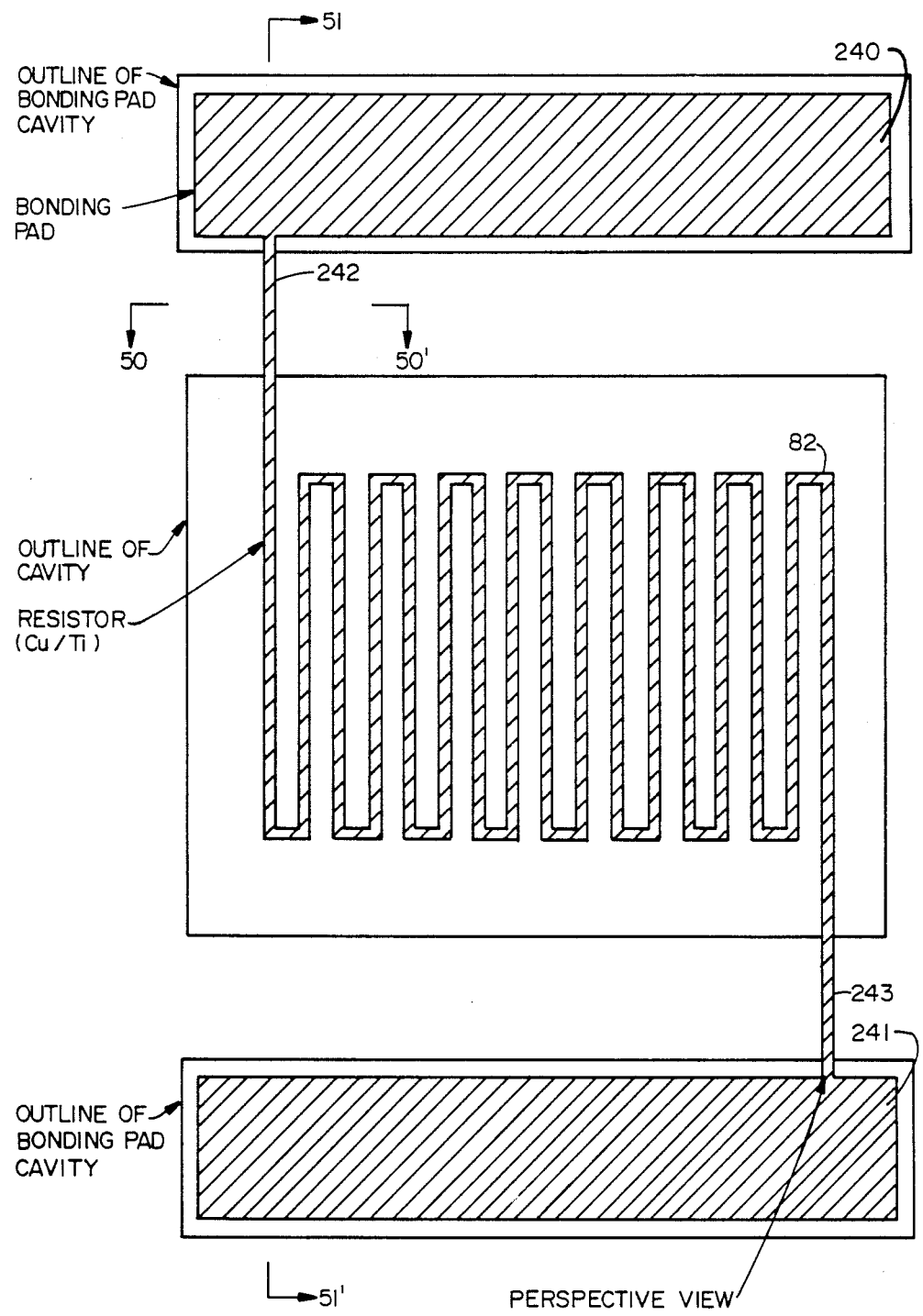
FIGS. 49 through 52 are process sequence drawings illustrating the process steps of the preferred form of encapsulation of material in any of the embodiments using electroplating on an etched resistor pattern on the wafer which seals the membrane cavity.
Figure 50:
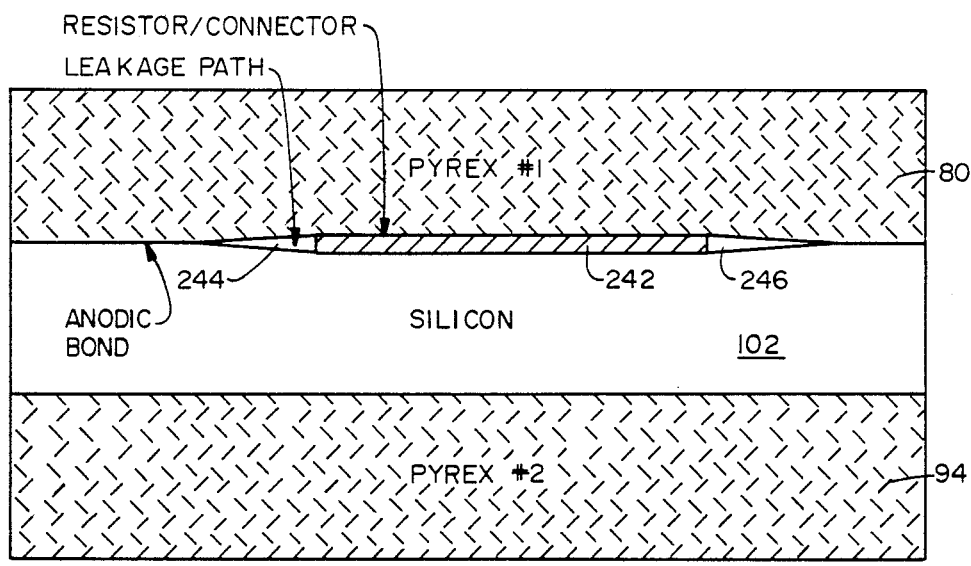
Figure 51:
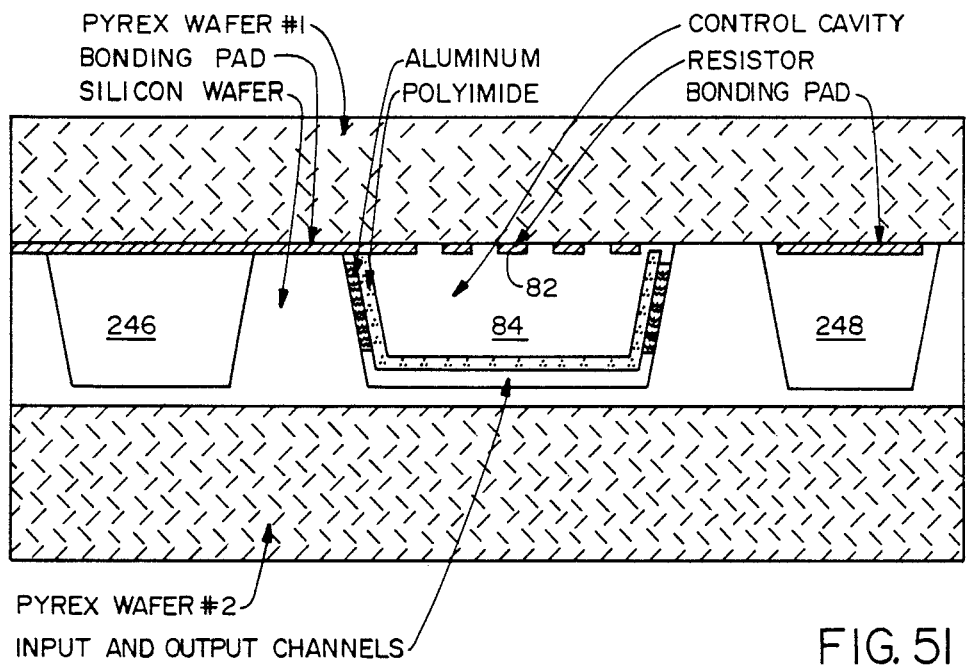

The step of anodically bonding the pyrex wafer 80 to the silicon wafer 102 to form a hermetic seal is replaced by anodically bonding the pyrex wafer 80 to the silicon wafer 102 across the conductor 242 to leave leakage paths to the membrane cavity along the sides of the conductors 242 and 243 in FIG. 49. Referring to FIG. 49 there is shown a plan view of the resistor element 82 and two bonding pads 240 and 241. A cross sectional view through the metal line 242 that leads from the resistor 82 to the bonding pad 240 is shown in FIG. 50. Note the gaps 244 and 246 on either side of the metal conductor 242 after the anodic bonding of the pyrex wafer 80 to the silicon wafer 102. These gaps prevent a hermetic seal of the membrane cavity 84 in FIG. 15 seen better in FIG. 51 which is a sectional view of the plan view of the sandwich structure of FIGS. 15 and 49 taken along the section line 51-51' in FIG. 49. Note the two cavities 246 and 248 that are etched in the silicon wafer 102. These cavities are not shown in FIG. 15, but may be formed at the same time that the membrane cavity etch is performed.

Figure 52:
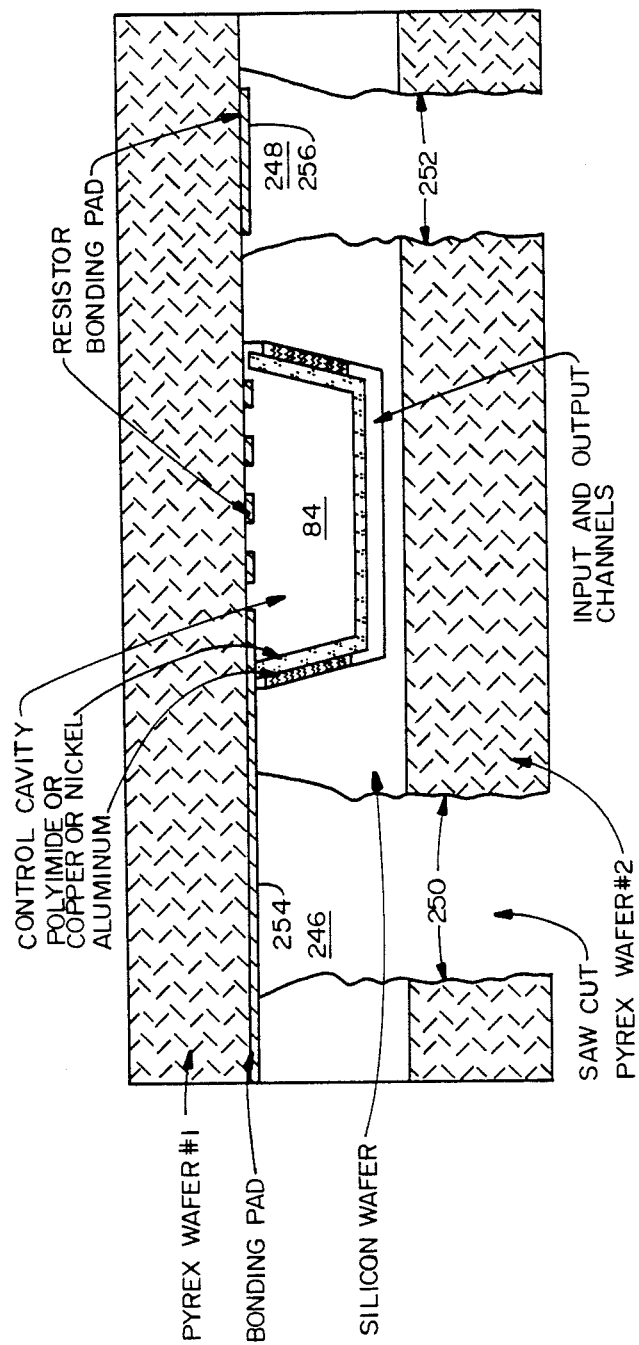

The steps of filling the membrane cavity 84 by immersing the wafer in a boiling solution and then sealing the fill hole 118 in FIG. 15 are deleted. Instead, the wafer is scribed using a standard wafer saw from side B. These scribes are as shown in FIG. 52 at 250 and 252. These scribes are located so as to intersect the cavities 246 and 248 previously etched in the silicon wafer 102 at the positions of the bonding pads for the resistive element 82. This exposes the bonding pads so that electrical connections to the resistive element may be made.

Next, the wafer sandwich structure is placed in a vacuum chamber and the chamber is evacuated to evacuate the cavities in the sandwich structure. Then the chamber is filled with the desired liquid which then begins to fill the membrane chamber 84 through the leakage paths. The fill rate is slow because the cross sectional area of the leakage paths is small. To increase the fill rate, the chamber is pressurized to 60 p.s.i. in the preferred embodiment, although this step may be omitted in alternative embodiments. The wafer structure is then left in the cavity until the membrane chamber 84 is completely filled. The chamber is then vented, and the wafer structure is removed.

Finally, the bonding pads 254 and 256 are plated with a 25 micrometer layer of copper by immersing the wafer structure in a bath of "high throw" copper sulfate or other plating solution after connecting the bonding pads as cathodes in the electroplating cell thus formed. The plating solution will not leak into the membrane cavity because of the high resistance to fluid flow that the leakage path presents. In some embodiments, the liquid in the cavity may be made immiscible with the electroplating solution so no mixing can occur. The plating solution will enter the leakage path somewhat however and will cause plating in the leakage path. This plating will clog up the leakage path thereby forming a hermetic seal. The wafer can then be diced up to separate the individual valves.

Other methods of sealing a fixed volume of material in the membrane chamber 84 are as follows. A solid may be encapsulated at ambient pressure using anodic bonding of the pyrex wafer to the silicon wafer to seal in the solid. Later, the solid is dissociated into a gaseous species using electro-assisted diffusion to create a gas in the chamber. Sodium acetate may be used for the solid.

A liquid may be encapsulated if the liquid has a high boiling point. Glycerol, with a melting point of 300° C., is a good liquid to use during the anodic bonding process.

A liquid and/or gas may be encapsulated at high pressure. The anodic bonding is done in a sealed chamber where the pressure and temperature may be controlled. This allows the material to remain liquid at high temperatures. For example, the anodic bonding could be done at high pressure such as 21 atmospheres. This would prevent the escape of the liquid from either the cavity or the chamber during the process.

A second general approach to filling the membrane cavity is to use a filling hole. Before, after or while the membrane cavity is formed, a hole connecting the membrane cavity to the external world is formed. The membrane cavity is then filled using vacuum techniques, and the hole is sealed in some known manner. For example, if the hole is perpendicular to the pyrex plate, it can be sealed by gluing a plate flat against the pyrex using some adhesive such as epoxy. This method has the advantage of low cure temperature for the adhesive and ease of use. One problem with this method can be the difficulty of obtaining a hermetic seal.

Another method is to use solder alloys to seal the fill hole. The fill hole may either be directly plugged up with a drop of metal, or a plate can be soldered over the hole if a solder wettable surface has been formed on the pyrex wafer in the vicinity of the fill hole. During this process, the ambient pressure should be kept the same as the pressure in the cavity. This prevents any pressure differential from building up which can cause the fluid in the cavity to escape during the soft stages of the solder alloy in the fill hole. A sealed chamber with a controlled pressure is used in the preferred embodiment.

Finally, glass remelting can be used to fill the fill hole. In this process, the fill hole in the pyrex wafer is made by laser drilling. A laser may then be used to remelt the pyrex around the hole after the fluid has been placed in the membrane cavity. This method has been demonstrated, but is not preferred. It is important to start with the glass at a low temperature to enhance the heat conduction away from the glass.

A Solid State Heat Pump Embodiment

Figure 53:
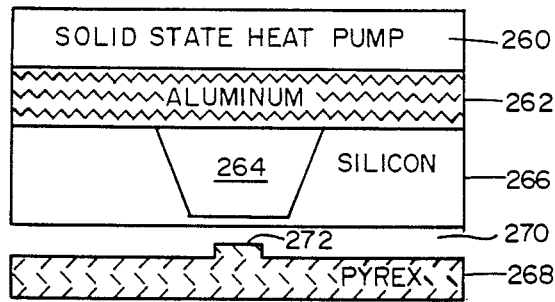
FIG. 53 is a cross sectional view of a solid state heat pump valve embodiment.

FIG. 53 shows an alternative embodiment using solid state heat pump technology. A heat pump 260 such as a Peltier solid state heat pump available commercially from several manufacturers. The heat pump 260 could also be a conventional heat pump. The heat pump 260 is thermally bonded to a heat conductive block 262 which serves as a seal for a membrane cavity 264 in a wafer 266. The purpose of the block 262 is to provide a hermetic seal for the membrane cavity 264 and to rapidly conduct heat into and out of the membrane cavity 264. The membrane cavity 264 may be formed in any of the processes disclosed above, and the wafer 266 need not be silicon as shown. Likewise, the block 262 may some other good heat conductor other than aluminum. The valve portion of the structure is formed by the block 268 which has a fluid passageway 270 and a sealing surface 272 formed therein. Operation of the valve is the same as described above for the other embodiments.

Positional Actuation Embodiment

In alternative embodiments, the position of the membrane may be used as the desired end product of temperature changes in the trapped material in the membrane chamber. Such embodiments may be used for micropositioning applications, tactile feedback transducers in teleoperative robotics and other such applications.

Figure 54:
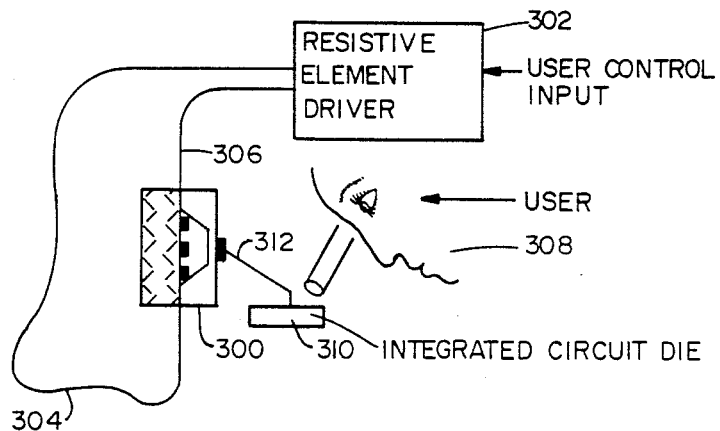
FIG. 54 is a view of a micropositioning embodiment of the invention where the excursion of the membrane is used to position an object.

In a silicon membrane embodiment with a 2 millimeter diameter, the full scale excursion of the membrane is approximately 35 microns. In polyimide membrane applications, the full excursion of the membrane is approximately 400 microns. By attaching the membrane to the object to be moved, for example, an integrated circuit probe, the object may be moved in accordance with the temperature in the membrane cavity. Such an embodiment is shown in FIG. 54. The embodiment shown in FIG. 54 is typical only of one class of applications. However, it illustrates the general idea of the micropositioning applications. In FIG. 54, the micropositioning transducer 300 is comprised of a wafer having the membrane cavity formed therein with a heating element hermetically sealed in the membrane cavity along with the material which changes the vapor pressure in the cavity when the temperature in the cavity is changed. A resistive element driver 302 receives control inputs from the user, and converts them into control signals on the wires 304 and 306 that cause the heating element to change the temperature in the cavity. Of course any of the other methods of controlling the temperature in the cavity described herein may also be used, and those skilled in the art will appreciate the type of user interface necessary to convert the user control inputs into the proper control signals to control the temperature in the cavity. The user 308 provides the control inputs by looking through an image magnification system at the workpiece 310 and noting the position of a probe 312 relative to the desired position of same. The user can then adjust the position of the probe, which is mechanically coupled to the membrane of the transducer, by changing the temperature in the membrane cavity. A large force may be imposed upon the object using this embodiment.

If movements larger than the maximum excursion of the membrane are desired, the transducers may be cascaded one atop the other. In such an embodiment, the movement of the membrane of the bottom transducer in the stack moves all the transducers in the stack above it. Likewise, the movement of the membrane in the second lowest transducer moves the transducers above it in the stack. This process is repeated for all the transducers, with the total membrane displacement being the sum of the membrane displacements of all the transducers in the stack.

A Tactile Feedback Embodiment

Figure 55:
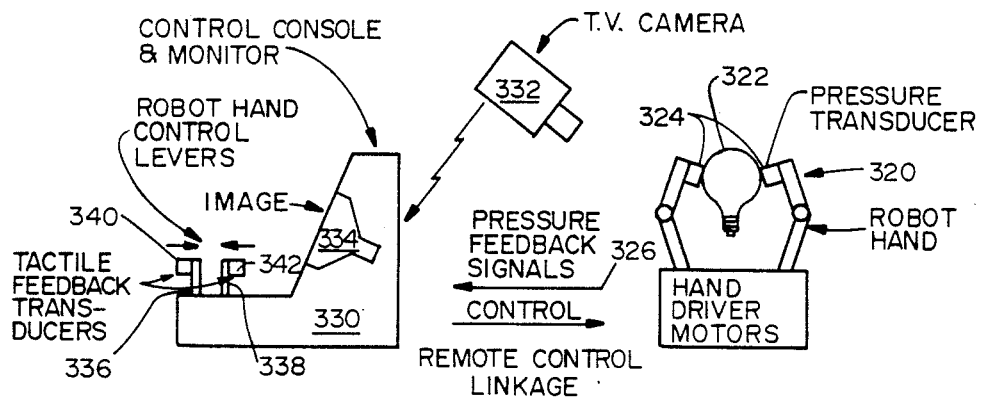
FIG. 55 is a diagram of a robotic embodiment using tactile feedback.
Figure 56:
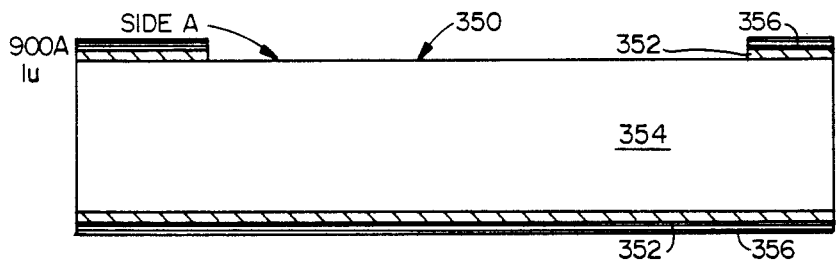
FIGS. 56 through 64 are cross sectional views through the structure of the tactile feedback transducer at various stages in the process of manufacture.

The devices taught herein according to the teachings of the invention may also be used in an embodiment to provide tactile feedback to an operator. Such an application may involve teleoperation of a robot, i.e., operation of robot hands by remote control using television cameras etc. A problem in controlling robots remotely is the lack of the sense of touch to indicate to the controlling party the amount of pressure the robot hand is placing on the object being gripped. The invention may be used to supply this missing sense in the manner shown in FIG. 55. There a robot hand 320 grips a light bulb or other object 322. The tip of each "finger" on the robot hand (or at least opposing digits) has a an array of pressure transducers 324 attached. These pressure transducers send pressure signals back via remote control channel 326 to a control console 330 remotely located. A television camera or other imaging system 332 takes a picture of the scene and sends the video information back to the control console 330 for display on a television screen 334. The control console also has a mechanism for allowing the user to receive tactile feedback. In the particular embodiment shown, the means for controlling the robot hand is shown as a pair of levers 336 and 338. These may be moved closer together or farther apart, and cause the fingers of the robot hand to move closer together or farther apart according to the relative positions of the levers. Each lever has an array of tactile feedback transducers, 340 and 342, which the user's fingertips contact when the user assumes control of the levers 336 and 338. The tactile feedback transducers are attached so that the membrane contacts the user's fingertips. They are coupled to the pressure feedback signals in such a way that when the pressure exerted on the robot fingers on the hand 320 increases, the temperature inside the membrane cavity increases such that the membrane moves outward against the user's fingertip in proportion to the magnitude of the pressure feedback signal.

In other embodiments, the levers 336 and 342 may be replaced by a glove where the fingers of the glove are coupled to position transducers which generate signals used to control the positions and actions of the fingers. The fingertips of the gloves on the inside are attached to arrays of tactile feedback transducers which are coupled to the pressure feedback signals. The operation of the tactile feedback transducers is as described above with reference to the levers 336 and 338 in pushing on the user's fingertips to give the user similar sensations of pressure as would be felt if the user were picking up the object with his own fingertips.

The process for making the tactile feedback transducer is depicted in FIGS. 56 through 64. The following is the process for a silicon wafer, but those skilled in the art will appreciate that other wafers or other materials could also be used.

Figure 57:
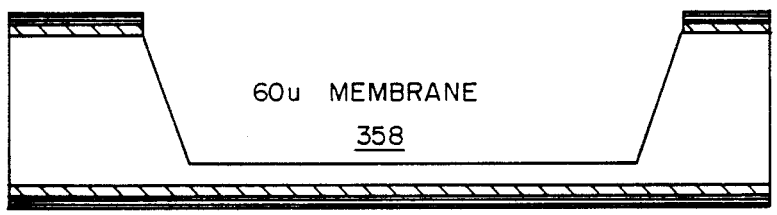
Figure 58:
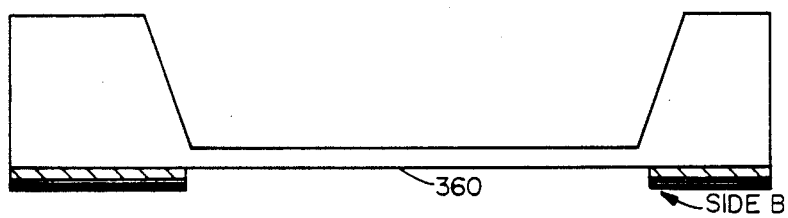
Figure 59:
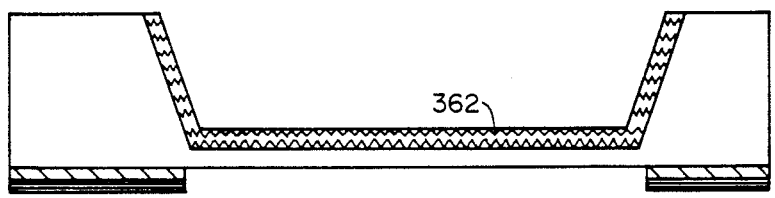
Figure 60:
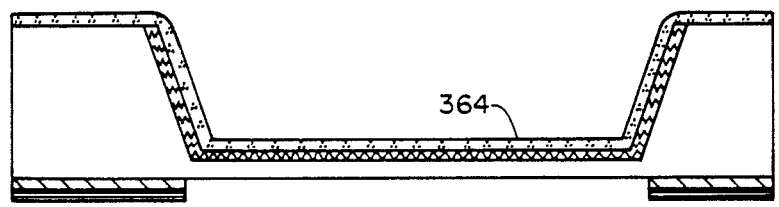

1. Grow 5000 angstroms of oxide 352 on a silicon wafer 354 with one or two sides polished.
2. Deposit on both sides of the wafer 900 angstroms of $Si_3N_4$ 356 using low pressure chemical vapor deposition at 700° C.
3. Pattern the non-polished side, or side A with mask 1 to define the cavity and membrane as seen at 350 in FIG. 56.
4. Etch a cavity 358 to a depth of 350 micrometers using KOH. This depth can be varied, and will depend upon the desired height of the inflated actuator. The structure after the etch is as shown in FIG. 57.
5. Transfer the alignment marks to the backside of the wafer, and define the cavity pattern 360 in the nitride/oxide layer on side B with mask 1. The structure will then be as shown in FIG. 58.
6. Deposit a spacer metal 362 in the cavities etched into side A. Using mask 1, pattern the metal so that there is metal only in the cavities. The polyimide to be deposited next will adhere to this spacer metal while being formed and cured. Later the spacer will be dissolved to free the polyimide membrane from the silicon. After completion of this step the structure will look as shown in FIG. 59.
7. Spin on 10 micrometers of polyimide 364 to side A. Use repeated applications as necessary. After completion of this step, the structure will look as shown in FIG. 60.
8. Cure the polyimide in a four hour sequence that includes a ramp up to 350° C. Any process that cures the polyimide so as to have the requisite resiliency and strength will suffice.

Figure 61:
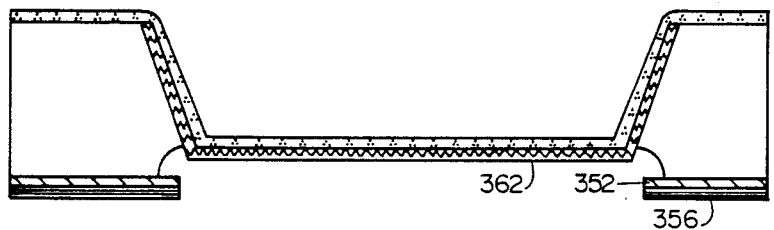

9. Etch away the silicon membrane at 360 using an isotropic etchant. Use, for example, HF, HNO₃, CH₃COOH or reactive ion etching. After this etch, the structure will look as shown in FIG. 61.

Figure 62:
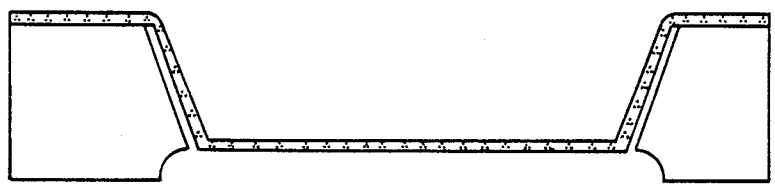

10. Strip the nitride 356 from side B and strip the oxide 352 from side B. Then strip the metal layer 362 from side B to leave the structure as shown in FIG. 62.

11. Deposit 1 micrometer of aluminum or chromium/gold on a pyrex wafer 366.

12. Using mask 6, pattern the heater element 368 on the surface of the pyrex wafer by etching the metal layer with a suitable etchant.

13. Form a hole 370 in the pyrex wafer as by laser drilling.

Figure 63:
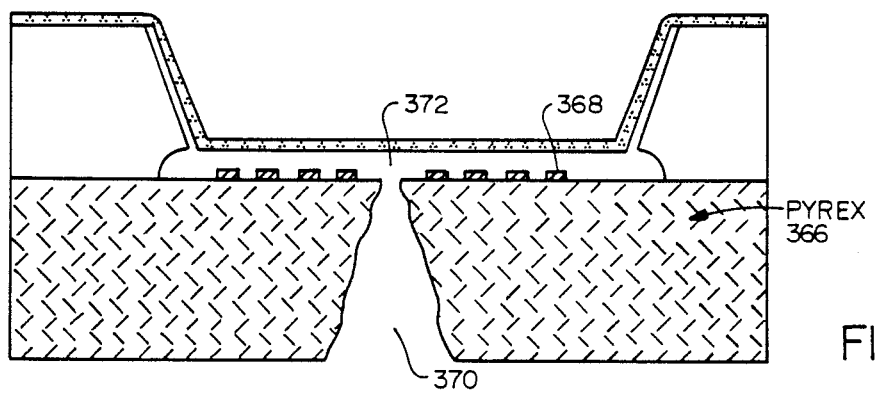

14. Next, the pyrex wafer 366 is anodically bonded to the silicon wafer 354 to leave the structure as shown in FIG. 63 with a membrane cavity at 372.

15. The membrane cavity 372 is then filled up by immersing the wafer in a boiling solution of the material to be trapped in the cavity.

Figure 64:
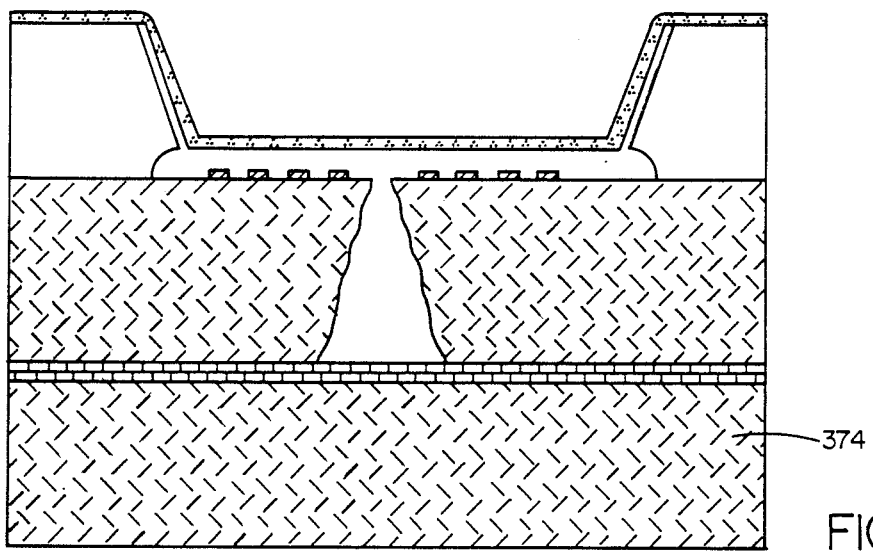

16. The cavity 372 is then sealed by either gluing the hole 370 shut with super glue, melting it shut with solder after metallizing the inside surface of the hole 370 or by bonding another wafer 374 onto the pyrex wafer 366 as shown in FIG. 64.

17. Bond on the wires to make electrical contact with the resistive heating element.

Figure 65:
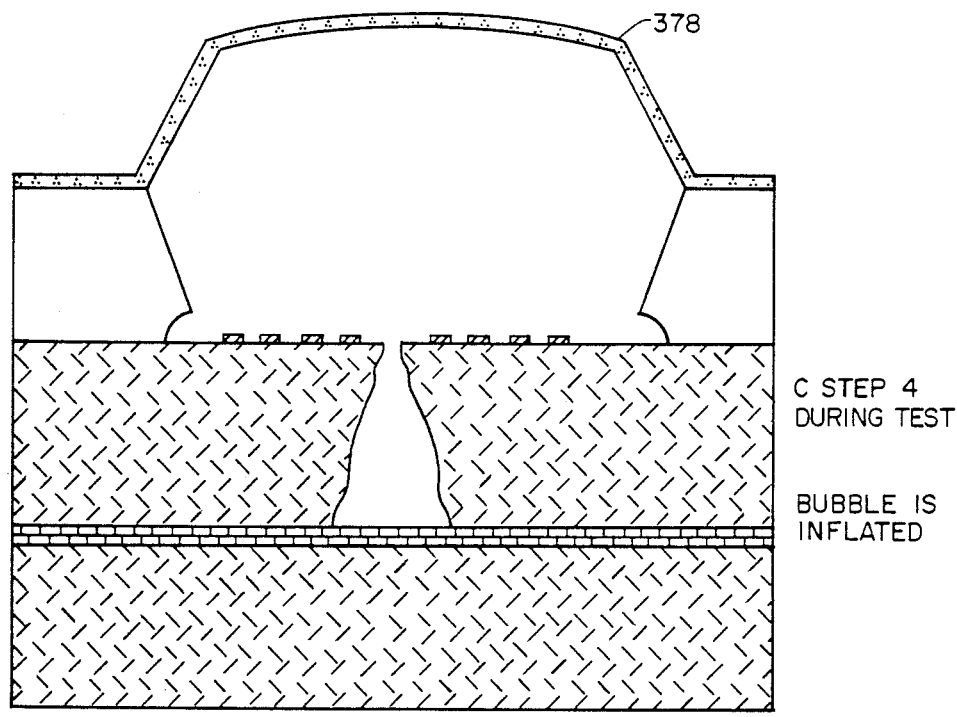
FIG. 65 is a cross sectional view of the tactile transducer in the finished state with the bubble inflated.

FIG. 65 shows the tactile actuator in the expanded mode where the temperature in the cavity 372 has been raised by the heating element sufficiently to raise the vapor pressure enough to expand the membrane 378.

Figure 66:
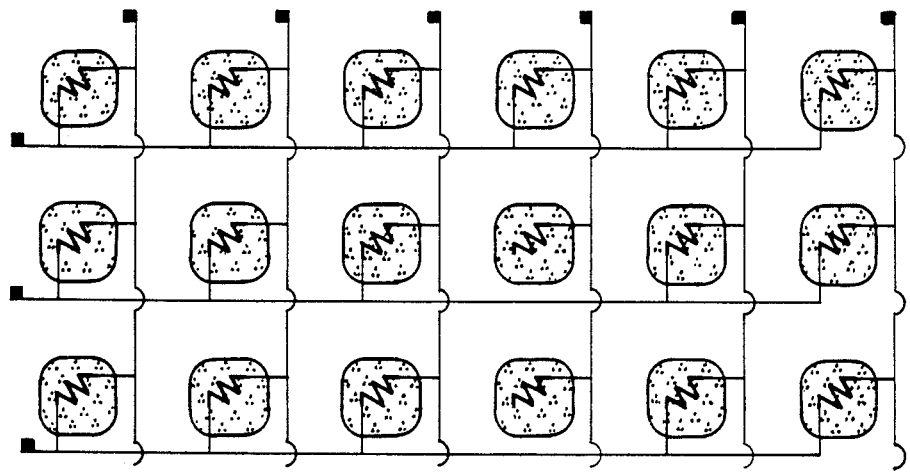
FIG. 66 is a diagram of the row and column addressing system of an array of tactile transducers.
Figure 67:
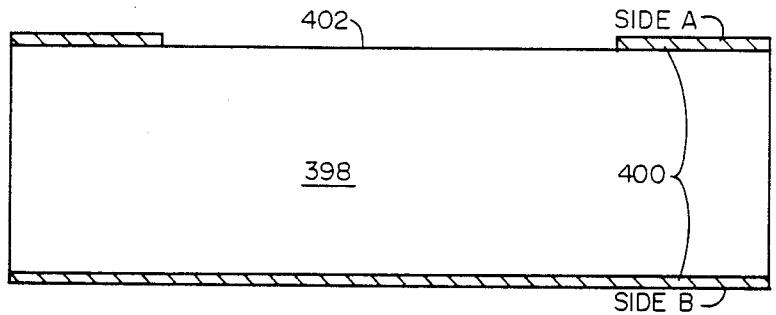
FIGS. 67 through 77 are cross sectional drawings of the structure of a second embodiment of a tactile actuator at various stages in the process of its manufacture.

FIG. 66 shows an arrangement of the tactile actuators in an array with a row and column addressing system such as would be useful in the robotic applications mentioned above.

Another process of forming a tactile actuator is shown in FIGS. 67-77. The process is as follows.

Grow 5000 angstroms of oxide on a silicon or other semiconductor wafer 398 having two polished sides;

Deposit 900 angstroms of nitride using low pressure chemical vapor deposition at 700° C. The combined oxide and nitride are shown generally as a single layer 400 on sides A and B;

Pattern side A of the wafer with mask 1 and a positive resist. This pattern will define the cavity at the location generally indicated at 402.

Figure 68:
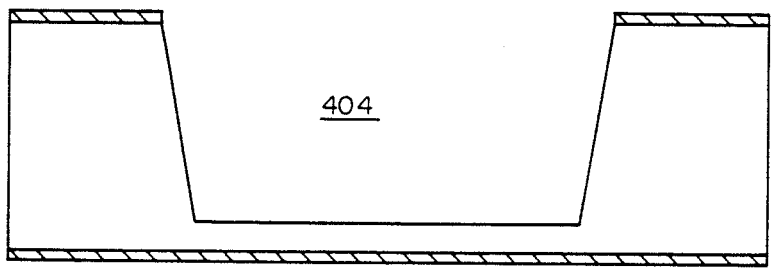
Figure 69:
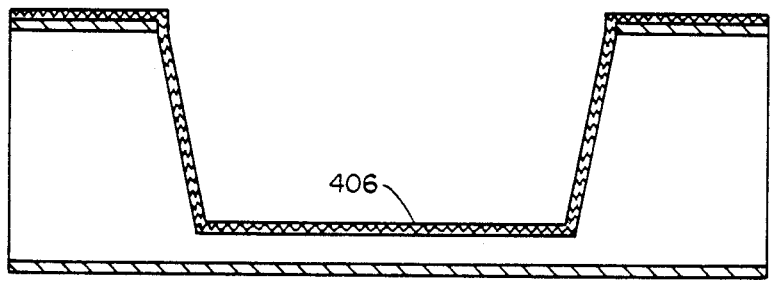
Figure 70:
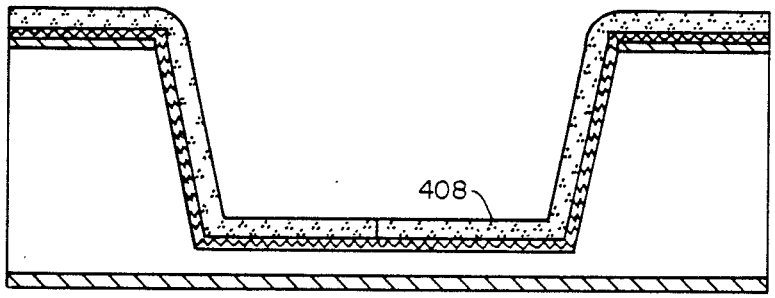

Etch a cavity 404 into side A of the wafer to a depth of 350 micrometers using KOH. The depth of the cavity 404 may be varied to the desired depth based upon yield considerations;

Etch the exposed nitride off sides A and B using plasma or other etchant to leave the structure as shown in FIG. 68;

Deposit a spacer metal 406 over side A of the wafer including the cavity walls of the cavity 404 to leave the structure as shown in FIG. 69.

Figure 71:
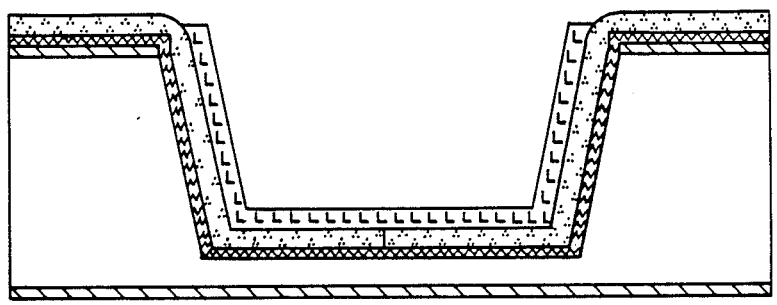
Figure 72:
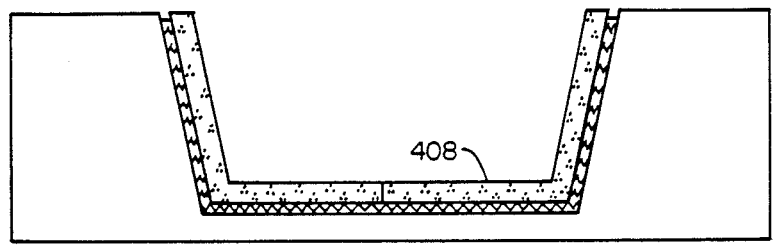
Figure 73:
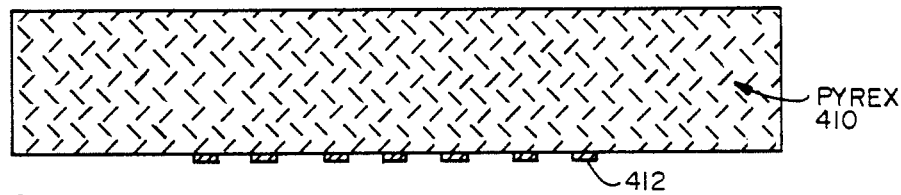
Figure 74:
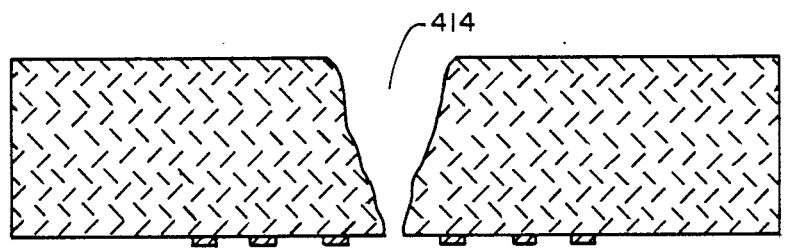
Figure 75:
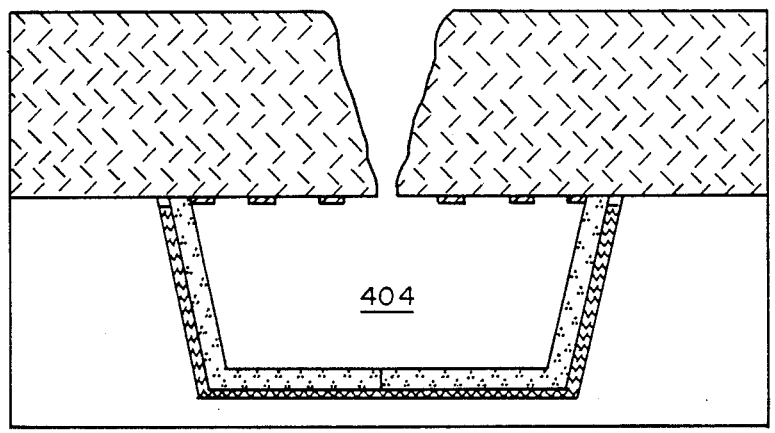
Figure 76:
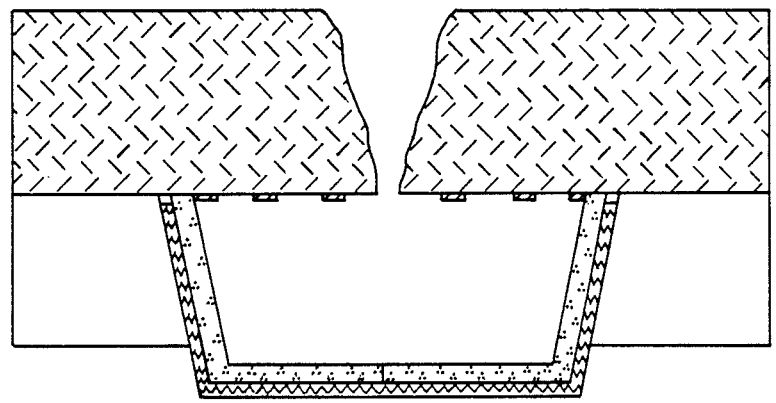
Figure 77:
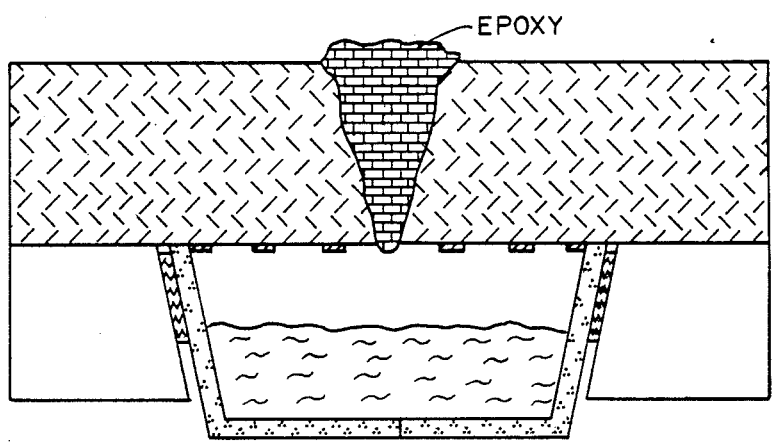

Spin on a 10 micrometer layer of polyimide 408 with repeated applications if necessary and bake for 1 hour at 90° C. between each application so as to cover side A;

film 408 by baking at 130° C. for 2.5 hours;

Deposit negative resist, and bake at 90° C., then expose using mask 1 and develop and set the remaining resist by baking at 120° C. for a sufficient time to leave a mask as shown in FIG. 71;

Etch the polyimide film 408 using Etchant III at 35° C. for 15 to 30 minutes;

Partially cure the polyimide film by baking for 1 hour at 220° C.;

Etch away the exposed aluminum using Aluminum Etchant I;

Etch away the exposed oxide using 6:1 HF to leave the structure as shown in FIG. 72;

Strip off the negative resist using J100 and clean the structure with TCE, acetone and methanol;

Cure the polyimide for 1 hour at 350° C.;

Next, on a pyrex wafer 410 deposit 3500 angstroms of aluminum, chromium/gold or titanium/tungsten-copper-titanium/tungsten. The particular metal used depends upon the method of sealing the liquid in the membrane chamber to be used. Any of the methods described herein may be used for this sealing process;

Using mask 3, pattern a resistive heating element 412 in the metal layer to leave the structure as shown in FIG. 73;

Form a hole 414 in the pyrex wafer at the center of the resistive heater pattern such as by laser drilling to leave the structure as shown in FIG. 74;

Anodically bond the silicon wafer to the pyrex wafer with the resistive heating pattern and the hole in the pyrex wafer encapsulated by the cavity 404 to seal the polyimide membrane in the cavity. Any of the other methods of bonding the pyrex wafer to the semiconductor wafer may also be used as described elsewhere herein;

Etch 10 micrometers side B of the semiconductor wafer past the aluminum layer with HNA (HCl:HNO₃:CH₃COOH 10:1:9 etches at 25 to 50 micrometers per minute). A plasma etch may also be used. This leaves the structure as shown in FIG. 76;

Etch the spacer metal 406 with either the aluminum etchant (this removes only the metal over the membrane) or with HNA. If the etching is done with HNA, take care not to overetch. Otherwise use an additional mask and a KOH etch. This leaves the structure as shown in FIG. 77;

Fill the membrane cavity 404 by immersing the structure in a boiling solution of the material to be trapped in the cavity;

Seal the hole 414 by either gluing it shut with Super Glue or melting it shut with solder after metallizing the walls of the hole 414 or by any other known method such as by anodically bonding another wafer over the hole in the pyrex wafer using polyimide or photoresist as an "0" sealing ring around the hole. An electroplating method is also possible. Glue is shown in FIG. 77. Bond wires onto bonding pads connected to the resistive heating element using solder or conductive epoxy or any other known method of wire attachment which is compatible with the type of metal film used for the bonding pads.

This completes the structure. Use of the device is as described herein for the other embodiments disclosed.

Both the above described tactile actuators may be manufactured with any of the other means mentioned herein of changing the temperature of the material trapped in the membrane cavity. Also any method of sealing the cavity and the hole for fluid access to the cavity may be used which is compatible with the other choices made for fabrication of the tactile actuator.

Also the row and column addressing scheme for the array of tactile actuators may be implemented by a two level metallization scheme. Such multiple level metallization schemes are known in the art of semiconductor manufacture.

Finally, the laser drilled hole for fluid access to the membrane cavity is not the only method of filling the cavity. Any of the methods described elsewhere herein for providing fluid access to the cavity and sealing it would also suffice.

A Variable Focus Lens

Figure 78:
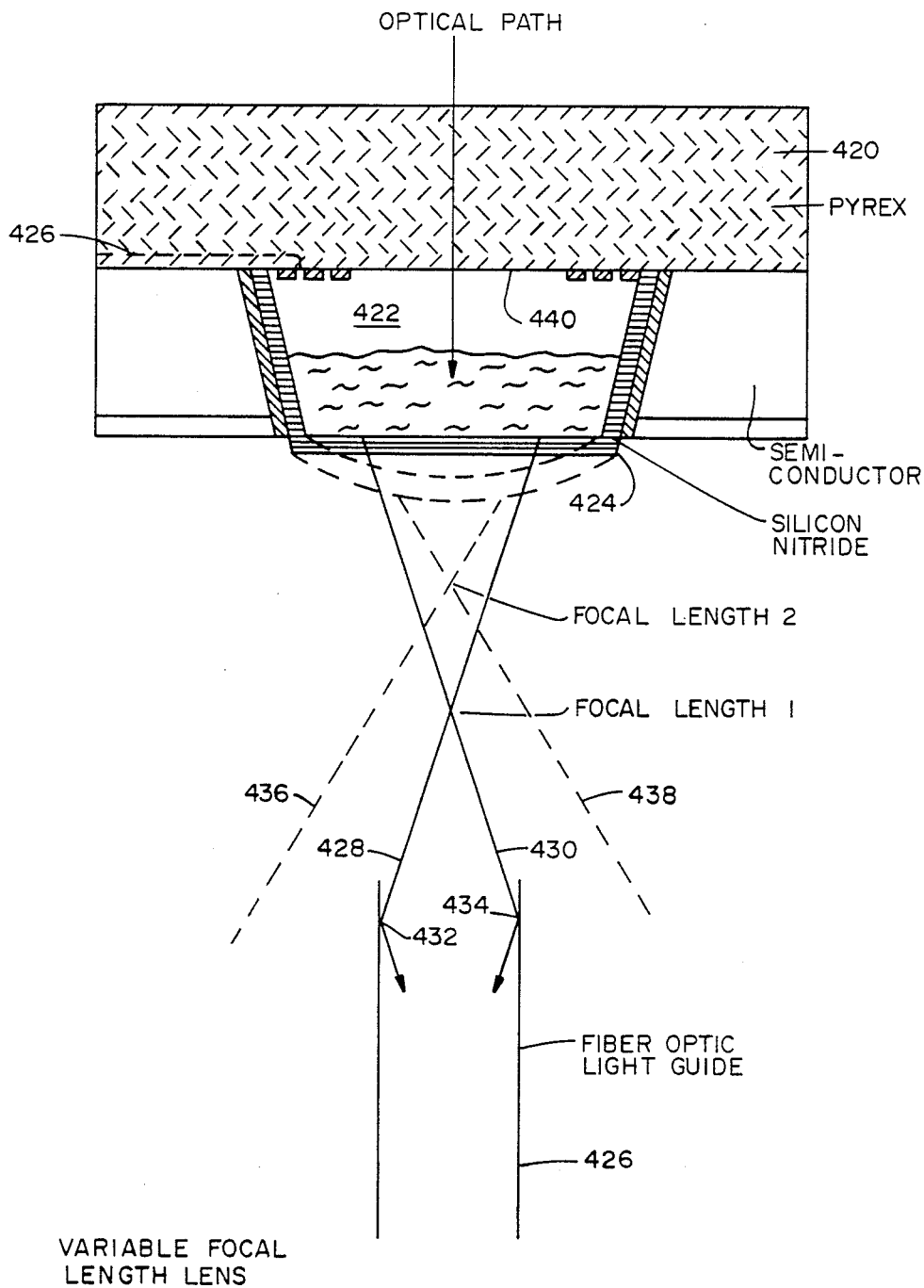
FIG. 78 is a cross sectional diagram of a variable focal length lens.

Referring to FIG. 78 there is shown a cross sectional diagram of a variable focal length lens. In this embodiment of the invention, the pyrex wafer 420 has the resistive heater pattern spaced off to one side so as to not be in the optical path. The optical path passes through the pyrex wafer 420 and through the material trapped in the membrane cavity 422 (the material should be capable of transmitting light obviously) and then through the membrane 424. The membrane 424 is made of silicon nitride in the embodiment of FIG. 78, however, any other transparent or translucent material will also work. Of course the light transmission efficiency of the membrane must be adequate for the purpose. The pyrex, the material trapped in the membrane cavity 422 and the material of the membrane 424 all have indices of refraction and cause various degrees of bending at the interface with materials having different indices of refraction. Thus, each material causes some bending. The focal length of the lens may be changed by changing the curvature of the lens in the form of changing the curvature of the silicon nitride membrane 424 by raising or lowering the temperature of the material trapped in the membrane cavity 422. In FIG. 78, two different focal lengths for the lens are shown. The first focal length in solid line rays represents the focal length when the membrane 424 is in the shape shown in solid lines. The second focal length, shown with the dotted line ray diagram, represents the focal length which results from the shape of the membrane shown in dotted lines in FIG. 78.

The lens of FIG. 78 may be made with the processed described herein except that the means for heating the cavity must not be placed in the optical path and the fluid communication path into the cavity, represented by the dotted line 426, should also not interfere with the optical path. Also, silicon nitride or some other transparent material must be substituted for the membrane. A silicon nitride film 1.5 micrometers thick would be acceptable for many applications.

The variable focal length lens may also be used as a modulator for light injection into a light guide. In FIG. 78 a fiber optic light guide 426 is shown positioned along the axis of the light path. Fiber optic light guides have acceptance angles for incoming light to be captured. That is, unless a light ray enters the fiber end within the acceptance angle, the angle the ray makes with the fiber cladding will exceed the critical angle of the fiber, and the ray will not be refracted back into the fiber core. Such a ray will pass through the cladding, thereby destroying the light guide's ability to guide that ray. Two light rays 428 and 430 are shown as entering the fiber within the critical angle (not shown) and are shown as being refracted back into the fiber core at the core/cladding interface at 432 and 434, respectively.

Two rays 436 and 438, shown in dotted lines, are shown as not being captured by the fiber because they are not within the critical angle of the fiber. These rays 436 and 438 have the angles they have because of the action of the variable focal length lens in changing the angle of refraction of the rays as they pass through the lens. Even with the lens in the configuration shown in dotted lines, some light rays may be refracted at an angle within the acceptance angle of the fiber optic light guide. A fraction of the light will therefore enter the fiber and be captured. At some focal lengths, it is possible that no light ray will have an angle within the acceptance angle of the fiber. Thus, the variable focal length lens may be used to modulate the amount of light that enters the fiber optic light guide simply by altering the temperature of the material trapped in the membrane cavity 422. Such a device has utility in fiber optic communication networks and optical computers.

The lens of FIG. 78 may be used alone or in an array. An array of such lens could be used in a parallel processing application where the lens could be used to implement a programmable optical filter.

Another application of the structure of FIG. 78 is as a sensor. The pressure of the material in the cavity, which is a function of the outside temperature, would control the amount of light entering a fiber optic light guide. This application could act as either a pressure sensor capable of withstanding high temperatures or as a temperature sensor. Use of the structure as a temperature sensor would require knowledge of the ambient pressure and the pressure/temperature characteristics of the entrapped material.

Another equivalent structure for the sensor would be for the light to enter through the membrane, be reflected off the surface 440 of the pyrex wafer, which would be coated with a reflective metallic coating, and to pass back out through the membrane. The structure acts as a double convex lens in such a configuration. As the temperature rises, the focal length decreases as the pressure in the cavity rises, and the lens becomes more convex. The change in focal length would change the amount of light coupled into the fiber, and this change could be measured as a change in magnitude of an output signal from a light sensor.

The change in focal length could also be sensed in other ways such as by using different frequencies of light with different indices of refraction and by using interferometric methods.

Eutectic Bonding of Semiconductor Wafers of Different Types

It is possible to use a variant of the silicon wafer to silicon wafer eutectic bonding process described above to bond wafers of one semiconductor type to wafers of other semiconductor types. For example silicon wafers having good signal processing circuit forming properties may be bonded to germanium wafers having good optoelectronic properties to create novel sensors or to act as fiber optic to electronic circuit interfaces. Further, silicon based circuits could be integrated with gallium arsenide based circuits or gallium arsenide based semiconductor lasers.

Figure 79:
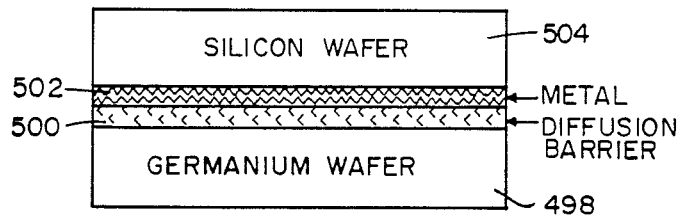
FIGS. 79 and 80 are cross sectional diagrams of eutectic bonds between silicon wafers and wafers of another type of semiconductor.
Figure 80:
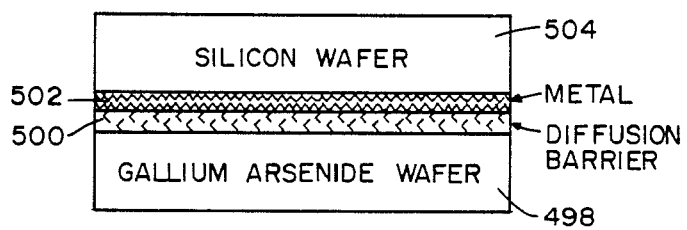

The eutectic bonding process will be explained with reference to FIGS. 79 and 80 which illustrate two different final structures after the bonding process has been performed on each. The process is as follows:

1. Coat the non-silicon wafer 498 with a diffusion barrier material 500 using any known process which will work for this purpose on the particular type of semiconductor type selected. Some examples of processes that will work are spin on, low pressure chemical vapor deposition or sputtering. Silicon dioxide or ceramics may be used for the diffusion barrier and tungsten or other metals may also work.

2. Deposit a layer of aluminum or other metal 502 for which silicon has a high affinity on top of the diffusion barrier.

3. Strip the silicon wafer 504 of oxide in the areas to be bonded. All the process steps to form circuitry on the silicon wafer will have been done by this point in the process and the circuitry layers will have been passivated. Mesas may be etched in the silicon at the places where the germanium or gallium arsenide wafer is to be bonded to the silicon.

4. Clamp the two wafers together and heat them to just beyond the silicon-aluminum eutectic temperature.

Further processing steps may include chemically etching away part of the germanium wafer and additional metallization steps to establish metal lines to connect the tops of the two different wafers.

Figure 81:
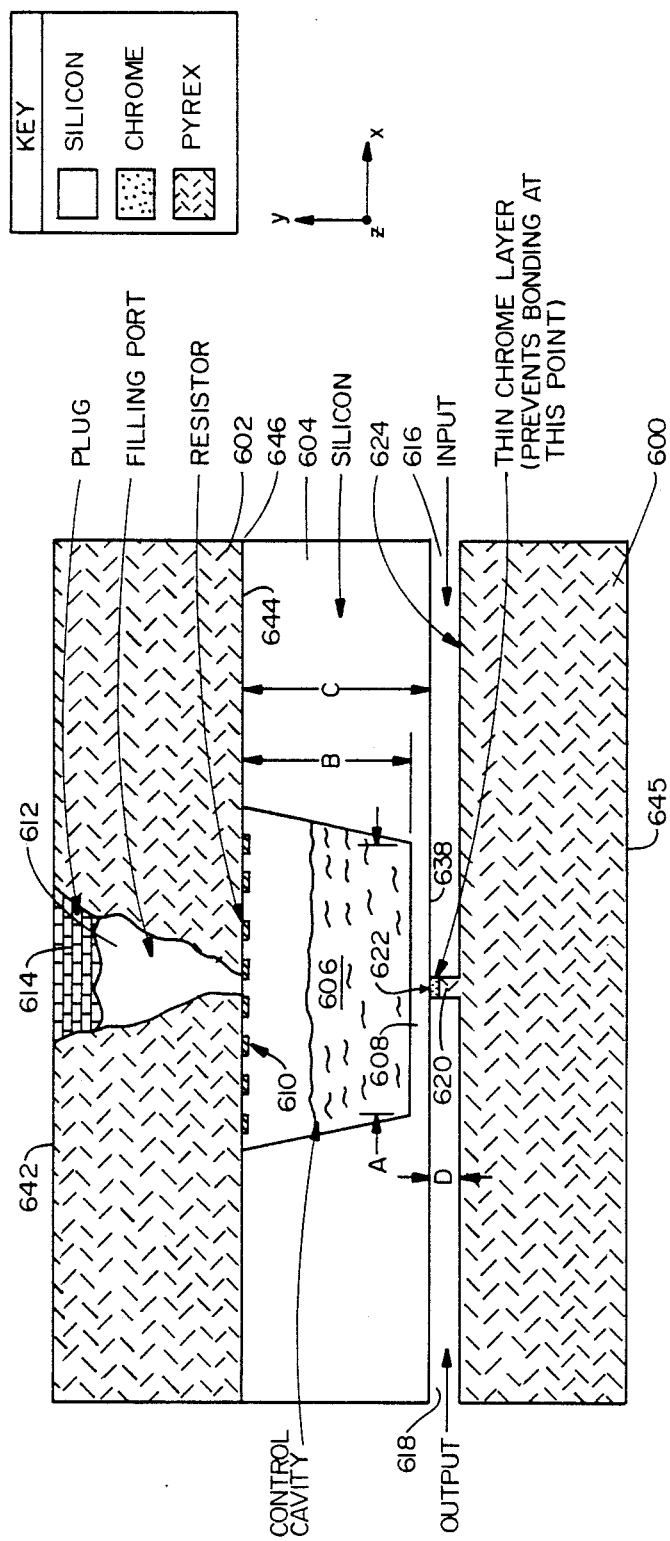
FIG. 81 is a cross sectional view of the preferred embodiment of a valve according to the teachings of the invention.

Referring to FIG. 81, there is shown a cross-sectional diagram of the final construction of the preferred embodiment of a valve according to the teachings of the invention. In this embodiment, two pyrex wafers 600 and 602 are bonded anodically to a silicon wafer 604. The silicon wafer 604 has a cavity 606 etched therein. One wall 608 of the cavity is a flexible diaphragm and is approximately 35 microns thick in the preferred embodiment. The cavity 606 is approximately 50% filled in the preferred-embodiment with a liquid which has a high boiling point relevant to the ambient temperature. Typically the liquid in the cavity is a halo methane or halo ethane or other fluorocarbon in the preferred embodiment. In the preferred embodiment the cavity is filled with freon FC 71. To optimize the closing speed of the valve, the cavity 606 should be filled with as little liquid as possible so that the amount of material that must be heated to its boiling point to cause the valve to close is as small as possible. If one wishes to operate at extremely high pressures, the cavity should be full, preventing the membrane from bending too far towards the cavity which could cause the membrane to break.

The pyrex wafer 602 has a resistor pattern 610 deposited on the surface 644 of the pyrex wafer which is bonded to the silicon wafer 604. The resistor pattern 610 is restricted to that portion of the surface 644 of the pyrex wafer 602 which is enclosed within the perimeter of the cavity 606 except for conductive leads (not shown) which lead to bonding pads at the periphery of the device. Typically, the resistor pattern 610 is formed from a metal which is sputtered onto the surface 644. This layer (not shown) is photolithographically etched, to define the resistor pattern. Typically, the material of the resistor pattern is aluminum, titanium, tungsten, nichrome, gold or other materials. The metal or other material which is used should have sufficient resistance that enough heat may be generated when current is passed through the resistor pattern to raise the trapped liquid to its boiling point. The boiling of the liquid in the cavity 606 raises the vapor pressure inside the cavity 606 thereby causing the diaphragm wall 608 to deform in the negative y direction.

Typically, the resistor pattern 610 is formed in a serpentine fashion and has leads which trace a path across the surface 644 of the pyrex wafer 602 to bonding pads (not shown) located at the periphery of the die (hereafter the "die" refers to the sandwich structure shown in FIG. 81). These bonding paths are of sufficient size to allow electrical contact to be made with the external world by electrical wires such that current may be driven through the resistor pattern 610.

The pyrex wafer 602 also has a small filling hole 612 formed therein. This hole is typically laser drilled and serves to allow the fluid within cavity 606 to be placed therein in some embodiments. After the desired quantity of fluid is placed in the cavity, the hole 612 is sealed by a plug 614. In the preferred embodiment, the plug 614 is epoxy. However, since the hole 612 is very small, other materials may also be used to plug the hole with equal ease.

The pyrex wafer 600 has an input channel 616 and an output channel 618 etched therein. A mesa 620 is left standing on the surface of the pyrex wafer 600 facing the diaphragm 608 to provide a valve seat. The top of this mesa is covered with a thin chrome layer 622. The purpose of this chrome layer is to prevent the mesa 620 from becoming bonded to the diaphragm 608 during the process of anodically bonding the pyrex wafer 600 to the silicon wafer 604 during assembly of the valve structure. The exact configuration of one embodiment of the mesa 620 is shown in FIG. 82.

Figure 82:
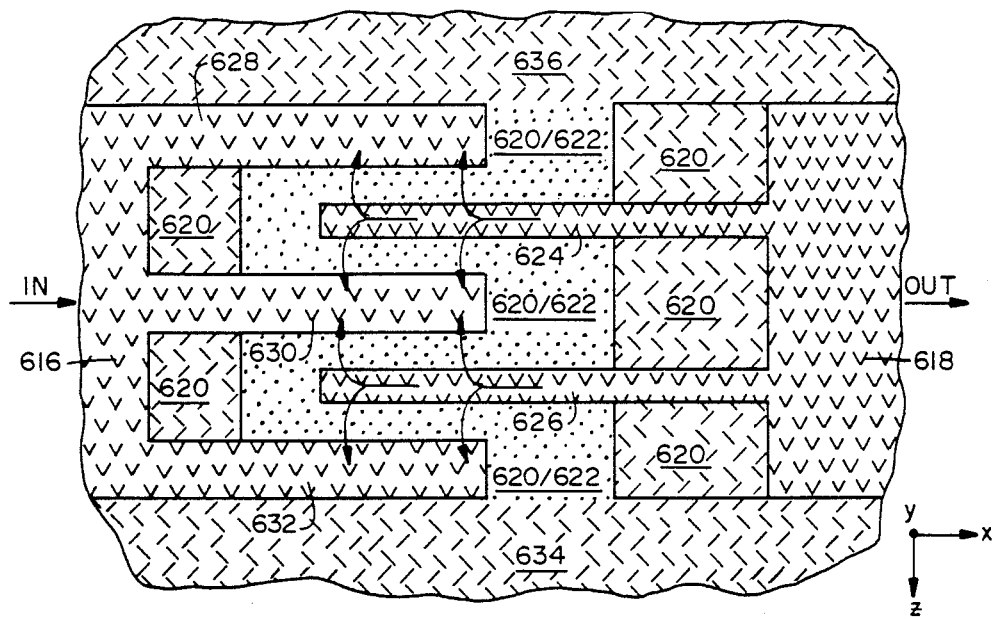
FIG. 82 is a plan view of the mesa and channel structure formed in the lower wafer of the valve shown in FIG. 81.

FIG. 82 is a top view of the portion of the surface 624 of the pyrex wafer 600 immediately under the diaphragm 608. In FIG. 82, the structures which are shown in cross-section in FIG. 81 are given the same reference numerals such that their appearance in plan view may be easily discerned. The input channel 616 is shown as the cross-hatched area with three projecting channel fingers 628, 630 and 632. Essentially these projecting fingers 628, 630 and 632 are trenches formed in the mesa pyrex 620 by which fluid flowing in the input port at 616 may penetrate under the diaphragm 608.

Likewise, the output port shown at 618 is comprised of a series of two trenches 624 and 636. These three trenches penetrate underneath the diaphragm 608 and are separated from the trenches 628, 630 and 632 by the serpentine shape of the mesa 620. The portion of the mesa covered with chrome is labeled with reference number 620/622. The portion of the mesa which is not chrome covered is labeled 620. The three trenches 628, 630 and 632 are interdigitated with the two trenches 624 and 626. FIG. 82 is not shown to scale, and trenches 624 and 626 may be wider. Further, the degree of overlap between the trenches 628, 630, and 632 with the trenches 624 and 626 may be either smaller or larger than shown in FIG. 82.

All those portions of FIG. 82 which are not cross-hatched with the long, continuous slanted lines showing the trench areas, e.g., the areas labeled 636 and 634, lie in a plane parallel to the x-z plane and at a y coordinate which is substantially level with the top of the chrome layer 622. The portions of the pyrex mesa labeled 620 in FIG. 82 and those portions of the surface of the pyrex wafer 600 labeled 634 and 636 are anodically bonded to the underside of the silicon wafer 604.

The process of anodic bonding is well known to those skilled in the art. For completeness here, the process is comprised of placing the surfaces of the pyrex and silicon wafers to be bonded together and connecting either side of the junction so formed to electrodes. A high voltage is then applied to these two electrodes, and current is passed through the junction at a temperature of around 500° C. thereby causing the two wafers to bond to each other.

Referring again to FIG. 81, the purpose of the various elements of the valve structure shown there and various alternative structures will be described. Most of the comments made in the following paragraphs apply to the valve structures of FIG. 1 and FIG. 15 and the other valve structures disclosed herein. Many of the comments apply to the other structures herein. For brevity the specific applicability to structures other than that shown in FIGS. 1, 15 and 81 is not specified.

The purpose of the top pyrex plate 602 is primarily to seal the liquid in the cavity 606. Accordingly, in some embodiments the top plate 602 may be sealed to the silicon wafer 604 after the desired liquid has been placed in the cavity 606. That is, the cavity 606 is filled with liquid, and then the pyrex wafer 602 is placed on the silicon wafer 604 and properly aligned. Thereafter, the pyrex wafer 602 and the silicon wafer 604 are bonded together either anodically or by some other means. In such an embodiment, the hole 612 is not necessary.

In the preferred embodiment, the pyrex wafer 602 is bonded to the silicon wafer 604 before the cavity 606 is filled with liquid. Thereafter, the hole 612 is drilled in the pyrex wafer 602 by laser drilling, chemical drilling, ultrasonic drilling, or by some other means. It is also possible to mechanically drill the holes or cast them in place when the pyrex is formed and before bonding the pyrex wafer to the silicon. Typically, the cavity 606 is 2000 microns wide in the x direction, so the hole 612 must be quite small. Therefore, some method of drilling such a small hole is necessary. Any conventional method of drilling such a small hole will suffice for practicing the invention.

The top pyrex wafer 602 also serves to support the heating resistor 610 and the associated conductive leads and bonding pads which are electrically coupled to the resistor pattern. The top wafer 602 also serves as the principal path of heat conduction between the cavity 606 and a heat sink which may be coupled to the top wafer 602. Therefore, good heat conduction properties are preferred for the top wafer 602. It is possible to use nickel, and possibly some other metal materials as well, for the wafers 602, 604, and 600. In such an embodiment, the resistive pattern 610, if used, must be formed on an insulating layer deposited on the undersurface 644 of the wafer 602. In other embodiments, optical transduction is used to heat the fluid in the cavity 606. In these embodiments, radiant energy in the form of light, infrared, or other wave lengths is beamed through the top wafer 602 into the cavity 606 to heat the fluid therein. In such embodiments, the resistor pattern 610 is not present, and the top wafer 602 must be transparent to the radiation wavelength used. In these embodiments, pyrex is preferred for the top wafer 602. However, other glasses or silicon may be used for the wafer 602. Pyrex is preferred for the top wafer 602 in resistor embodiments because of the ease of bonding pyrex to silicon.

A silicon top wafer 602 would have better heat-transfer characteristics than pyrex, but a silicon to silicon bond is more difficult to make. Other possible materials for the top wafer 602 are ceramic, aluminum, copper, or plastics. If a metal wafer 602 is to be used, the preferred insulating material between the metal wafer and the resistor pattern 610 is polyimide. Other insulating materials can be used to insulate the resistor pattern 610 from the metal wafer such as nitride, but attention must be paid to correct matching of the coefficients of thermal expansion between the type of material used for the resistive pattern, the insulating layer, and the top wafer 602 such that stresses from differences in rates of thermal expansion do not cause cracks or other failure in the insulating layer or resistor material or the pyrex that would impair the operation of the device. Polyimide is preferred for the insulating material, since it is flexible and relieves such stress because of this elasticity.

Whatever material is used for the top wafer 602 should be stable and should not corrode in the ambient atmosphere or by contact with the liquid in cavity 606. Further, the material of the wafer 602 should be able to handle the operating temperature conditions which will be experienced by the valve structure. Typically, the liquid in the cavity 606 will be heated on system power-up to a temperature just below the boiling point. At this temperature, the vapor pressure in the cavity will be insufficient to overcome the forces acting on the diaphragm 608 to push it in the positive y direction. These forces are caused by the pressure in the input port 616, and will cause the valve to be open. When the valve is to be closed, sufficient current is driven through the resistor pattern 610 to drive the operating temperature of the fluid in the cavity 606 to some temperature above the boiling point. This raises the vapor pressure sufficiently to cause forces acting on the diaphragm 608 which tend to push the diaphragm downward in the negative y direction. When this force is sufficient to overcome the forces acting upon the diaphragm to push it in the positive y direction, the diaphragm 608 will contact the chrome layer 622 on top of the mesa 620. This forms a seal and closes the valve.

Finally, the material of the top wafer 602 should be compatible with the resistor lithography and deposition process to form the resistor 610 and should allow lead attachment to the bonding pads.

There are several options for the resistor pattern 610. The simplest option is to form the resistor pattern on the surface of the pyrex wafer 602. An alternative structure is to form the resistor pattern on top of serpentine mesa of insulating material and then to etch holes in the mesa underneath the resistor pattern such that the resistive materials forms an auto bridge-type structure supported by the top wafer 602 and by occasional posts of insulating material. This suspended resistor structure has better characteristics for heat transfer into the liquid. Still another alternative structure, described in more detail below, is a cantilevered beam configuration.

The requirements for the material of the resistive pattern are that it should be stable in the presence of the liquid in the cavity 606 such that it does not corrode or react with the liquid at rest or in operation. Further, the resistor material must be able to handle the high temperatures that will exist in the cavity 606 during operation. The resistor pattern may also be coated to provide protection from the fluid, the top wafer 602 and from the middle wafer 604.

The silicon wafer 604 could be any other material which meets the following requirements. First, the material must be capable of microfabrication such that photolithography with 5 micron design rules for depth and 20 micron lateral design rules can be performed. Further, the material must have sufficient flexibility and elasticity to allow the diaphragm 608 to be repeatedly flexed without causing fatigue failure. Further, the material should be durable and should be a good conductor of heat. It is important that the material of the wafer 604 be capable of preventing leakage of the liquid or the gas phase of the material in the cavity 606 through to the ambient and should not be subject to corrosion by this material. The material of the wafer 604 should also be capable of good mechanical bonding with the materials selected for the wafers 602 and 600. The wafer 604 should also be capable of having the cavity 606 formed therein, and should be capable of being polished and of remaining smooth after being polished. Finally, the material of the wafer 604 should not be subject to corrosion or other damage in the ambient atmosphere at temperatures in which the valve will be operated or by contact with the material being controlled in the input channel 616.

The dimensions of the cavity 606 and the thickness of the membrane 608 have effects on the operating characteristics of the valve. A smaller cavity 606 means there is less material in the cavity to heat up. This results in a shorter time to close the valve from the time current is first applied or increased to raise the temperature in the cavity above the boiling point. A membrane 608 which is thicker will result in a higher pressure required in the input channel 616 to open the valve by forcing the diaphragm in the positive y direction. Likewise, the high pressure must be developed inside the cavity 606 to force the diaphragm 608 in the negative y direction to close the valve. The figure of merit for operation of the valve structures and other structures disclosed herein is the ratio of the change in pressure inside the cavity versus the change in energy input to the liquid in the cavity for heating purposes. This figure of merit is inversely proportional to the volume of the cavity 606. However, the membrane 608 should be as wide as possible, i.e., the dimension A in FIG. 81 should be as large as possible, to obtain maximum flexibility. Typically, the dimension A is 2000 microns. In the preferred embodiment, the dimension B, defining the depth of the cavity, is 350 microns, and the dimension C, defining the thickness of the wafer 604, is 385 microns. Since the membrane 608 should be as wide as possible, the cavity volume is reduced principally by reducing the dimension B with a corresponding reduction in the dimension C to maintain diaphragm thickness of approximately 30-35 microns.

It is preferred that some material be selected for the wafer 604 such that the undersurface 638 of the diaphragm may be polished so as to form a good seal with the top of the mesa 620. Alternatively, the surface 638 may be coated with polyimide or some other flexible material if the wafer 604 cannot be adequately polished for good sealing characteristics. However, the other requirements given above for the wafer 604 must still be met, particularly the ability of the wafer 604 to readily conduct heat away from the cavity 606 and to be robust against fatigue and failure of the diaphragm with repeated flexing.

The bond between the silicon wafer 604 and the pyrex wafer 602 must be capable of providing a hermetic seal such that material inside the cavity 606 cannot escape. Further, the bond must not be subject to corrosion through contact with liquid in the cavity 606, or through contact with ambient chemicals, or through contact with packaging materials which surround the die. This bond must also be capable of allowing feed-through of the resistor leads from the resistive pattern 610 to the bonding pads without shorting the resistor leads together. Finally, the bond must be stable throughout the operating temperature range. Typical operating temperatures may be in the range of from 200° C. to 300° C. and could rise in some applications as high as 700° C. Anodic bonds will easily withstand these temperatures without degradation.

The requirements for the wafer 600 are that it provide good thermal conductivity to aid in cooling the material in the cavity 606. Wafer 600 must also be compatible with the processes used to machine the small channels that form the input ports 616 and 618 and which define the serpentine mesa 620. The wafer 600 must also be capable of being polished such that the top of the mesa 620 can be made smooth for good sealing contact. Alternatively, the wafer must be capable of being coated with polyimide or some other flexible material which can compensate for lack of a flat surface on top of the mesa 620 so as to provide good sealing properties. Further, the material must not be corroded by any gas or fluid which flows through the input and output channels 616 and 618, respectively. Finally, the material selected must be capable of being bonded to whatever material is selected for wafer 604 with a bond which can withstand the operating temperatures and will not be corroded by or chemically react with the material flowing in the channels 616 and 618.

It is important to select the material of all three wafers 602, 604, and 600 such that the coefficients of thermal expansion are sufficiently matched to avoid excessive thermal stress buildup. That is, as the structure of FIG. 1 is heated and cooled throughout the temperature range of operation, if the coefficients of thermal expansion are not sufficiently matched, the three wafers may expand or contract at different rates thereby causing mechanical stresses to build up within the structure. The coefficients of thermal expansion must be sufficiently matched that these mechanical stresses do not build to the point of causing cracks or other damage to the structure which will impair its operation.

The membrane 608 may be coated with a flexible material to improve its sealing capability or to reduce the effects of chemical corrosion or attack by materials in the chambers 606 or in the input channel 616. Also, a coating may be used to improve the durability of the membrane 608. The membrane 608 must be flexible enough to allow flow from the input channel 616 to the output channel 618 at a reasonable pressure when the resistor 610 is not energized to force the membrane 608 into sealing relationship with the mesa 620. The membrane should not stick to the mesa 620 for correct operation of the valve.

Figure 83:
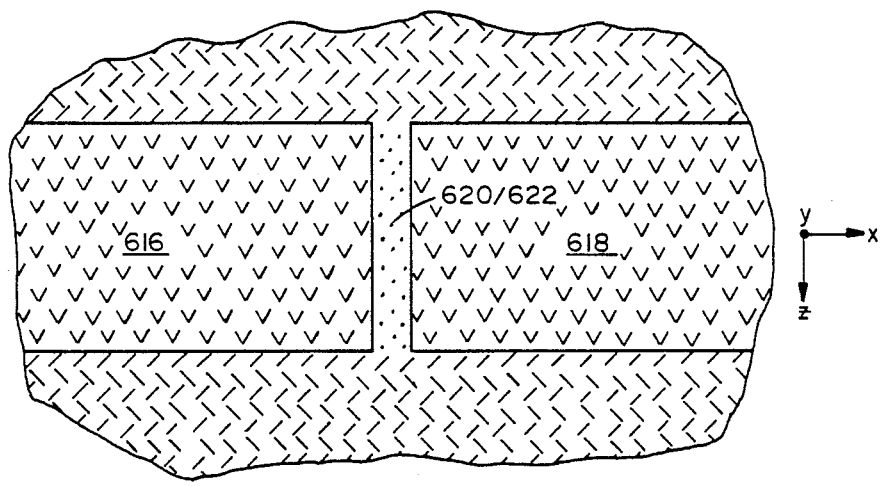
FIG. 83 is an alternative mesa structure with higher off resistance than the structure of FIG. 82.

The mesa 620 and the input and output channels 616 and 618 serve two complementary functions. First, the mesa 620 provides a sealing surface which is not too far from the membrane 608 such that the membrane can flex far enough to cause the seal. The channels 616 and 618 serve to reduce the resistance to flow greatly if they are very deep. Referring to FIG. 82, the configuration of the channels and the serpentine mesa 620/622 is shown. This serpentine configuration provides for a very low "on" resistance to flow. The reason for this is that the interdigitation of the mesa with very deep finger-like channels provides more cross-sectional area across the mesa barrier through which the gas or liquid may flow from the input channel 616 to the output channel 618. That is, the gas or liquid in the input channel 616 flows across the mesa barriers along the paths of the curved arrows shown in FIG. 82. Note that there are multiple paths and therefore the cross-sectional area between the top of the mesa and the bottom of the membrane 608 (not shown) is larger than would be the case if the mesa were not as long as shown in FIG. 82. An alternative mesa structure is shown in FIG. 83 where the mesa is shorter. Because of the length of the mesa in the embodiment of FIG. 82, the off resistance to flow is not as great in the embodiment of FIG. 82 as it is in the embodiment of FIG. 83. FIG. 83 shows a non-serpentine mesa 640 which is straight across the width of the input channel 616. The mesa configuration of FIG. 83 offers a much higher "off" resistance to flow, but also entails a higher "on" resistance to flow, as well. Generally speaking, if high "off" resistance is required, the ridge length of the mesa 620/622 should be short in the z direction and the width should be wide in the x direction.

To minimize the resistance to flow,, the input channel 616 and the output channel 618 should be very deep. That is, the dimension D in FIG. 81 should be deep enough to provide an acceptably low level of flow resistance.

The input and output channels may proceed in any direction along the x-z plane or in any plane parallel thereto and may exit from the die at any point along its perimeter. Further, the input and output channels may also be formed such that they travel in the y direction so as to exit from the top surface 642 or the bottom surface 644 of the die, but travel laterally in the x-z plane under the diaphragm.

The requirements of the cavity 606 are that it must be hermetically sealed from the ambient conditions such that the liquid therein does not escape to the ambient atmosphere.

The material in the cavity 606 can be solid, liquid or gas, or any combination thereof, so long as it can raise the vapor pressure when heated. For best operation, liquid is preferred which has a boiling point well above the average ambient temperature. Preferably, the cavity 606 should be filled with 50% liquid and 50% with gas. This allows the vapor pressure to change without substantial hydrostatic pressure changes. Further, the material in the cavity 606 must not react with the walls of the cavity 606, with the resistive element 610, with the material of the wafer 602, or with the bond between the wafer 602 and the wafer 604. Also, the material in the cavity 606 must not decompose under normal operation. For best operation, this material should have a high ratio between the change in vapor pressure per unit change in energy which is input to the material to heat it. It is important to know the decomposition temperature of the material selected to fill the cavity 606 and to know the operating temperatures that will be experienced by the device. Decomposition of the material could lead to dangerous instability.

The requirements for the filling port 612 are that it be a small hole which connects the cavity 606 to the ambient atmosphere. This hole may generally follow the y axis, as shown in FIG. 81, or may be a trench etched in the surface 644 of the wafer 602 leading to a port 646 at the periphery of the die. In the trench embodiment, the trench may be etched using conventional photolithography and etching processes. The filling port 612 should be as small as possible to minimize dead volume. Typically, multiple structures of the cross-section of FIG. 81 will be produced on a wafer comprised of a sandwich of wafers 600, 602, and 604. All the filling ports 612 may then be formed simultaneously, or they may be formed serially. The method of formation of the filling ports should not destroy the resistor pattern 610.

The sealing material 614 serves to hermetically seal the filling hole 612 after the cavity 606 has been filled with whatever material is placed therein. Methods of placing material in the cavity 606 will be discussed below. The material for the plug 614 should not react with any liquid or other material in the cavity 606, either during cure of the sealing plug 614 or during use of the valve structure. Preferably, the sealing plug material should have a high heat conduction coefficient, and it should be thermally stable at the operating temperatures expected. Alternative methods of sealing the filling port 612 are by laser remelting wherein a portion of the glass in wafer 602 surrounding the filling port 612 is melted so as to fill in the hole. In the preferred embodiment, an epoxy plug is used. Another possible alternative is to metalize the walls of the filling port 612 in a conventional manner and then melt solder in the hole 612 or perform an electroplating operation.

Since the process of construction of the valve in FIG. 81 is very similar to the process of constructing the valves shown in FIGS. 1 and 15, no separate sequence of process drawings is provided herein. There follows, however, a discussion of the process for making the valve structure for FIG. 81. Individual process steps which can best be discussed with the aid of a figure will have associated figures presented.

The first step in the process of making the structure of FIG. 1 is to take a silicon wafer of approximately 380 microns thickness and to oxidize it with silicon dioxide on all surfaces to a thickness of approximately 1.2 microns. Next, the oxide is etched away at the location where the cavity 606 (or cavities where multiple valves are to be formed on one wafer) is to be formed. The cavity is then formed by a wet etch with KOH at 80° C. with a concentration of 30% by weight. This KOH etch etches at a rate of 1.2 microns per minute. The etch is timed so that the desired thickness of the membrane 608 is obtained.

After the cavity 606 is formed, the remaining silicon dioxide is stripped from the surface of the silicon wafer 604. Thereafter, the resistor pattern 610 is formed. Typically, this is done by sputtering or evaporation of nichrome, aluminum, or a combination of titanium, tungsten, and copper, onto the surface 644. Other materials may also be used. Standard photolithography is then used to define a serpentine resistor pattern, including contact pads and the leads from the contact pads to the resistor element. After these structures are photolithographically defined with resist, an etch step is performed to etch the metal layer to leave the resistor pattern 610. Thereafter, the remaining photoresist is removed.

Processing then shifts to the pyrex wafer 600. The first step is to deposit a layer of chrome over the entire surface 624 of wafer 600. The chrome is actually placed on the surface 624 before etching of the input and output channels 616 and 618, respectively. Thus, no chrome will cover the bottom of the channels 616 and 618. This chrome layer may be deposited by sputtering or evaporation.

Next, photolithography is done to define the channels of the input port 616 and the output port 618 and the serpentine mesa 620/622. Referring to FIG. 82, this photolithography will essentially mask all areas of the pyrex wafer 600 labeled 620 or 620/622, as well as the areas labeled 634 and 636. This will leave exposed only the surface of the pyrex wafer 600 which is to be etched down to form the input and output ports 616 and 618.

An etch step using pure HF and HN03 is then performed to etch the channels 616 and 618 and to leave the mesa 620/622 in the area to be mated with the diaphragm 608.

It would be preferable to use an anisotropic etch to form the channel 616 and 618 in the pyrex wafer 600. However, an anisotropic etch for pyrex having the same characteristics as anisotropic etches for silicon does not exist. However, if the wafer 600 is chosen to be silicon, an anisotropic etch to form the channels 616 and 618 is preferred, since such an etch leaves vertical side walls, thereby substantially improving the aspect ratio and reducing the "on" flow resistance. Other possibilities for the pyrex etch are sandblasting or a KOH etch.

Next the remaining photoresist is removed, and a new masking step is performed to place photoresist over the area in FIG. 82 marked 620/622 with the speckled pattern. It is this area where the chrome is to left on top of the mesa 620 to prevent bonding between the top of the mesa and the undersurface 638 of the diaphragm 608. After this photoresist is developed, a chrome etch step is performed to etch away all chrome from the areas on the top of the mesa which are not protected with photoresist and to etch chrome off the areas marked 634 and 636 in FIG. 82. Other possibilities are to strip the chrome off the pyrex and deposit polyimide on the undersurface 638 of the silicon wafer 604 in a square or rectangular pattern which will encompass the area where the mesa will make contact with the diaphragm 608 when the valve is closed.

The pyrex wafer 600 is now in a condition to bond to the silicon wafer 604. In the preferred embodiment this is done anodically by placing wafer 602 and 600 in aligned relationship and raising the temperature to 350° C. for 30 minutes while applying a voltage of 800 volts so as to cause current to flow between the wafer 604 and the wafer 600.

Next the pyrex wafer 602 may be bonded to the wafer 604 after properly aligning the resistor pattern 610 so that it will be contained within the cavity 606. This bond is also performed anodically in the preferred embodiment. In some embodiments, the cavity 606 may be filled with the liquid to be entrapped therein prior to performing the bond between the wafer 602 and the wafer 604. In the preferred embodiment, the wafer 602 is anodically bonded to the wafer 604 with the cavity 606 empty. In these embodiments, the next step is to laser drill the fill hole 612 using a $CO_2$ laser pulsed at the 20 watt power level, or at a sufficient power level to evaporate the pyrex in wafer 602 all the way through to the cavity 606. Although it is possible to chemically drill the fill hole 612, it is very difficult to do so while keeping the diameter of the fill hole small. This is because the vertical etch rate along the y axis is coupled with a horizontal etch rate along the x and z axes. With the necessity to etch through 385 microns of pyrex, the hole can become quite large in terms of the diameter in the x-z plane. Mechanical drilling of the fill hole 612 also tends to create a larger hole than is desirable.

Next, the liquid is placed in the cavity 606. The preferred method of doing this is to place the entire structure shown in FIG. 81 in a chamber and to evacuate the entire system. This leaves the chamber 606 evacuated. After pumping the system down to the desired vacuum level, the vacuum pump is turned off and the desired liquid to be placed in the chamber 606 is poured into the pressure vessel until it covers the entire structure shown in FIG. 81. The system is then vented to atmosphere and pressurized to a positive pressure of 50 psi. This forces the liquid through the fill hole 612 into the cavity 606. This leaves the cavity 606 completely full. Some of the liquid may then be removed from the cavity 606 in embodiments where this is necessary by heating the entire structure to a predetermined temperature for a predetermined time. This time and temperature and the pressure level at which this step is performed should be experimentally determined. The resulting time is based upon the type of liquid in the cavity 606, the diameter of the fill hole 612, and how much liquid is to remain in the cavity 606 after the evaporation step is completed. In many applications, the cavity 606 may be left completely full of liquid. For these applications, the step of evaporating some of the liquid out of the cavity 606 before sealing the fill port 612 is omitted.

Another way of insuring that the cavity 606 is filled only to the desired level is to place hollow or solid lightweight balls, such as styrofoam or metal ball bearings in the cavity 606 prior to bonding the wafer 602 to the cavity 604. The number of balls and the size of the balls which are placed in the cavity 606 is calculated to leave the cavity filled with the desired amount of liquid after the cavity is evacuated and liquid is forced therein through the fill port 612.

Finally, the fill port 612 is sealed with a plug of epoxy 614.

Figure 84:
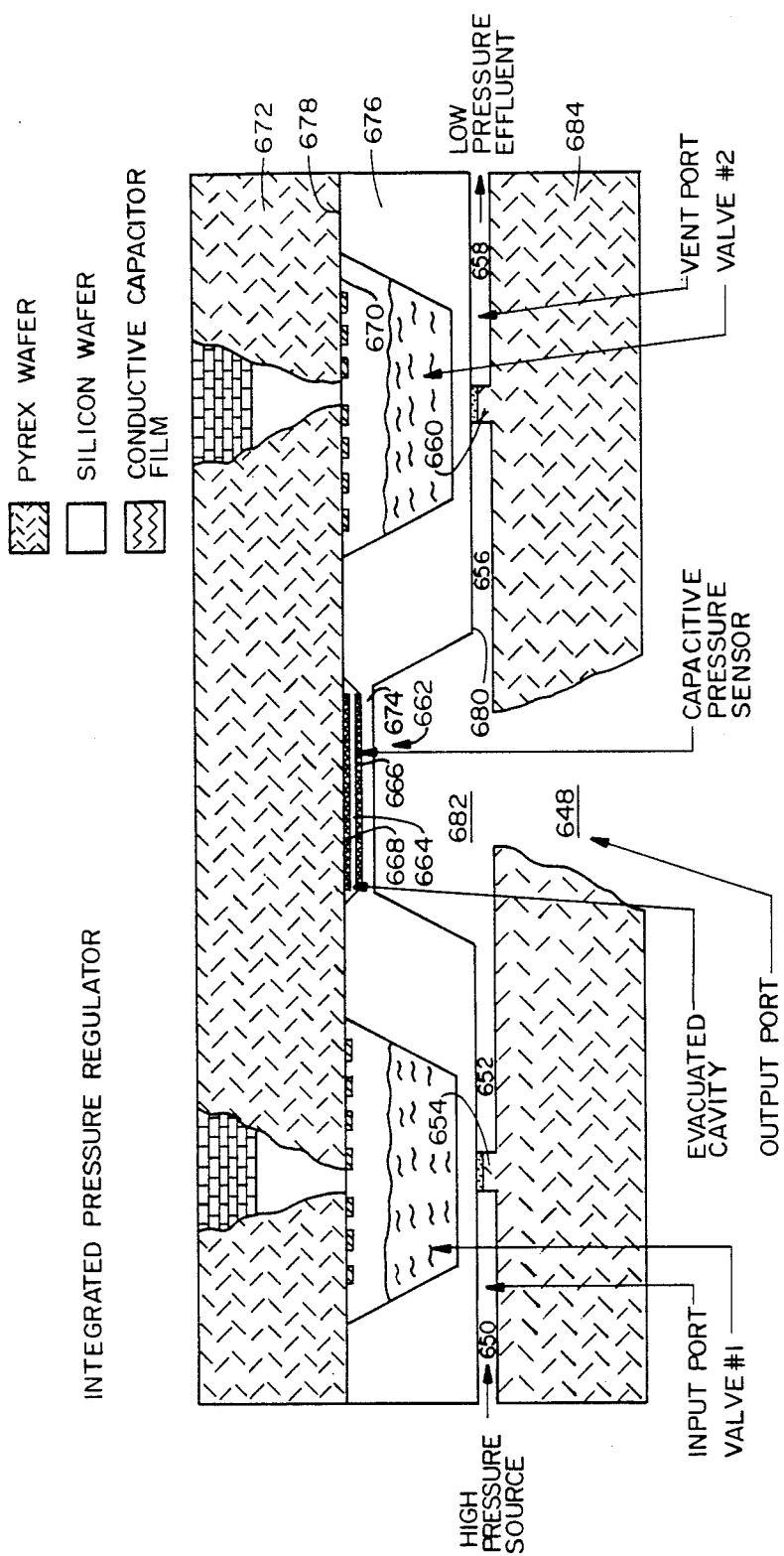
FIG. 84 is a cross sectional view of an integrated pressure regulator using integrated valves.

Referring to FIG. 84, there is shown in cross-section a diagram of an integrated pressure regulator using a valve of the configuration shown in FIG. 81. The purpose of this pressure regulator is to control the pressure in the output port 648 to maintain that pressure at a level set by a user. Pressure in the output port 648 is maintained through the action of two valves marked "valve 1" and "valve 2". Valve 1 has an input port 650 coupled to a high-pressure source (not shown). This high-pressure source is coupled to the output port 648 via a channel 652 on the other side of the mesa of valve 1, shown at 654, from the input channel 650. Valve 2 is coupled from the output port 648 via a channel 656 to a low-pressure effluent channel 658 on the other side of the mesa 660 of valve 2.

Pressure in the output port 648 is regulated by opening and closing of valves 1 and 2 appropriately to couple the output port to either the high-pressure source or the low-pressure effluent to correct for changes in pressure in the output port 648. When the pressure in the output port gets too low, energy is input to the cavity of valve 2 to cause valve 2 to open. This couples the high-pressure source to the output port 648 via the channels 650 and 652. When pressure in the output port 648 becomes too high, valve 1 is opened by inputting energy into the cavity thereof to couple the low-pressure effluent sink (not shown) to the output port 648 via channels 658 and 656.

Pressure in the output port 648 is sensed using a capacitive pressure sensor 662. This capacitive pressure sensor is comprised of an evacuated cavity 664 and two conductive films shown respectively at 666 and 668 separated by the vacuum of the cavity. The cavity 664 is formed between the undersurface 670 of a pyrex wafer 672 serving as the top wafer of the valves 1 and 2 and a diaphragm 674 formed in the silicon wafer 676 which comprises the middle wafer of the two integrated valves. The diaphragm 674 is formed by etching the surface 678 of the silicon wafer to form the surface indentation which will become the cavity 664 and then etching the surface 680 of the silicon wafer 676 in the opposite direction toward the surface 678 until the cavity 682 is formed. The cavity 682 is separated from the cavity 664 by the diaphragm 674. Because the diaphragm 674 is on the order of 30 microns thick, this diaphragm will flex in accordance with the pressure differential between the cavity 682 and the cavity 664. Since the cavity 682 is in fluid communication with the output port 648, the diaphragm 676 will flex in accordance with changes in the pressure in the output port 648. This causes the capacitor plates 666 and 668 to move closer together or farther apart in accordance with changes in the pressure. The movement between the capacitor plates changes the capacitance, and these changes can be detected by external circuitry (not shown).

Any conventional external control circuitry (not shown) may be used. Typically, this control circuitry would be coupled to the plates 666 and 668 of the capacitor and would sense the changes in capacitance. These changes would be mapped to the pressure existing in the output port 648. This derived pressure would be compared to a desired pressure set by a user input to generate an error signal (not shown). Valve driver circuitry would receive this error signal and appropriately drive the resistive elements or other energy supply means coupled to valves 1 and 2 to open the appropriate valve to alter the pressure in the output port 648 in the direction necessary to correct this pressure toward the desired pressure.

The circuitry for controlling valves 1 and 2 and for sensing pressure in the output port 648 is not critical to the invention, and any conventional circuitry to do such a task would be satisfactory to practice the invention. The output port 648 is formed by laser drilling a large hole in the bottom pyrex wafer 684 which serves the purpose of the pyrex wafer 600 in FIG. 81 for both valves 1 and 2.

Figure 85:
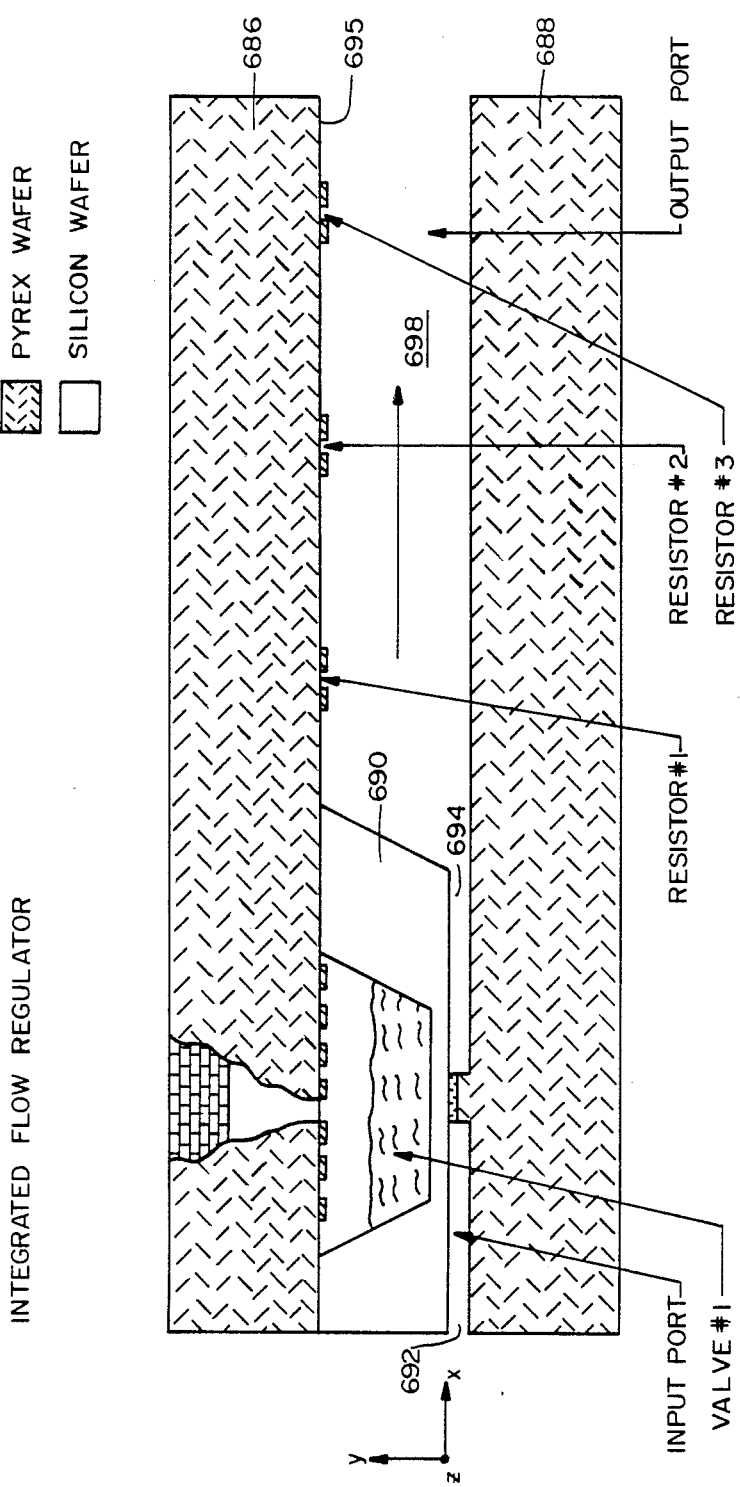
FIG. 85 is a cross sectional view of an integrated flow regulator according to the teachings of the invention.

Referring to FIG. 85, there is shown in cross-section the diagram of an integrated flow regulator. In this structure, a top pyrex wafer 686 and a bottom pyrex wafer 688 sandwich between them a silicon wafer 690. In this three-wafer sandwich, there is formed an electric-to-fluidic valve marked valve #1, having the same structure and constructed in the same manner as the valve shown in FIG. 81. This valve controls the amount of flow between an input port 692 and an output port 694. The input port 692 is coupled to a stream of flowing material for which the flow rate is to be controlled in accordance with a control signal from a user. The output channel 694 is coupled to a flow channel 698 containing a flow rate sensor. On the undersurface 695 of the top pyrex wafer 686 there are formed three resistive patterns which serve as a flow rate sensor. These resistive patterns are labeled resistors 1, 2 and 3.

Resistor 2 is driven at a current level so as to maintain the resistor at a constant temperature. Resistors 1 and 3 are not actively driven with current. Instead, these resistors 1 and 3 are used to sense the temperature differential between the temperature at resistor 1 and the temperature at resistor 3.

This temperature differential varies with the flow rate in the following manner. Because resistor 2 is hotter than resistors 1 and 3, a temperature differential exists. This causes conduction of heat away from resistor 2 toward resistors 1 and 3. If there were no flow in the flow channel 698, eventually both resistors 1 and 3 would reach the same temperature. Resistors 1 and 3 are made of a material which changes resistance with temperature. Thus, the temperatures of the material of resistors 1 and 3 may be measured by measuring the resistance therethrough. When material is flowing from left to right in the channel 698, heat conduction from resistor 2 toward resistor 1 through the material flowing in the channel 698 is impeded, while heat conduction toward resistor 3 from resistor 2 through the material in channel 698 is enhanced. Thus, resistor 1 will be cooler than resistor 3. The temperature differential between resistor 1 and resistor 3 therefore can be mapped to the flow rate of material flowing in channel 698.

External circuitry (not shown) of conventional design senses the resistance of resistors 1 and 3 and converts this information into the temperature differential that exists between these two resistors. Any conventional circuitry to perform this function will suffice for purposes of practicing the invention. This temperature differential is then mapped to a flow rate of material flowing in channel 698 in accordance with a look-up table which stores values which are experimentally determined for the particular type of material flowing in channel 698. The flow rate so derived may then be compared to the desired flow rate, and an error signal may be generated. This error signal is then fed to a valve-driver circuit of conventional design which converts the error signal to a change in the power level for power being input to the material trapped in the cavity of valve 1. If the flow rate in channel 698 is too high, more energy is input to the material trapped in the cavity of valve 1. This raises the vapor pressure in the cavity and causes the diaphragm of the valve to flex in the negative y direction. This narrows the gap between the diaphragm and the mesa, thereby cutting down the flow rate between the channel 692 and the channel 694 and reducing the flow in the channel 698. If the flow rate is too low, less energy is fed to the trapped material in valve 1, thereby allowing the diaphragm to move in the positive y direction and increasing the flow in the channel.

Figure 86:
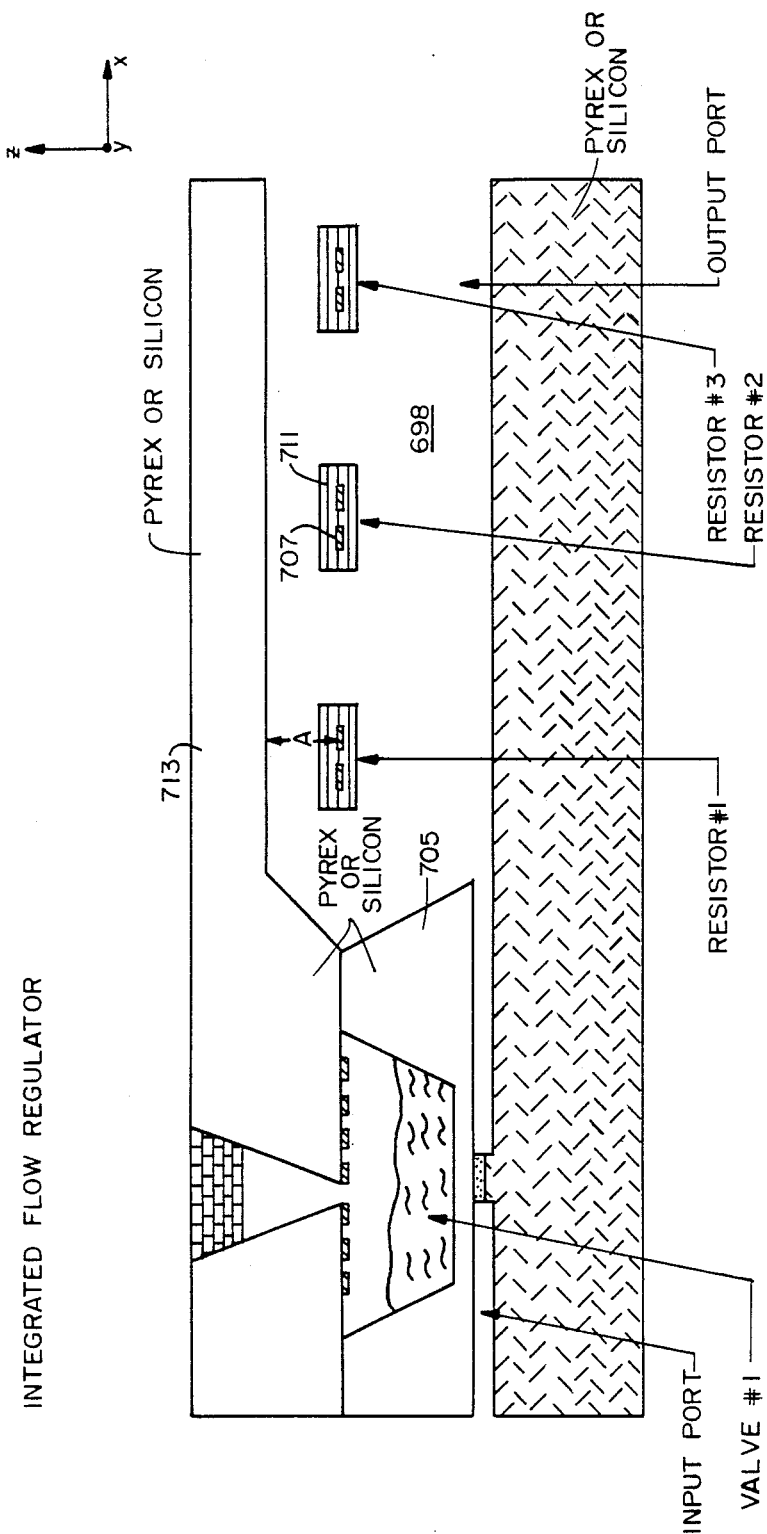
FIG. 86 is a cross sectional view of an alternative form of flow regulator.

Referring to FIG. 86, there is shown another embodiment of the integrated flow regulator. This embodiment works utilizing the same principle as is used in FIG. 85. The principal structural difference over the embodiment of FIG. 85 is that the resistors 1, 2 and 3 are each suspended in the flow channel 698 in a beam of nitride which is supported at the boundaries of the flow channel 698 by the top wafer 713 and the middle wafer 705. This reduces direct heat conduction between resistor 2 and resistors 1 and 3. The reason for this is that the resistors have the material flowing in channel 698 completely surrounding the resistor element. Therefore, a greater percentage of the heat flows through the flowing material and less heat flows through the resistor support structure.

Figure 87:
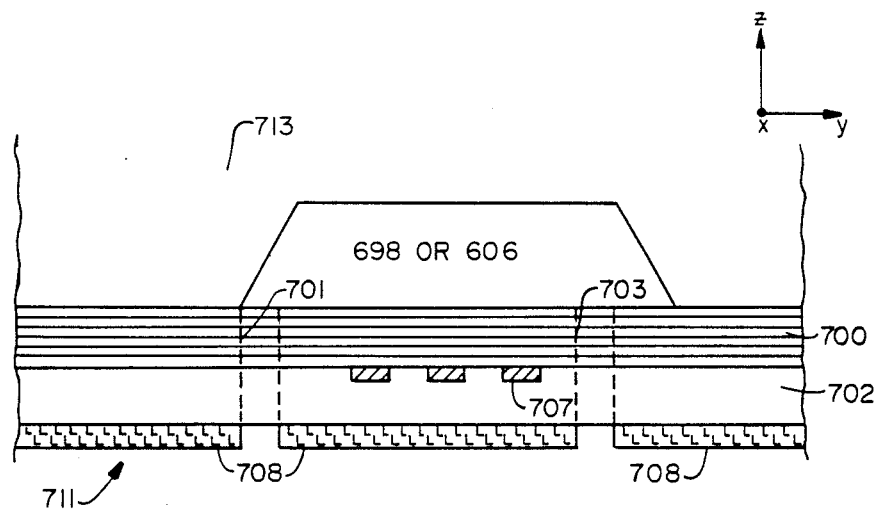
FIG. 87 is a cross sectional drawing of the nitride beam encasing the resistor element which may be used in any of the embodiments disclosed herein.
Figure 88:
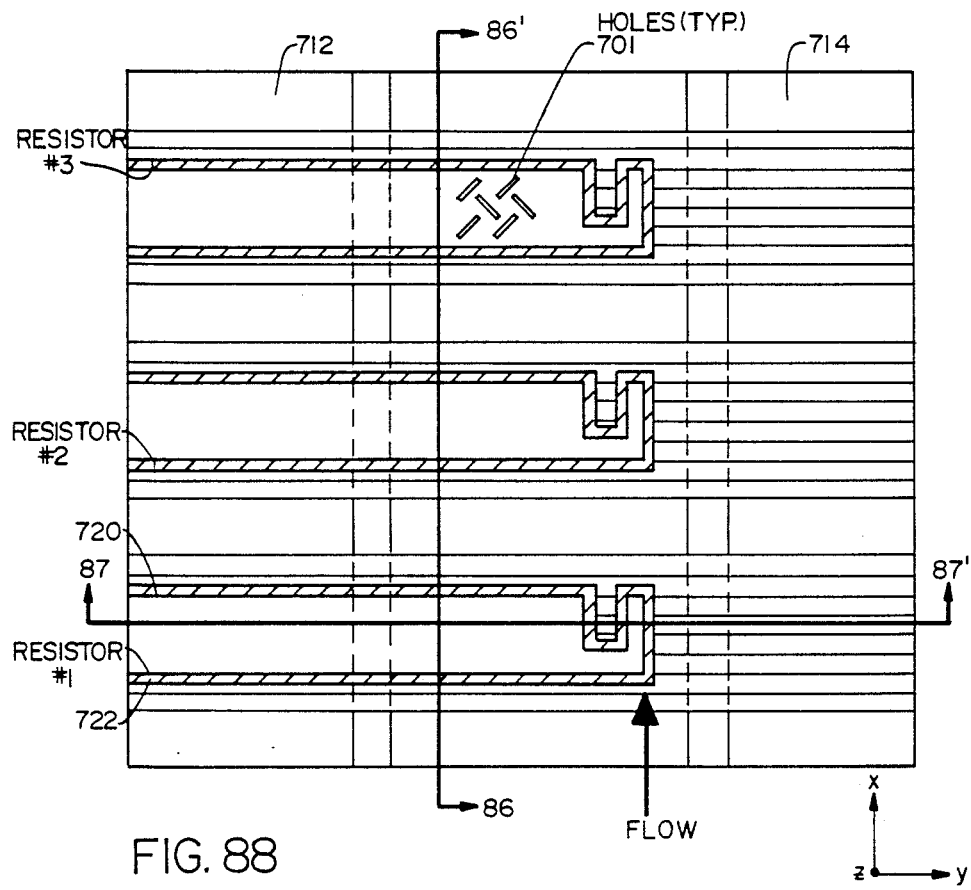
FIG. 88 is a plan view of the resistors of FIG. 86.

The suspended resistor elements of FIG. 86 may be used for the heating elements of any of the valve or other structures disclosed herein. The method of making these suspended resistor structures is as follows. Referring to FIG. 87, there is shown a cross-sectional view taken normal to the x axis of the flow cavity 698 of the flow regulator of FIG. 86 at an early stage of construction of the suspended resistor. FIG. 88 shows the nitride beam 711 containing resistors 1, 2 and 3 in plan view, and shows the positions of the cross sectional views of FIGS. 86 and 87. FIG. 87 shows only resistor 1 during a stage of construction with the resistor element encased in two layers of nitride labeled 700 and 702 and after the flow channel 698 has been etched. The technique of FIG. 87 is equally applicable to formation of the resistive heating elements in any of the embodiments described herein.

The stage shown in FIG. 87 is reached by depositing a first layer of nitride 700 on the top silicon wafer 713 before the trench 698 (or the trapped liquid cavity 606) is formed. The thickness of the layer 700 should be equal to the dimension A in FIG. 86.

After the nitride layer 700 is deposited, it is covered with a layer 707 of metal or other resistive material of the type from which the resistor pattern is to be formed. Thereafter, conventional photolithography is performed to form a photoresist layer to protect those areas of the resistor material which are to remain after etching so as to form the resistor pattern. FIG. 88 shows a serpentine resistor pattern in plan view for resistors 1, 2 and 3. The photoresist pattern should protect the metal so as to form the pattern of FIG. 88 after etching. FIG. 87 depicts the serpentine pattern of FIG. 88 in cross section along the section line 87-87' in FIG. 88.

Following formation of the resistive pattern, a second nitride layer 702 is deposited over the first nitride layer 700 and over the resistive pattern so as to encase the resistive pattern completely. Then a layer of photoresist 708 is deposited so as to cover a portion of the two nitride layers at the location where the beam supports of the resistor pattern are to be formed. The photoresist layer 708 is also developed so that the nitride locations where holes 701 and 703 through the nitride layers are to be formed are exposed. The holes 701 and 703 are spread throughout the nitride beam where resistive material is not present and allow etching to form the trench 698 in the flow regulator (or the cavity in any of the other embodiments disclosed herein). FIG. 88 shows the holes to be aligned at 45 degrees to the [100] axis, and shows only one typical grouping of said holes. Thereafter, the entire structure is subjected to a nitride etch process which etches away all the nitride not covered by the photoresist layer 708 to leave holes 701 and 703 in the nitride beam 711. The overall structure is subjected to another KOH etch to form the trench 698 (or the cavity for the trapped fluid in valve embodiments) by etching silicon of the top wafer 713 through the holes 701 and 703. This leaves each resistor, as shown in FIG. 88, encased in a beam of nitride. This beam is suspended across the flow channel 698 (or across the cavity containing the trapped liquid). Each beam is supported by two support points shown at 712 and 714 attached to the top wafer 713 at the intersection with the middle wafer 705. These support points 712 and 714 are essentially the resistive material of the beams encased in nitride layers 700 and 702 and sandwiched between the top wafer 713 and the middle wafer 705. The portions 720 and 722 of each resistor pattern then extend to bonding pads by which connection to the resistor pattern is made.

Figure 89:
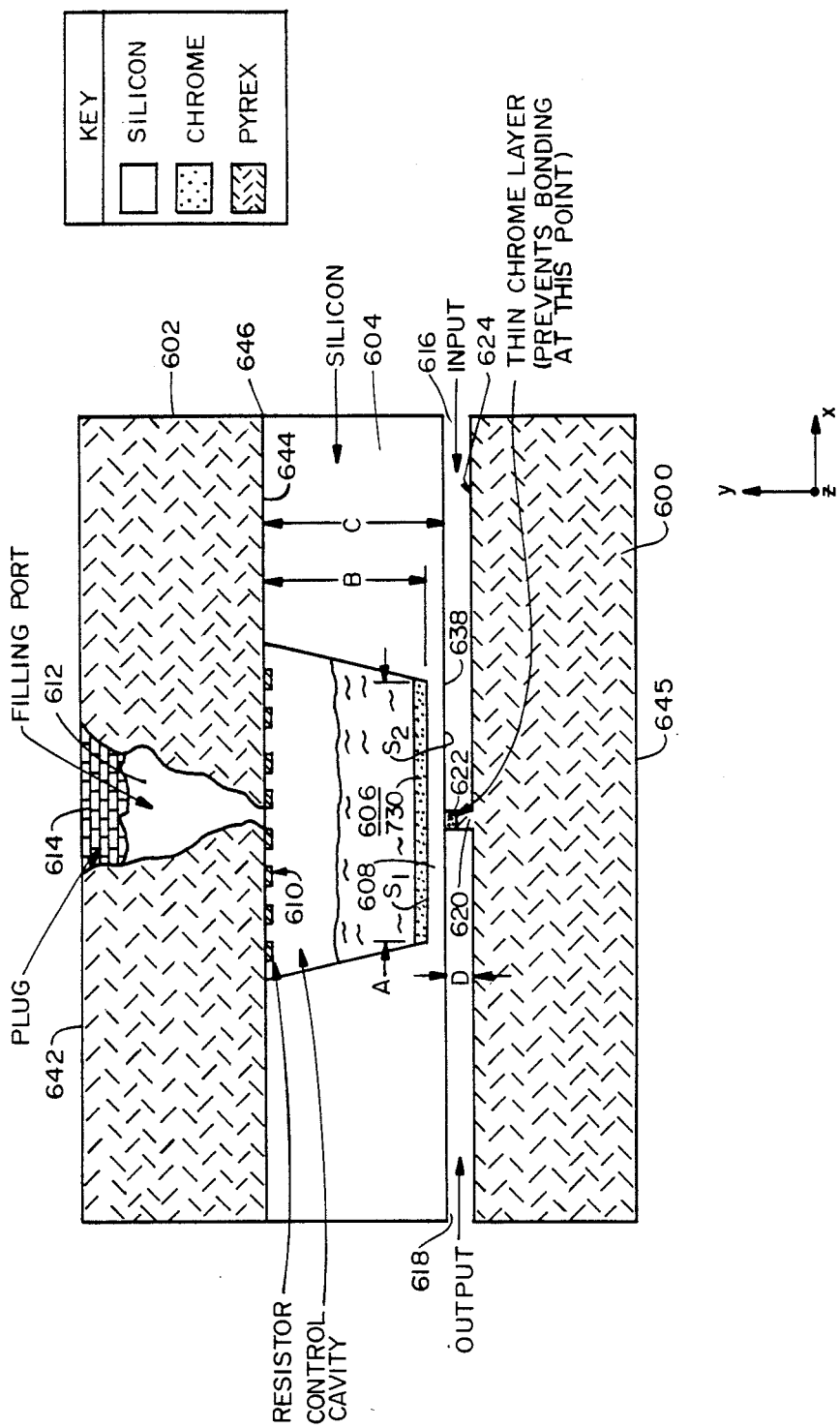
FIG. 89 is a cross sectional view of a bistable embodiment of the valve of FIG. 81 or any other valve embodiment.

Referring to FIG. 89 there is shown a valve structure with a diaphragm comprised of two materials which causes the diaphragm to be bistable with hysteresis. In FIG. 89, the only difference from the valve of FIG. 81 is that there is an extra layer 730 of material added to the diaphragm 608 which gives it a bistable property. All other elements of the structure are the same and have been given like reference numerals as the embodiment shown in FIG. 81. In the embodiment of FIG. 89, an extra layer 730 of chrome has been added to the inside (within the cavity 606) surface $S_1$ of the diaphragm 608. This chrome layer 730 is in tension which causes the diaphragm 608 to bend to the first of its two bistable states. This first state is a deformation of the membrane 608 into the cavity 606 (center of membrane is pulled in the positive y direction toward the wafer 602. This causes the valve to be open even at zero pressure applied to the input port 616. Any pressure applied to the input port opens the valve further. To close the valve, sufficient heat must be coupled to the trapped liquid in the cavity 606 to raise the vapor pressure sufficiently to overcome the forces from the chrome layer 730 and any forces caused by pressure applied to the input port so that the diaphragm 608 is deformed in the negative y direction to come into sealing engagement with the valve seat 620/622.

The structure depicted in FIG. 89 has a faster opening time than the valve of FIG. 81 or other valves taught herein. The valve opens when the liquid in the cavity 606 is allowed to cool sufficiently that the vapor pressure in the cavity drops below the level needed to overcome the forces exerted by the chrome layer 730 and the forces resulting from the pressure applied at the input port 616. When this occurs, the diaphragm snaps to the first bistable state with the diaphragm no longer in sealing engagement with the mesa valve seat 620/622.

Figure 90:
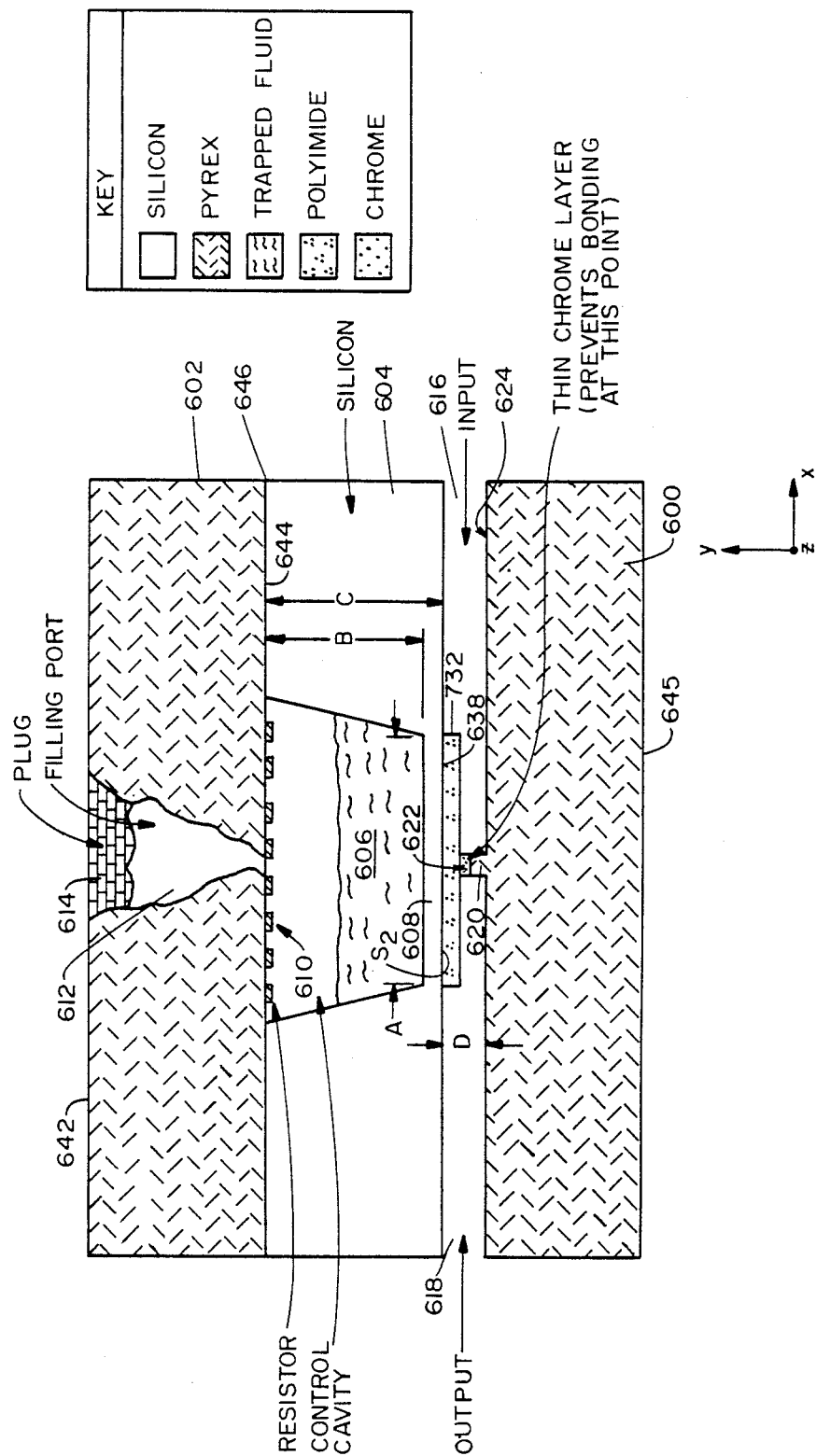
FIG. 90 is a cross sectional view of another bistable embodiment of the valve of FIG. 81 or any other valve embodiment.

Referring to FIG. 90, there is shown another embodiment of a bistable diaphragm valve construction. The structure of FIG. 90 is the same as the structure of FIG. 81 with like elements referenced by the same reference numerals except that an extra layer 732 of material is added to the undersurface S2 of the diaphragm 608 to give it a bistable property of having two stable deformation positions towards which it is biased. In the embodiment, polyimide is used for the layer 732 instead of chrome because polyimide has a better sealing property when brought into contact with the valve seat 620/622. The layer of polyimide 732 is in tension when it is placed on the surface. This tends to cause the diaphragm to deform in the negative y direction and have a bistable state which causes the surface S2 to rest on the valve seat. The other bistable state is with the diaphragm deformed in the positive y direction.

The valve of FIG. 90 will remain closed if insufficient pressure is applied to input port 616 to deform the diaphragm to the second bistable state with the diaphragm deformed in the positive y direction. The valve will also stay closed if normal operating pressure is applied to the input port 616, and sufficient heat is applied to the liquid in the cavity 606 to cause the vapor pressure to overcome the residual force left after the bias force caused by the polyimide layer 732 is subtracted from the force resulting from the pressure applied to the input port. The valve will be open when sufficient pressure is applied to the input port to overcome the bias force caused by the polyimide layer and the cavity is at normal operating temperature below the boiling point of the liquid. When heat is coupled to the cavity which raises the liquid to a temperature above the boiling point and the vapor pressure rises to a sufficiently high level, the diaphragm snaps shut to the first bistable state.

Although the invention has been described in terms of the embodiments described herein, those skilled in the art will appreciate that other modifications may be made without departing from the spirit and scope of the invention. All such modifications are intended to be included within the scope of the claims appended hereto.

What is claimed is:

1. An integrated flow regulator comprising:

a first wafer having first and second surfaces, said second surface of said first wafer having a first resistive pattern formed thereon at a first location and having terminal means coupled to said resistive pattern for coupling said resistor pattern to a source of electrical power;

a second wafer having first and second surfaces, said first surface of said second wafer having a trench formed therein having a depth sufficient to form a flexible diaphragm between the bottom of said trench and said second surface of said second wafer, said first surface of said second wafer being bonded to said first wafer so that said trench forms a sealed cavity which contains said first resistor pattern;

a material trapped in said cavity which has a boiling point above any ambient temperature that will be experienced but low enough that heating caused by passing of electrical current to said first resistor pattern will cause said material to boil and raise the vapor pressure in said cavity sufficiently to expand said diaphragm;

a third wafer having first and second surface, said first surface of said third wafer having an input channel and an output channel formed therein and having a valve seat formed therein in the form of a wall separating said input channel from said output channel, said valve seat formed in a location such that said diaphragm, when expanded, contacts said valve seat to control the flow from said input channel to said output channel, said first surface of said third wafer being bonded to said second wafer at predetermined points not including the points of contact between said valve seat and said diaphragm, said output channel being located so as to be in fluid communication with a flow channel formed between said first and said second wafers; and resistor means formed in said flow channel for supplying heat to any fluid flowing said flow channel when current is passed through said resistor;

first and temperature sensing means formed in said flow channel at first and second locations, respectively, such that heat diffusing through any fluid flowing in said flow channel must diffuse in a direction which is upstream to reach said first temperature sensing means, and must diffuse in a direction which is downstream to reach said second temperature sensing means.

2. An integrated flow regulator comprising:

an integrated valve comprising:

a first pyrex wafer;

a second silicon wafer having first and second parallel surfaces, said first surface having a trench etched therein deep enough to leave a flexible diaphragm defined by a bottom surface of said trench and said second surface, said first surface being anodically bonded to said first wafer such that said trench is sealed to form a cavity;

a material trapped in said cavity which has a boiling point above the highest ambient temperature which might be experienced by said integrated flow regulator;

heating means coupled to said trapped material for selectively raising the temperature of said trapped material to said boiling point to cause the vapor pressure in said cavity to rise to a level sufficient to flex said diaphragm, said heating means comprising resistive material deposited on said first surface of said first pyrex wafer at a location such that said serpentine pattern will be included within the perimeter of said cavity when said first pyrex wafer is bonded to said second silicon wafer such that when current is passed through said resistive material, said trapped material is heated by the power dissipation in said resistive material;

a second pyrex wafer having first and second parallel surfaces, said first surface of said second pyrex wafer having an input channel and an output channel and a wall having a valve seating surface etched therein, said input channel and said output channel being separated from each other by said wall and valve seating surface, said input channel and said output channel each being etched as a plurality of projecting finger trenches which are interdigitated, and wherein said valve seating surface and wall takes the form of a serpentine mesa which occupies the space between and separates said projecting finger trenches of said input channel and said output channel, said first surface of said second pyrex wafer being anodically bonded to said second surface of said silicon wafer such that said diaphragm seals against said valve seating surface when the vapor pressure in said cavity is sufficiently raised, said bonding being at all points except where said diaphragm mates with said valve sealing surface, said valve seating surface being coated with a layer of material which prevents anodic bonding between said first surface of said second pyrex wafer and said second surface of said silicon wafer at points on said valve seating surface;

a flow channel defined by a gap between said first and second pyrex wafers not occupied by said second silicon wafer, said flow channel being in fluid communication with said output channel of said integrated valve; and first, second and third electrically isolated, electrically resistive patterns formed on a surface of one of said first or second pyrex wafers, at least two of said resistive patterns being comprised of a material which changes resistivity with changing temperature, said first, second and third resistive patterns arranged in said flow channel such that heat from power dissipated in one of said resistive patterns must travel upstream in fluid flowing in said flow channel to reach one of said resistive patterns which changes resistivity with changing temperature and must travel downstream in fluid flowing in said flow channel to reach the other of said resistive patterns which changes resistivity with changing temperature.

* * * * *